(12) United States Patent
Zhang et al.

(10) Patent No.: US 11,282,838 B2
(45) Date of Patent: Mar. 22, 2022

(54) STACKED GATE STRUCTURES

(71) Applicant: INTERNATIONAL BUSINESS MACHINES CORPORATION, Armonk, NY (US)

(72) Inventors: Chen Zhang, Albany, NY (US); Dechao Guo, Niskayuna, NY (US); Junli Wang, Slingerlands, NY (US); Ruilong Xie, Niskayuna, NY (US); Kangguo Cheng, Schenectady, NY (US); Juntao Li, Cohoes, NY (US); Chanro Park, Clifton Park, NY (US); Ruqiang Bao, Niskayuna, NY (US); Sung Dae Suk, Watervliet, NY (US); Lan Yu, Voorheesville, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/946,856

(22) Filed: Jul. 9, 2020

(65) Prior Publication Data
US 2022/0013521 A1     Jan. 13, 2022

(51) Int. Cl.
*H01L 21/02* (2006.01)
*H01L 21/8238* (2006.01)
(Continued)

(52) U.S. Cl.
CPC .... *H01L 27/0922* (2013.01); *H01L 21/02603* (2013.01); *H01L 21/823807* (2013.01);
(Continued)

(58) Field of Classification Search
CPC .......... H01L 27/0922; H01L 21/02603; H01L 21/823807; H01L 21/823864;
(Continued)

(56) References Cited

U.S. PATENT DOCUMENTS 5,771,484 A   6/1998  Tognazzini
9,356,027 B1  5/2016  Cheng
(Continued)

FOREIGN PATENT DOCUMENTS

EP           3588546 A1     1/2020

OTHER PUBLICATIONS

Ryckaert et al., "The Complementary FET (CFET) for CMOS scaling beyond N3," 2018 IEEE Symposium on VLSI Technology, pp. 141-142, Honolulu, HI, 2018, doi: 10.1109/VLSIT.2018.8510618.
(Continued)

*Primary Examiner* — Tong-Ho Kim
(74) *Attorney, Agent, or Firm* — L. Jeffrey Kelly

(57) ABSTRACT

An embodiment of the invention may include a semiconductor structure and method of manufacturing. The semiconductor structure may include a top channel and a bottom channel, wherein the top channel includes a plurality of vertically oriented channels. The bottom channel includes a plurality of horizontally oriented channels. The semiconductor structure may include a gate surrounding the top channel and the bottom channel. The semiconductor structure may include spacers located on each side of the gate. A first spacer includes a dielectric material located between the plurality of vertically oriented channels. A second spacer includes a dielectric material located between the plurality of horizontally oriented channels. This may enable spacer formation between the vertical spacers.

16 Claims, 36 Drawing Sheets

(51) Int. Cl.
*H01L 27/092* (2006.01)
*H01L 29/06* (2006.01)
*H01L 29/423* (2006.01)
*H01L 29/66* (2006.01)
*H01L 29/786* (2006.01)

(52) U.S. Cl.
CPC .. *H01L 21/823864* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC ........... H01L 29/0673; H01L 29/42392; H01L 29/66545; H01L 29/66553; H01L 29/66742; H01L 29/78696
USPC ......................................................... 257/351
See application file for complete search history.

(56) References Cited

U.S. PATENT DOCUMENTS

| | | |
|---|---|---|
| 9,691,851 B1 | 6/2017 | Fung |
| 9,837,414 B1 | 12/2017 | Balakrishnan |
| 10,192,819 B1 | 1/2019 | Chanemougame |
| 10,192,867 B1 | 1/2019 | Frougier |
| 10,236,217 B1 | 3/2019 | Ando |
| 10,332,881 B1 | 6/2019 | Badaroglu |
| 2016/0276484 A1 | 9/2016 | Kim |
| 2018/0323195 A1 | 11/2018 | Mehandru |
| 2019/0131394 A1 | 5/2019 | Reznicek |
| 2019/0172755 A1 | 6/2019 | Smith |
| 2019/0319021 A1 | 10/2019 | Xu |
| 2019/0326286 A1* | 10/2019 | Xie ..................... H01L 29/0665 |
| 2020/0098756 A1* | 3/2020 | Lilak ................. H01L 29/66545 |
| 2020/0105929 A1* | 4/2020 | Zhang ............... H01L 29/78696 |

OTHER PUBLICATIONS

Pending Application No. EP2021/067830, Filed on Jun. 29, 2021, entitled: "Stacked Gate Structures", reference No. P201910120PCT01, 72 pages.

Notification of Transmittal of the International Search Report and the Written Opinion of the International Searching Authority, or the Declaration, dated Sep. 29, 2021, File Reference P201910120PCT01, International application No. PCT/EP2021/067830, 12 pages.

* cited by examiner

STACKED GATE STRUCTURES

BACKGROUND

The present invention relates to semiconductor device fabrication, and more specifically, to stacked FET gates.

Stacked nanosheet designs provide a significant gain for both logic and memory device structural scaling by stacking FETs above one another. The stacked nanosheet device allows for 2 n-FETs, 2 p-FETs, or a combination of n-FET and p-FET devices located in the same footprint of a nanosheet.

BRIEF SUMMARY

An embodiment of the invention may include a semiconductor structure and method of manufacturing. The semiconductor structure may include a top channel and a bottom channel, wherein the top channel includes a plurality of vertically oriented channels. The bottom channel includes a plurality of horizontally oriented channels. The semiconductor structure may include a gate surrounding the top channel and the bottom channel. The semiconductor structure may include spacers located on each side of the gate. A first spacer includes a dielectric material located between the plurality of vertically oriented channels. A second spacer includes a dielectric material located between the plurality of horizontally oriented channels. This may enable spacer formation between the vertical spacers.

In another embodiment the semiconductor structure may have a thickness of the first spacer is different from a thickness of the second spacer.

In another embodiment the semiconductor structure may include the second spacer further includes a top element, and wherein the top element includes a dielectric material in contact with a bottom surface of the top channel and a top surface of the bottom channel.

In another embodiment the semiconductor structure may include a structural interface exists between the first spacer and the second spacer.

In another embodiment the semiconductor structure may include the top element has a top portion and a bottom portion, wherein the top portion includes a plurality of fin protrusions, wherein each fin protrusion is located beneath each of the plurality of vertically oriented channels, and wherein the bottom portion includes a horizontal layer connecting each of the fin protrusions of the top portion. This may enable spacer formation between the top channel and bottom channel.

In another embodiment the semiconductor structure may include the top channel is part of a first transistor, and wherein the bottom channel is part of a second transistor. This may enable the semiconductor device to act as a stacked gate structure.

In another embodiment the semiconductor structure may include the first transistor and the second transistor form a complimentary field effect transistor. This may enable the semiconductor device to act as a stacked gate structure.

An embodiment of the invention may include a semiconductor structure and method of manufacturing. The semiconductor structure may include a gate structure. The semiconductor structure may include a top channel. The top channel includes at least one vertically oriented channel. A bottom surface of the at least one vertically oriented channel is in contact with an insulator layer. A top surface and vertical surfaces of the at least one vertically oriented channel are in contact with the gate structure. The semiconductor structure may include a bottom channel, wherein the bottom channel includes a plurality of horizontally oriented channels, and wherein the gate surrounds the bottom channel. This may provide structural support to the top channel.

In another embodiment the semiconductor structure may include a dielectric of the gate is located on each surface of the bottom channel, and the dielectric of the gate is located on the top surface and the vertical surfaces of the at least one vertically oriented channel are in contact with the gate structure, and wherein the gate dielectric is located on surfaces of the insulator layer that are not in contact with the at least one vertically oriented channel.

In another embodiment the semiconductor structure may include the top channel is part of a first transistor, and wherein the bottom channel is part of a second transistor. This may enable the semiconductor device to act as a stacked gate structure.

In another embodiment the semiconductor structure may include the first transistor and the second transistor form a complimentary field effect transistor. This may enable the semiconductor device to act as a stacked gate structure.

Figure 1:
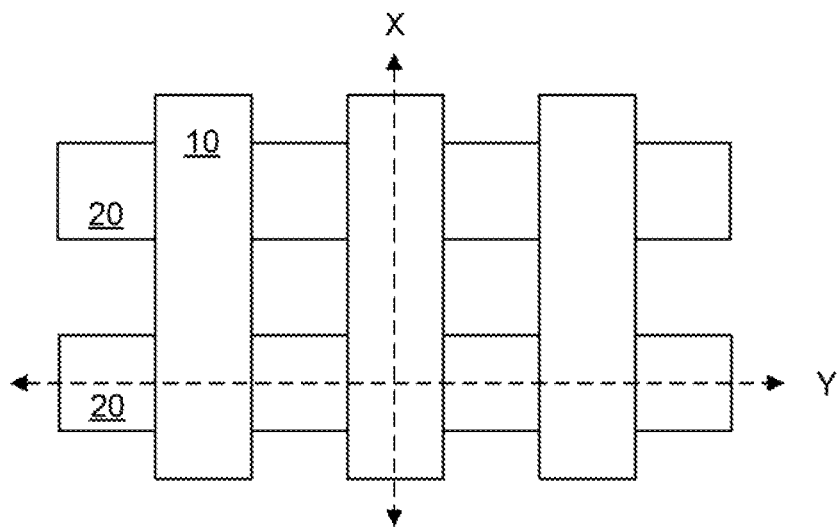
FIG. 1 depicts a top down view of a fin region and gate region showing cross sections across each region, according to a first example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As devices trend towards miniaturization, new structures are necessary to enable more and more transistors to be placed in a smaller footprint. Using stacked devices, such as a complementary field effect transistor (CFET), enables two transistors to take up a similar footprint, and may also reduce the number of contacts (and wiring between) such devices. However, due to the limited size of the components, there are structural difficulties that arise from the miniaturization, as well as difficulties in maintaining desired spacing between components. By using vertically oriented channels for a top gate of the stacked device, and horizontally oriented channels for a bottom gate of the stacked device, such structural limitations may be reduced.

In a first embodiment depicted in FIG. 1-17, a method and structure are introduced that enable the spacers to be effectively formed in three steps, which enables proper filling of the spaces between the semiconductor channels when the distances between channels, and the thickness of the spacers, are minimized.

In a second embodiment depicted in FIG. 18-30, a method and structure are introduced in which vertical channels are formed directly on an insulator layer, thereby isolating the top gate from the bottom gate, as well as providing further structural support to vertically oriented channels on the top gate.

Referring to FIG. 1 depicts a top down view of a gate region 10 and fin region 20, which is used as a reference for a semiconductor structure on a substrate depicted in FIG. 2-17. A cross-sectional x-line across the gate region 10 may be used to show the structures located in the gate region 10 during each step. A cross-sectional y-line across the fin region 20 may be used to show the structures located along each transistor device during each step. A cross-sectional z-line as shown in FIG. 9D across the spacers located next to the gate region 10 may be used to show the structures located adjacent to the gate region 10 during each step.

Figure 2:
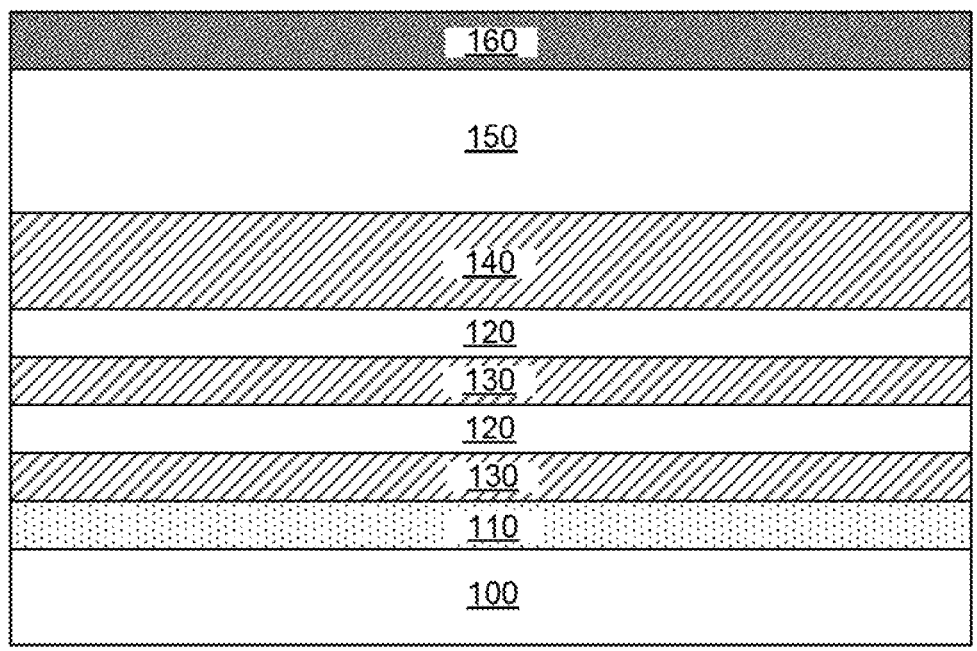
FIG. 2 depicts a cross-sectional view across the x-line in a gate region of a layered structure, according to a first example embodiment.

Referring to FIG. 2, a structure is depicted having a layered structure having a substrate 100, a buried oxide layer 110, sacrificial nanosheets 130, nanosheet material 120, an intermediate buffer layer 140, top semiconductor layer 150, and a hardmask 160.

According to an example embodiment, substrate 100 is a semiconductor, such as a silicon (Si), germanium (Ge), and/or III-V semiconductor wafer having a buried oxide layer 110, creating a semiconductor-on-insulator (SOI) wafer. Alternatively, substrate 100 can be a bulk semiconductor wafer without the buried oxide layer 110. A SOI wafer includes a sacrificial nanosheet 130 separated from the underlying substrate 100 by a buried oxide layer 110. When the buried insulator is an oxide it is referred to herein as a buried oxide or BOX. Substrate 100 may already have pre-built structures (not shown) such as transistors, diodes, capacitors, resistors, interconnects, wiring, etc.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

Generally, the material stack located above the buried oxide layer 110 includes nanosheet material 120 separated by sacrificial nanosheets 130, and upper semiconductor layer 150 separated from the lower nanosheets by an intermediate buffer layer 140. By 'sacrificial' it is meant that the layer, or portion thereof, is removed during fabrication of the device. By way of example only, each of the nanosheets 120, 130, 140, and 150 in the material stack are deposited onto the substrate 100, one on top of the other, using an epitaxial growth process. According to an example embodiment, each of the nanosheets 120 and 130 in the material stack has a thickness of from about 10 nanometers (nm) to about 25 nm and ranges therebetween. According to an example embodiment, each of the intermediate buffer layer 140 in the material stack has a thickness of from about 20 nanometers (nm) to about 60 nm and ranges therebetween. According to an example embodiment, each of the intermediate buffer layer 140 in the material stack has a thickness of from about 25 nanometers (nm) to about 100 nm and ranges therebetween.

The material stack includes alternating layers of a nanosheet material 120 and a sacrificial nanosheets 130. For instance, according to an example embodiment, the nanosheet material 120 is Si, and the sacrificial nanosheets 130 is SiGe. However, this is merely an example and other configurations are contemplated herein. Additionally, while there are two nanosheets for the first nanosheet material 120, additional nanosheets are contemplated. For instance, in an alternative embodiment, the first nanosheet material is SiGe while the second nanosheet material is Si. As will be described in detail below, these nanosheet materials will be used to form the channels of the present stacked nanosheet devices and a sacrificial material in between the channels. Removal of the sacrificial material releases the channels from the stack and permits gates to be formed that fully surround the channels in a gate-all-around configuration. Thus, it is preferable that the first and second nanosheet materials have etch selectivity with respect to one another. Thus, when one serves as the channels, the other sacrificial material can be selectively removed to release the channels from the stack. By way of example only, Si and SiGe provide such etch selectivity.

Similarly, the upper semiconductor layer 150 and the intermediate buffer layer 140 may be chose for selectivity. For instance, when the upper semiconductor layer 150 is Si and the intermediate buffer layer 140 is SiGe. Again, this is merely an example and other configurations are possible, e.g., the first nanosheet material can instead be SiGe while the second nanosheet material is Si. Additionally, while there are two nanosheets for the intermediate buffer layer 140, additional nanosheets are contemplated. Further, the size of the material stack 105 shown is merely an example, and embodiments are contemplated herein where the number of lower nanosheets and/or upper nanosheets differ from what is shown in the figures.

According to an example embodiment, sacrificial nanosheets 130 and 140 are both formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, sacrificial nanosheets 130 and 140 are formed from SiGe60 (which has a Ge content of about 60%). Use of a higher Ge content SiGe will enable the sacrificial nanosheets 130 and 140 to be etched selective to the nanosheet material 120 and upper semiconductor layer 150, as provided above, can be formed from Si and/or SiGe. Notably, however, the SiGe used as a lower/upper nanosheet material has a low Ge content. For example, in one exemplary embodiment, a low Ge content is from about 20% Ge to about 50% Ge and ranges therebetween. For instance, in one non-limiting example, nanosheet material 120 and upper semiconductor layer 150 are formed from SiGe30 (which has a Ge content of about 30%).

A patterned nanosheet hardmask 160 is then formed on the material stack. Suitable materials for the nanosheet hardmask 160 include, but are not limited to, nitride materials such as silicon nitride (SixNy), silicon oxynitride (SiON), and/or silicon carbonide nitride (SiCN), and/or oxide materials such as silicon oxide (SiOx).

Figure 3:
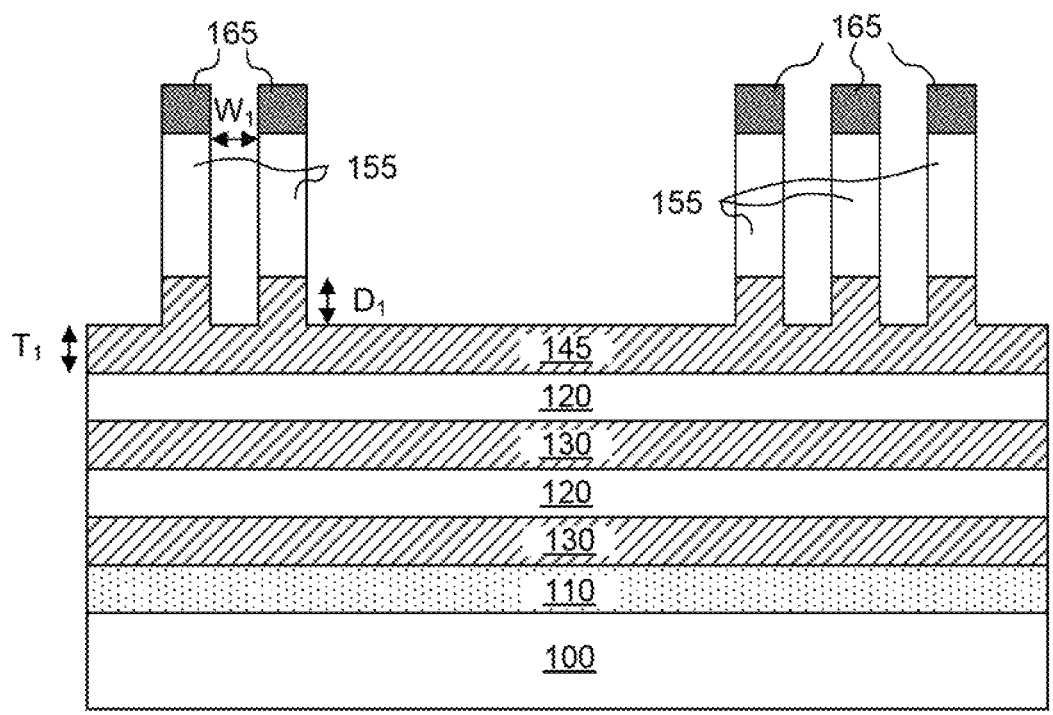
FIG. 3 depicts a cross-sectional view across the x-line in a gate region following a patterning of vertical channels in a top FET of each CFET structure, according to a first example embodiment.

Referring to FIG. 3 (X-cut), forming fins 155 from the top semiconductor layer 150 is depicted, being capped by a FIN hardmask 165, as well as etching into the intermediate buffer layer 140 to form etched intermediate buffer layer 145. The fins 155 are formed having a width W1 between each fin of about 8 to about 20 nm. Additionally, while forming the fins 155, etching into the intermediate buffer layer 140 of a depth D1 of about 5 to about 55 nm is performed. This leaves an intermediate buffer layer having a first portion (i.e., the unetcthed portion) with a thickness T1 of about 5 to about 20 nm, and a second portion beneath each fin with a thickness equal to the etch depth D1. Each of the etch dimensions W1, T1, and D1, may be selected such that conformal deposition may replace any material removed in subsequent steps. For example, W1, T1, and D1 may be selected to be smaller than a thickness of a subsequent conformal deposition step, which may enable the conformal deposition to completely fill a void left by removing a portion of this layer. The fins 155 may be formed using a sidewall image transfer technique formed on the hardmask 160 and etched into the intermediate buffer layer 140.

Figure 4:
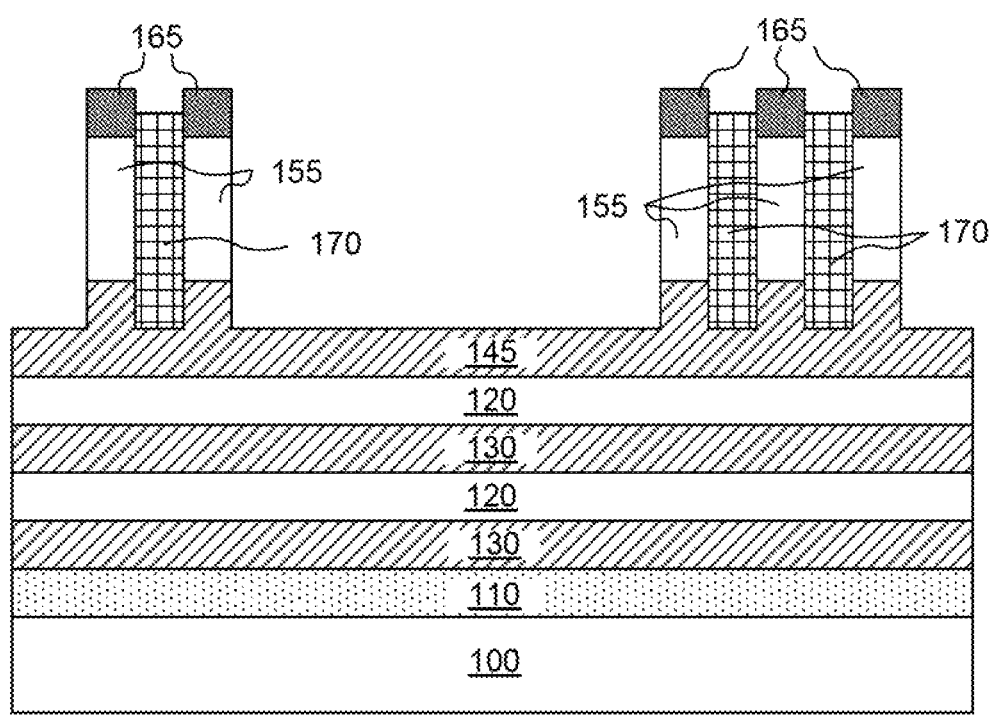
FIG. 4 depicts a cross-sectional view across the x-line in a gate region following forming a sacrificial liner between the vertical channels of each top FET, according to a first example embodiment.

Referring to FIG. 4 depicts depositing a sacrificial liner 170 between the fins 155. The sacrificial liner may be conformally deposited along the exposed surfaces and isotropically etched to leave only the sacrificial liner 170 between the fins 155. The sacrificial liner 170 may be a material capable of being removed with respect to the intermediate buffer layer 145 and the fins 155. In an example embodiment, sacrificial liner 170 may be a high Ge content is from about 50% Ge to about 100% Ge (i.e., pure Ge) and ranges therebetween, when fins 155 are Si and intermediate buffer layer 145 is SiGe30. For instance, in one non-limiting example, sacrificial liner 170 are formed from SiGe60 (which has a Ge content of about 60%).

Figure 5:
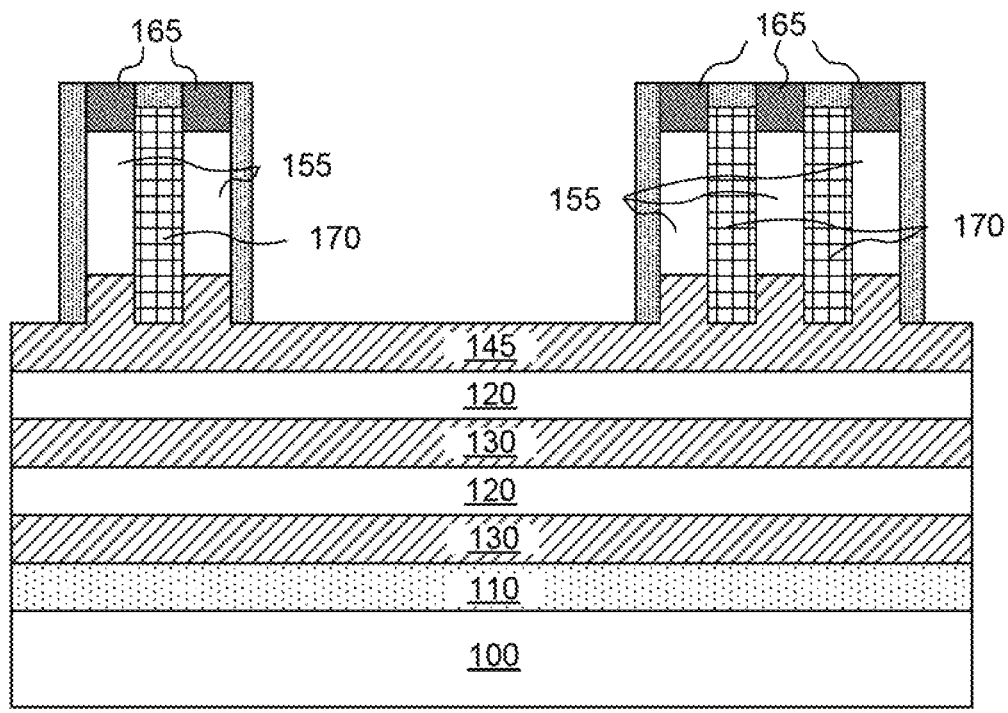
FIG. 5 depicts a cross-sectional view across the x-line in a gate region following forming a sacrificial spacer around each top FET, according to a first example embodiment.

Referring to FIG. 5 depicts forming a sacrificial spacer liner 180 adjacent to the fins 155. Sacrificial spacer liner 180 may be any material capable of being selectively etched with respect to intermediate buffer layer 145 and sacrificial nanosheets 130 and 140. Sacrificial spacer liner 180 may be formed by a conformal deposition followed by a reactive ion etch (RIE).

Figure 6:
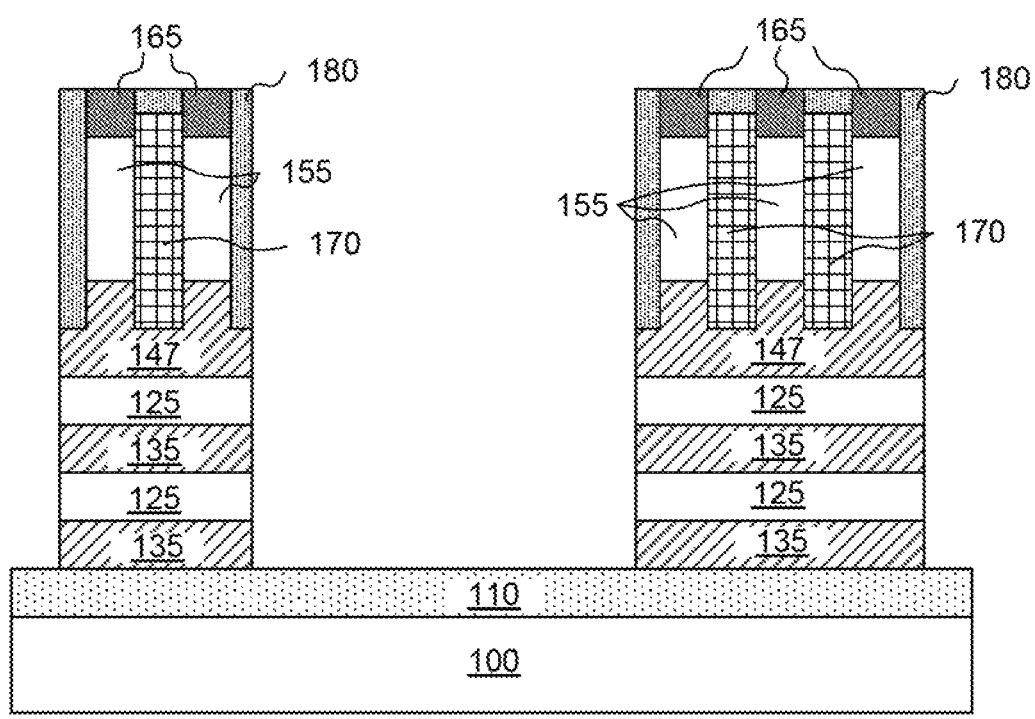
FIG. 6 depicts a cross-sectional view across the x-line in a gate region following patterning of the bottom FET of each CFET structure, according to a first example embodiment.

Referring to FIG. 6 depicts patterning of the bottom nanosheets, forming sacrificial layers 135, bottom semiconductor layers 125, an intermediate buffer layer 147. The patterning may be done using the sacrificial spacer liner 180 as a mask and performing a RIE.

Figure 7:
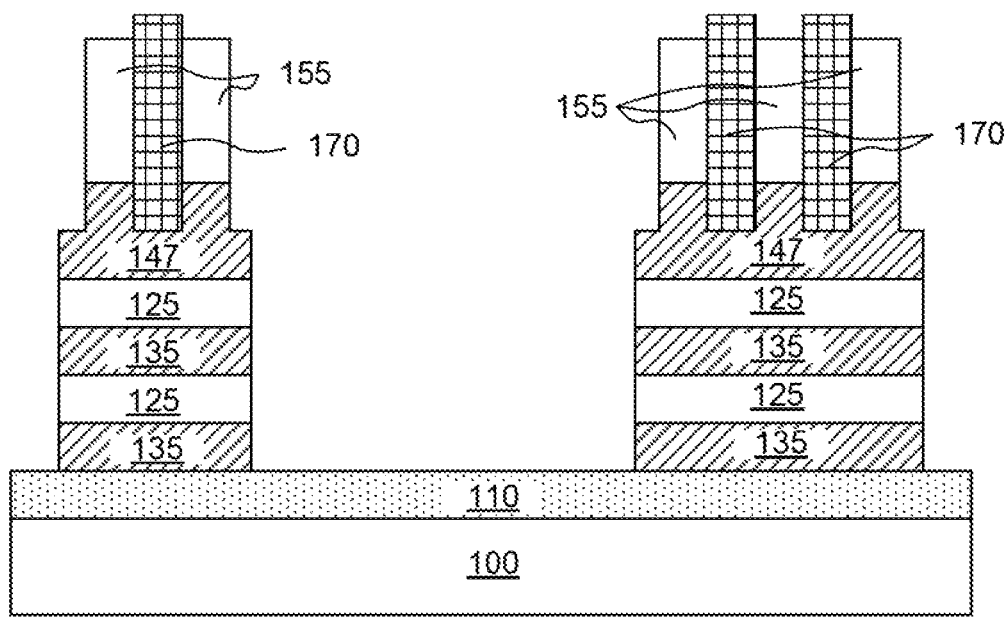
FIG. 7 depicts a cross-sectional view across the x-line in a gate region following removal of the sacrificial spacer, according to a first example embodiment.

Referring to FIG. 7 depicts removing the sacrificial spacer liner 180. Removal of the sacrificial spacer liner 180 and FIN hardmask 165 may be performed using any etching process capable of selectively removing the sacrificial spacer liner 180 from the sacrificial layers 135, bottom semiconductor layers 125, an intermediate buffer layer 147, fins 155, and sacrificial liner 170.

Figure 8A:
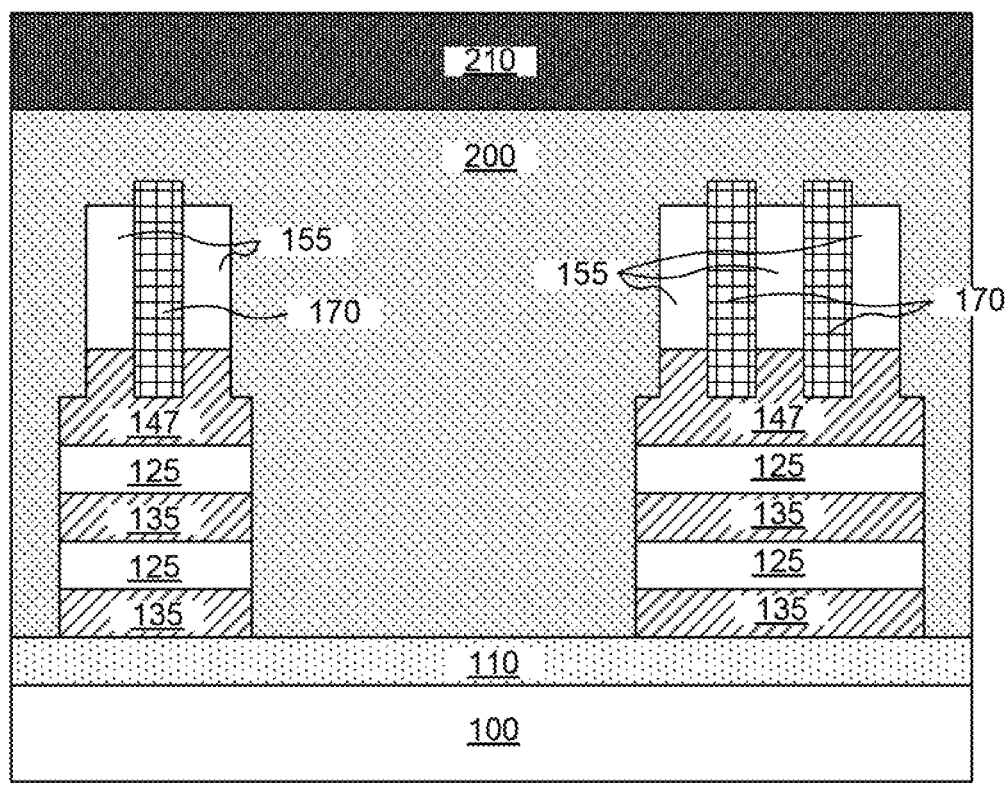
FIG. 8A depicts a cross-sectional view across the x-line in a gate region of the CFET device following dummy gate formation, according to a first example embodiment.
Figure 8B:
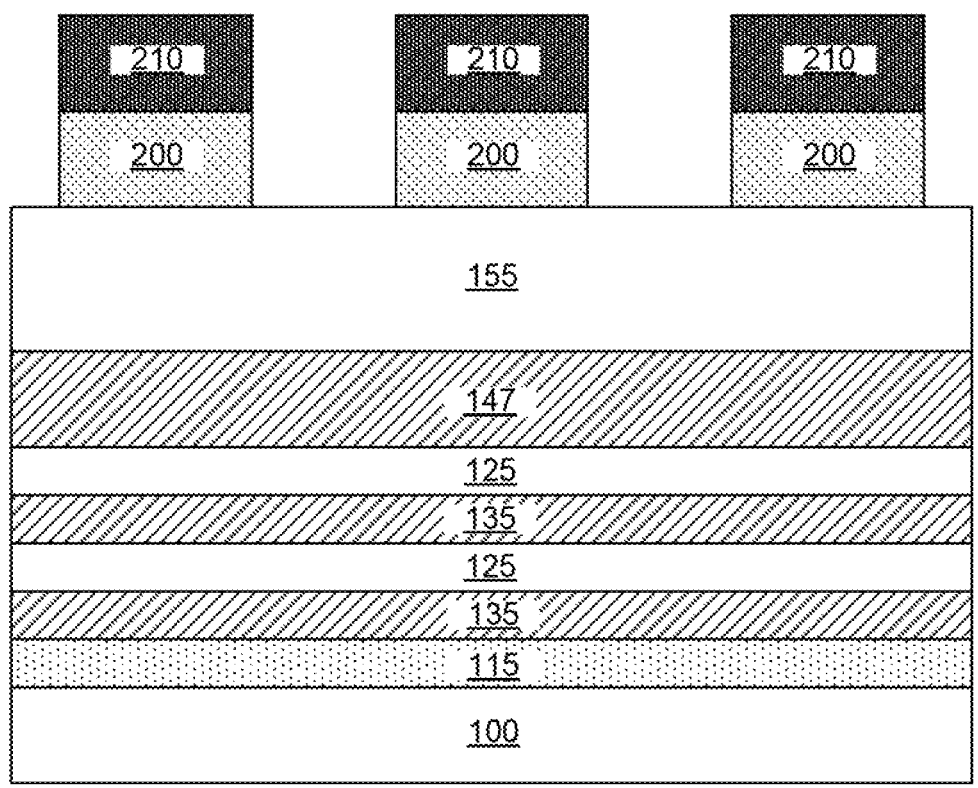
FIG. 8B depicts a cross-sectional view across the y-line in a fin region of the CFET device following dummy gate formation, according to a first example embodiment.

Referring to FIG. 8A (X-cut) & B (Y-cut) depicts forming a dummy gate 200 and dummy gate hardmask 210. Dummy gate 200 is then formed on the nanosheet device stack 105 over channel regions of the stacked nanosheet device. To form dummy gate 200, a sacrificial gate material is first blanket deposited over the structure of FIGS. 7A & B. Suitable sacrificial gate materials include, but are not limited to, a thin layer of SiO2 followed by ploy-silicon (poly-Si) and/or amorphous silicon (a-Si). A process such as CVD, ALD or PVD can be employed to deposit the sacrificial gate material.

Dummy gate 200 serve as a placeholder for the final gates of the stacked nanosheet device. Namely, dummy gate 200 will be removed later in the process and replaced with metal gate stacks that will serve as the final gates of the stacked nanosheet device. Thus, these final gates of the stacked nanosheet device are also referred to herein as "replacement metal gates" or simply "RMG." Use of an RMG process is advantageous because it prevents exposure of the metal gate stack materials to potentially damaging conditions during subsequent processing steps. For instance, the high-κ dielectrics used in the RMG gate stacks can be damaged by exposure to high temperatures. Thus, these gate stack materials are only placed near the end of the process.

Dummy gate hardmask 210 are then formed on the sacrificial gate material marking the footprint and location of each of the dummy gate 200. Suitable materials for the dummy gate hardmask 210 include, but are not limited to, nitride hardmask materials such as SiN, SiON and/or SiCN, and/or oxide hardmask materials such as SiOx. An etch using the dummy gate hardmask 210 is then used to pattern the sacrificial gate material into the individual dummy gate 200 shown in FIGS. 8A & B. A directional (anisotropic) etching process such as RIE can be employed for the sacrificial gate etch.

Figure 9A:
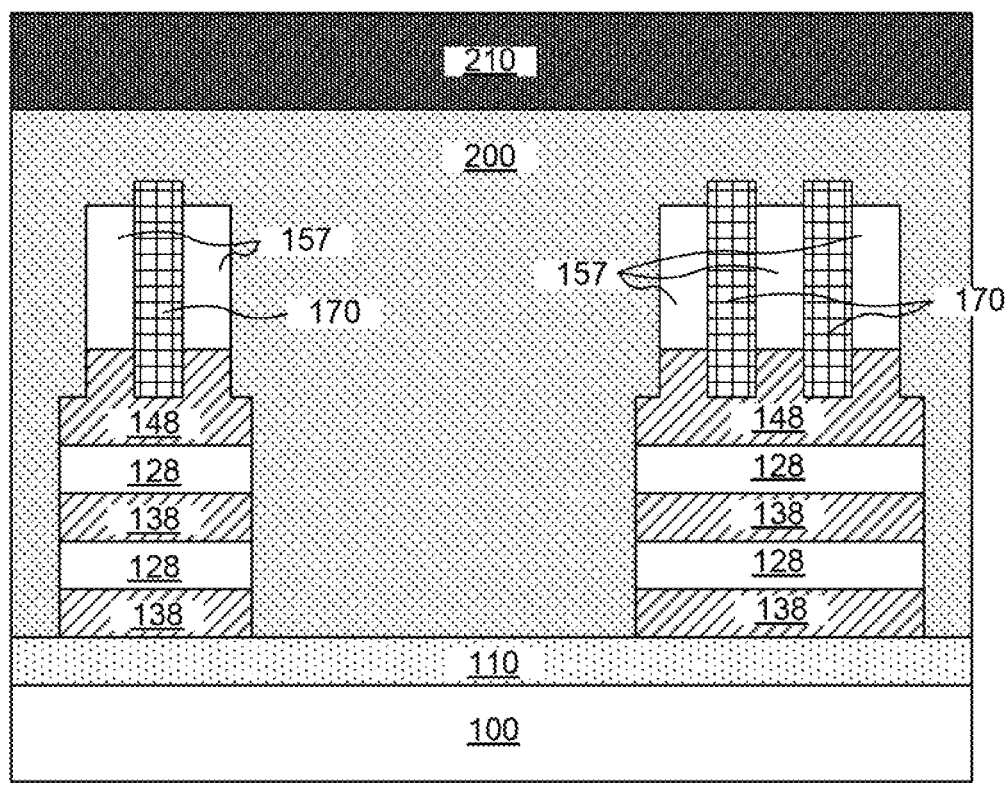
FIG. 9A depicts a cross-sectional view across the x-line in a gate region of the CFET device following spacer formation and patterning of the channel region, according to a first example embodiment.
Figure 9B:
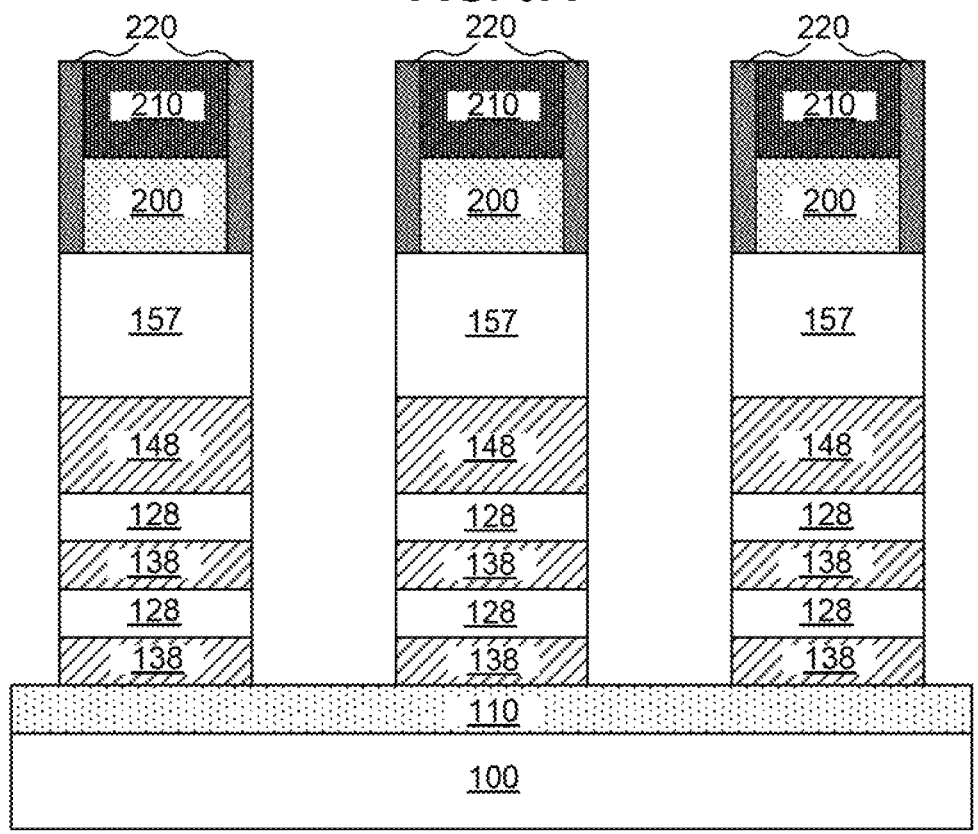
FIG. 9B depicts a cross-sectional view across the y-line in a fin region of the CFET device following spacer formation and patterning of the channel region, according to a first example embodiment.
Figure 9C:
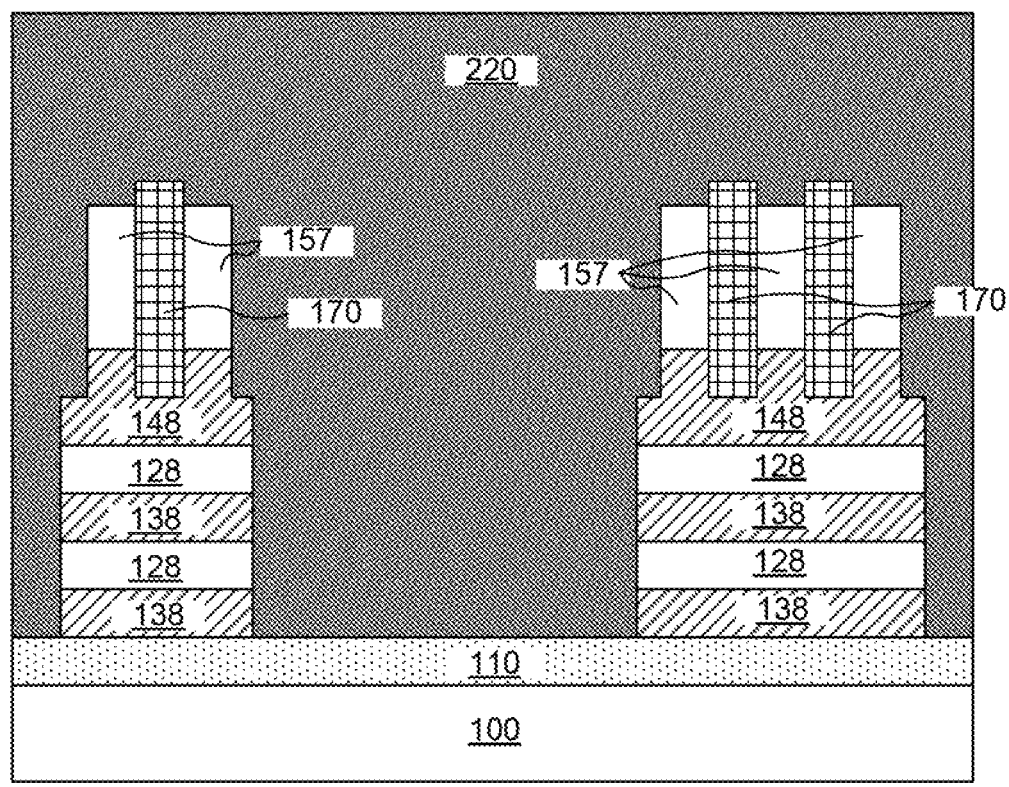
FIG. 9C depicts a cross-sectional view across the z-line in a spacer region of the CFET device following spacer formation and patterning of the channel region, according to a first example embodiment.
Figure 9D:
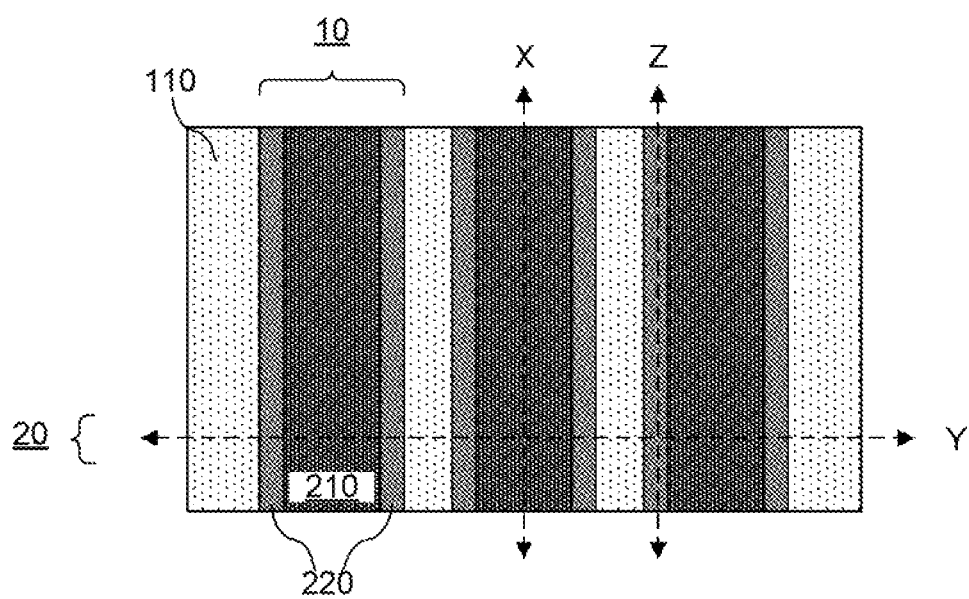
FIG. 9D depicts a top down view depicting the cross-sectional views following spacer formation and patterning of the channel region, according to a first example embodiment.

Referring to FIG. 9A-D depicts forming spacers 220 and patterning the bottom nanosheets, forming sacrificial layers 138, lower nanosheets 128, an intermediate buffer layer 148, and fins 157. Spacer 220 may be formed by a conformal deposition followed by a reactive ion etch (RIE). The RIE may be performed to the buried oxide layer 110, forming a channel region for each of the devices. FIG. 9C depicts the cross-section along Z-axis through the spacer. Where spacer 220 wraps around the FIN/Nanosheet stack.

Figure 10A:
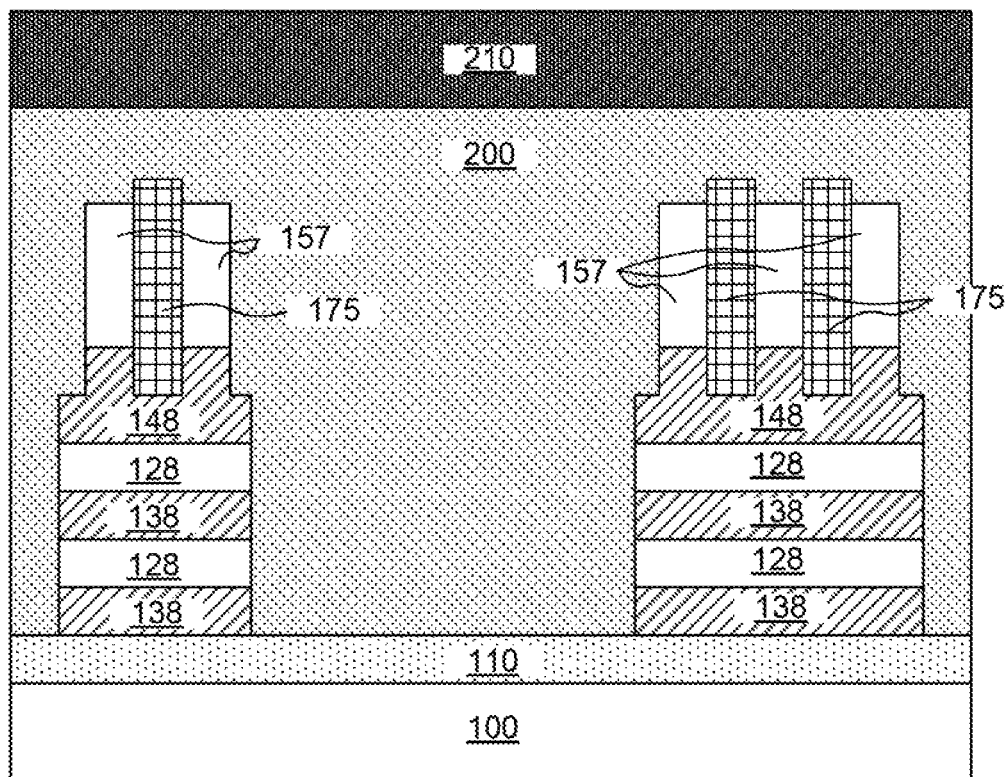
FIG. 10A depicts a cross-sectional view across the x-line in a gate region of the CFET device following removal of the sacrificial liner under the gate spacer, according to a first example embodiment.
Figure 10B:
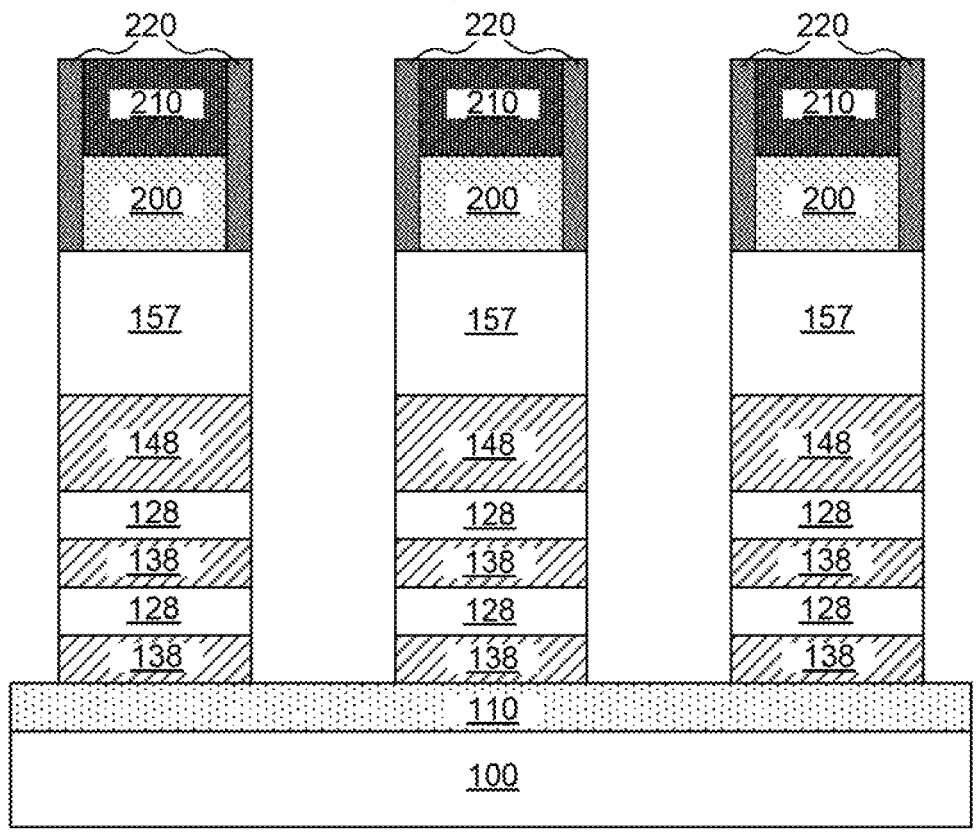
FIG. 10B depicts a cross-sectional view across the y-line in a fin region of the CFET device following removal of the sacrificial liner under the gate spacer, according to a first example embodiment.
Figure 10C:
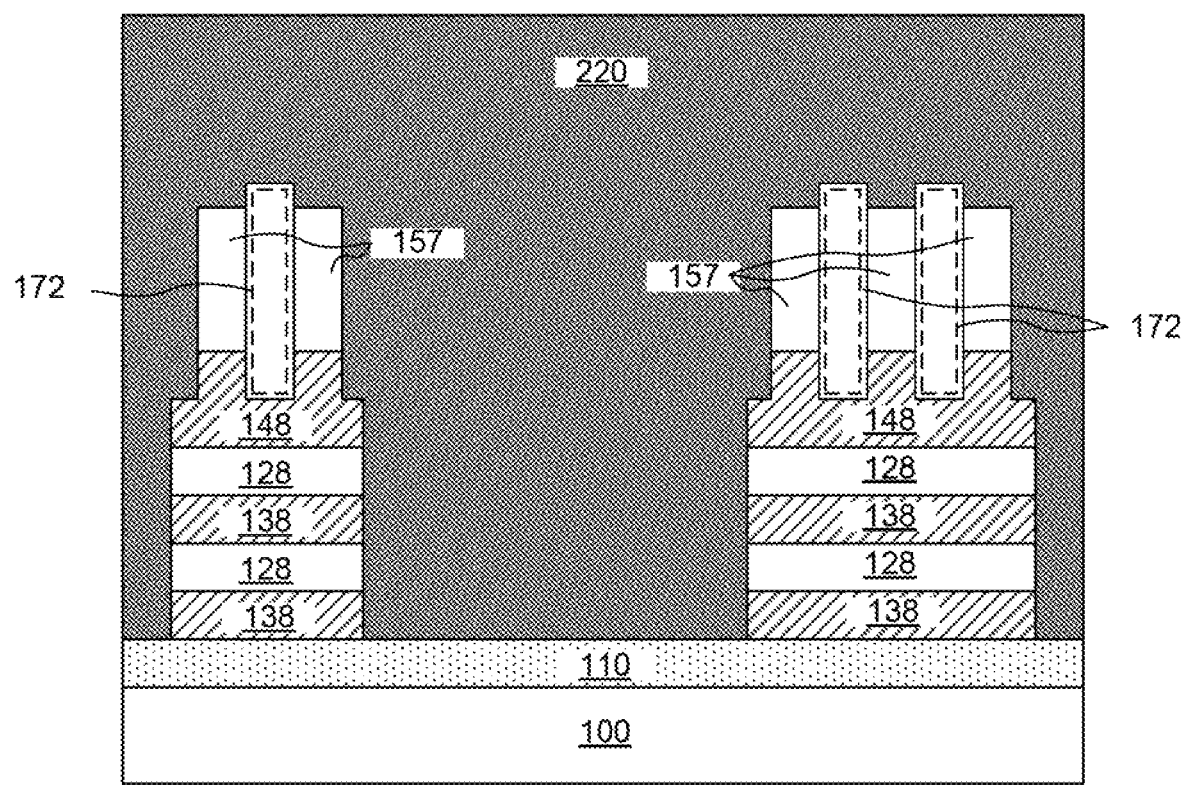
FIG. 10C depicts a cross-sectional view across the z-line in a spacer region of the CFET device following removal of the sacrificial liner under the gate spacer, according to a first example embodiment.
Figure 10D:
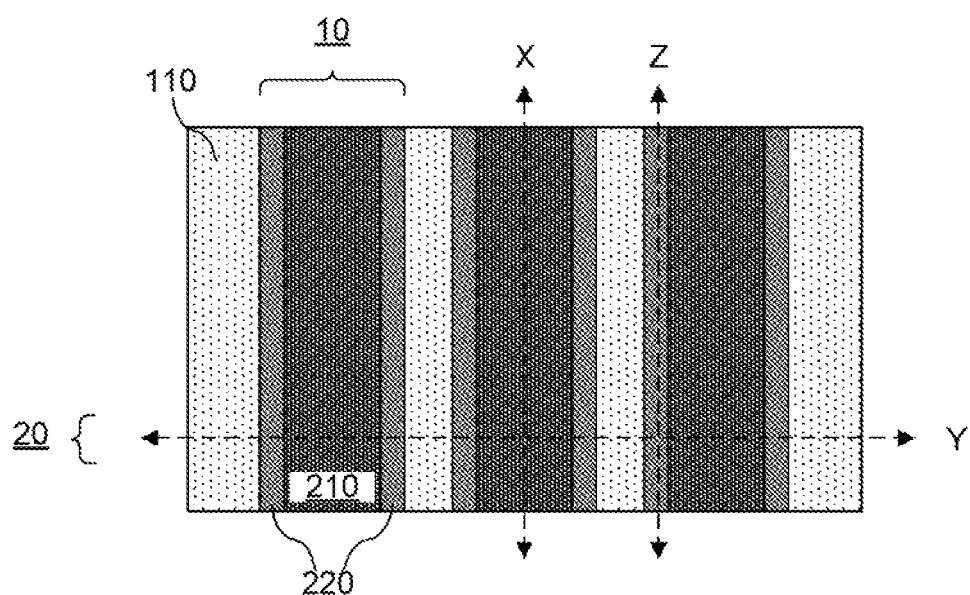
FIG. 10D depicts a top down view depicting the cross-sectional views following removal of the sacrificial liner under the gate spacer, according to a first example embodiment.
Figure 11A:
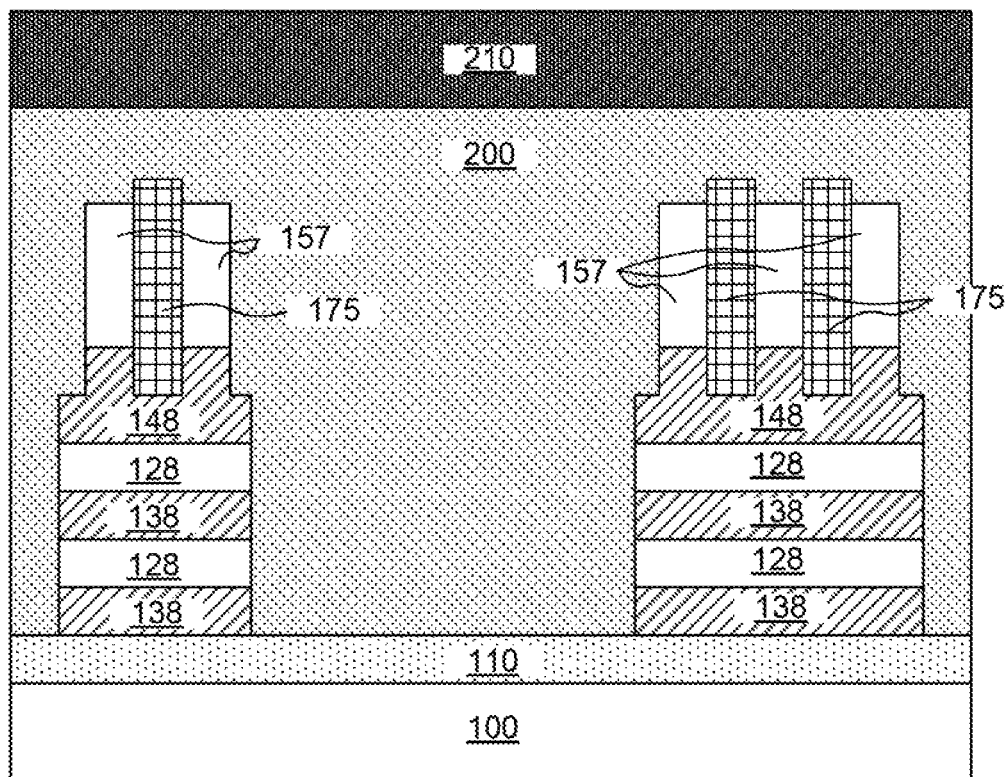
FIG. 11A depicts a cross-sectional view across the x-line in a gate region of the CFET device following formation of an inner spacer for the top FET of the CFET, according to a first example embodiment.
Figure 11B:
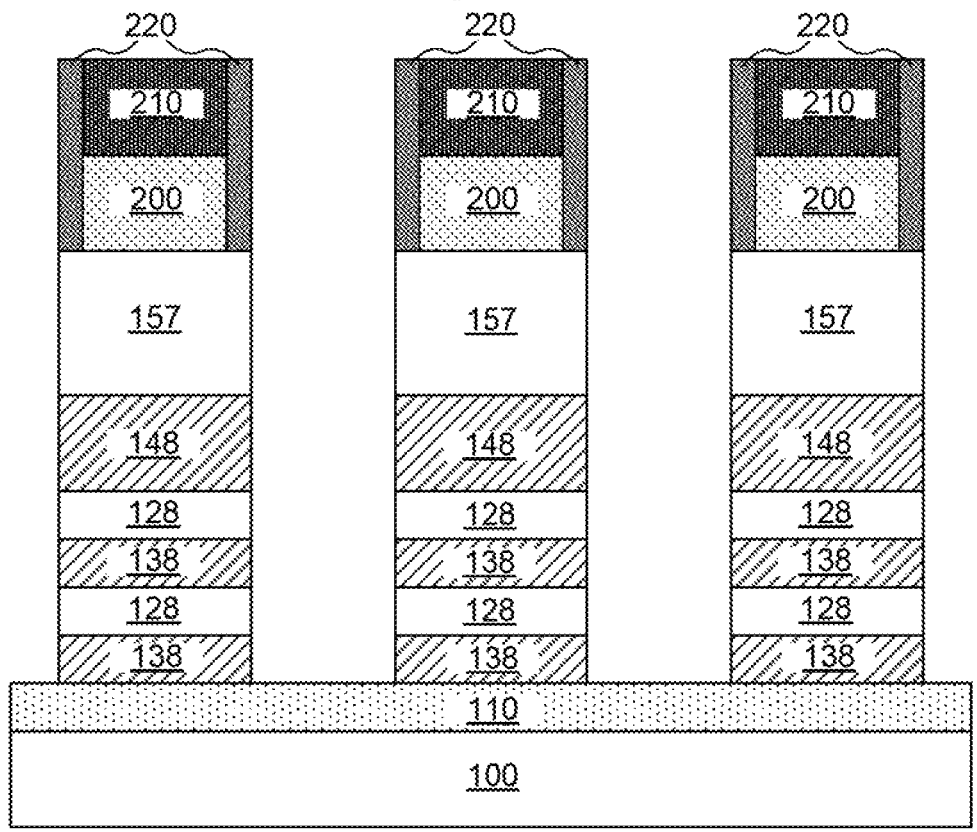
FIG. 11B depicts a cross-sectional view across the y-line in a fin region of the CFET device following formation of an inner spacer for the top FET of the CFET, according to a first example embodiment.
Figure 11C:
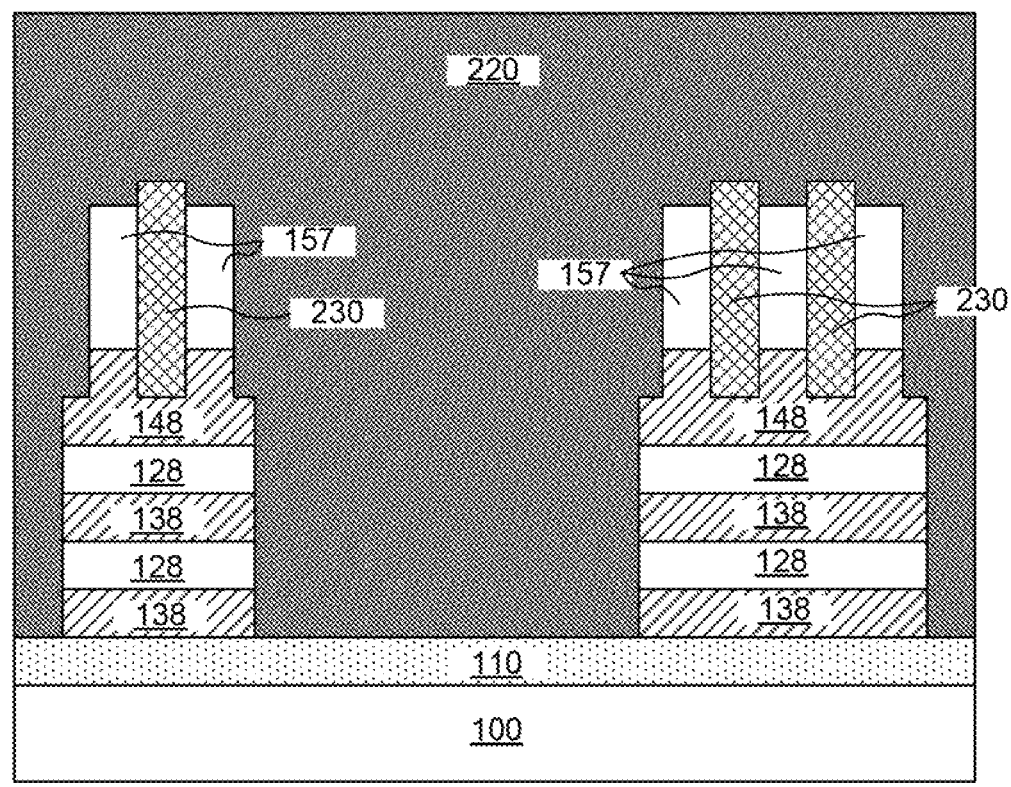
FIG. 11C depicts a cross-sectional view across the z-line in a spacer region of the CFET device following formation of an inner spacer for the top FET of the CFET, according to a first example embodiment.
Figure 11D:
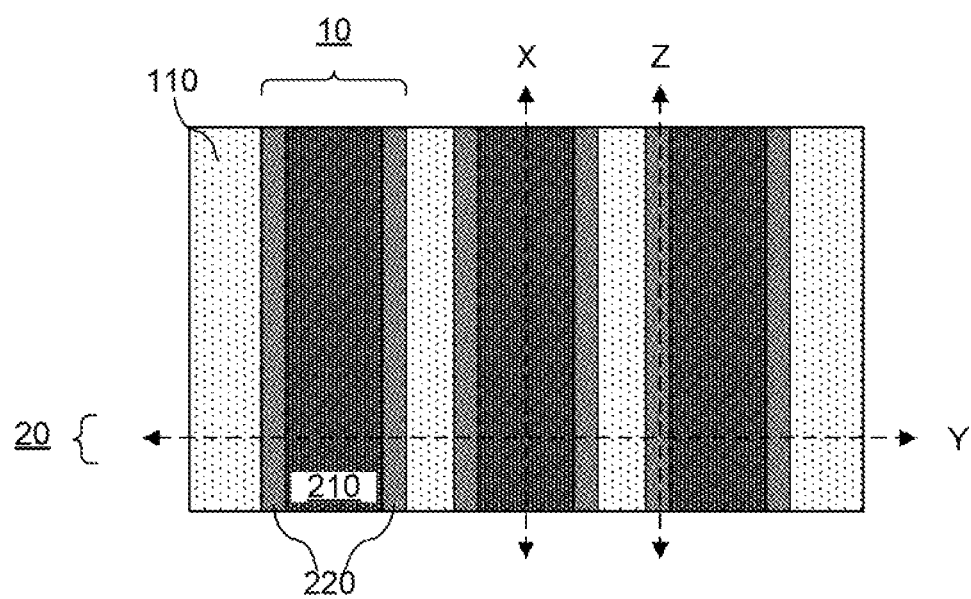
FIG. 11D depicts a top down view depicting the cross-sectional views following formation of an inner spacer for the top FET of the CFET, according to a first example embodiment.
Figure 12A:
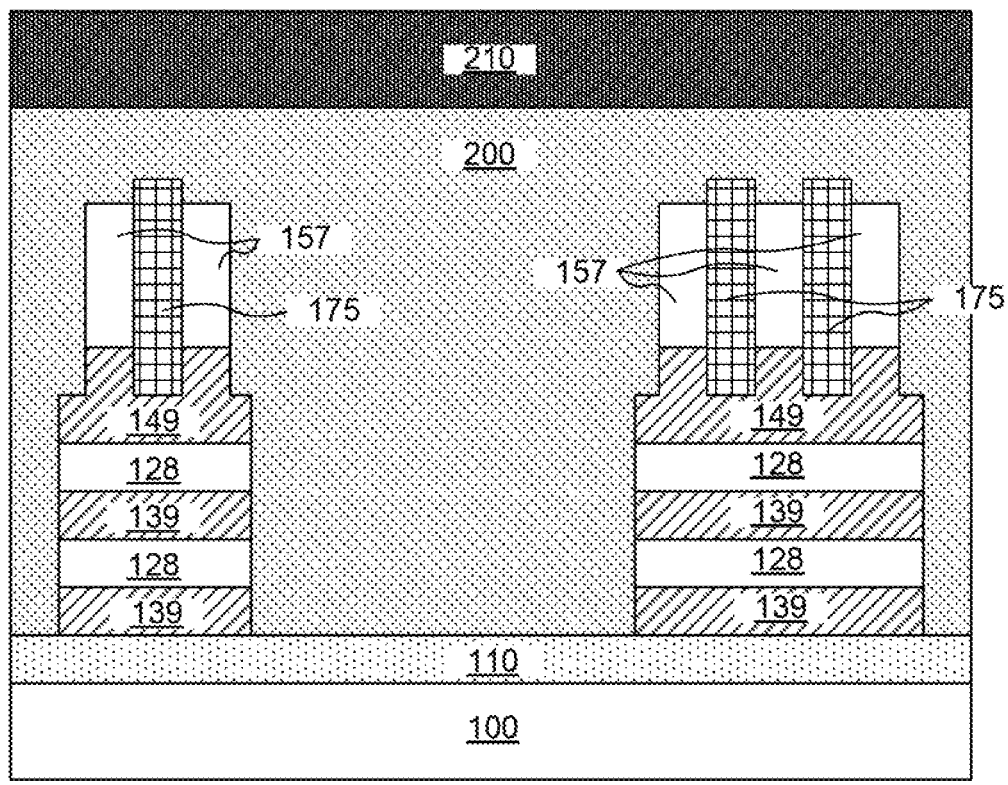
FIG. 12A depicts a cross-sectional view across the x-line in a gate region of the CFET device following pullback of the sacrificial layers of the bottom FET of the CFET, according to a first example embodiment.
Figure 12B:
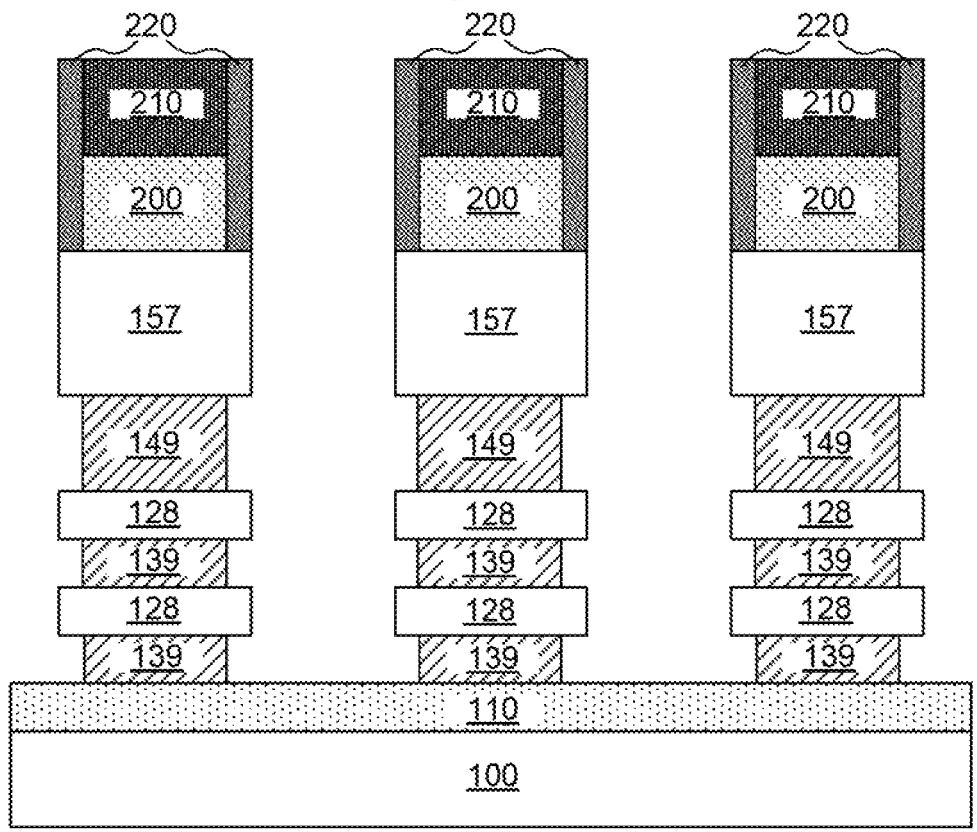
FIG. 12B depicts a cross-sectional view across the y-line in a fin region of the CFET device following pullback of the sacrificial layers of the bottom FET of the CFET, according to a first example embodiment.
Figure 12C:
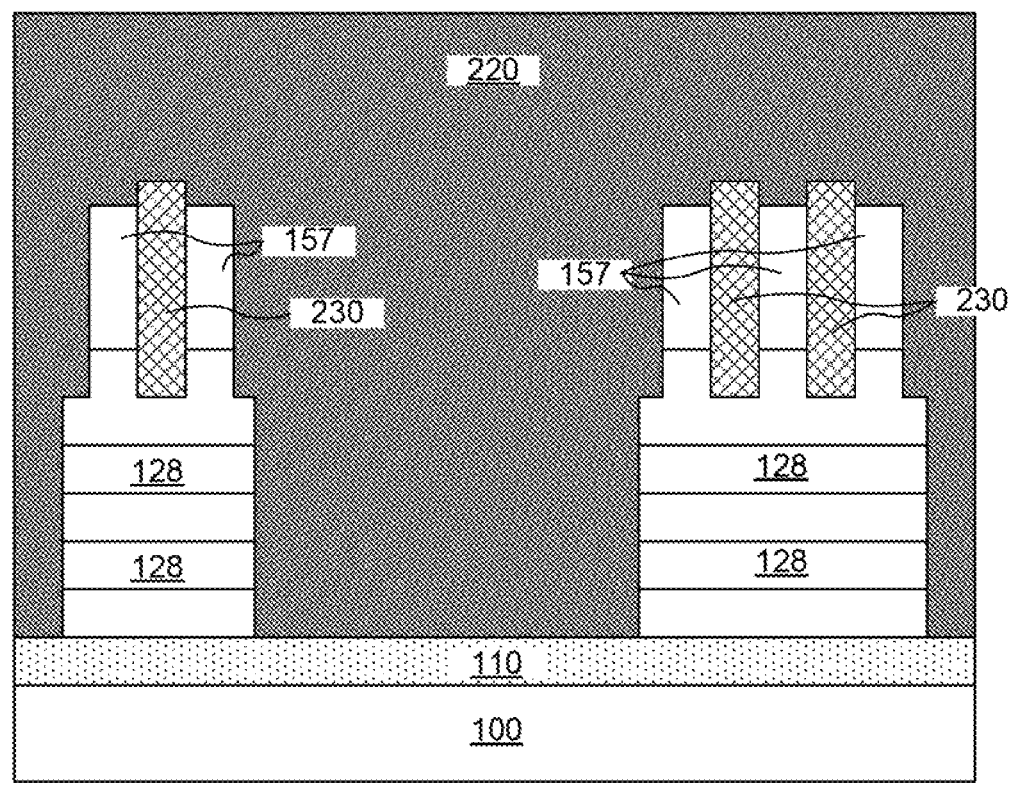
FIG. 12C depicts a cross-sectional view across the z-line in a spacer region of the CFET device following pullback of the sacrificial layers of the bottom FET of the CFET, according to a first example embodiment.
Figure 12D:
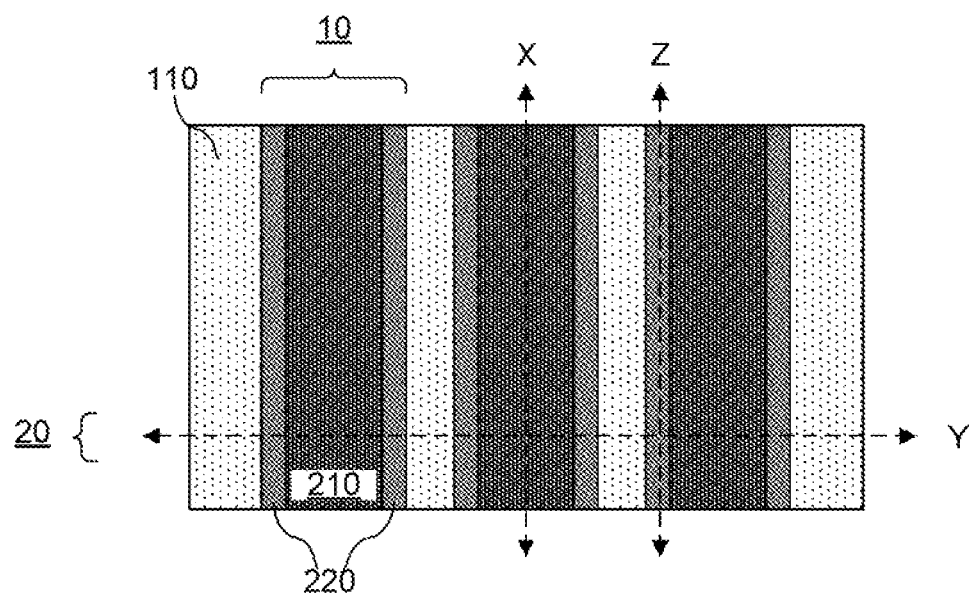
FIG. 12D depicts a top down view depicting the cross-sectional views following pullback of the sacrificial layers of the bottom FET of the CFET, according to a first example embodiment.
Figure 13A:
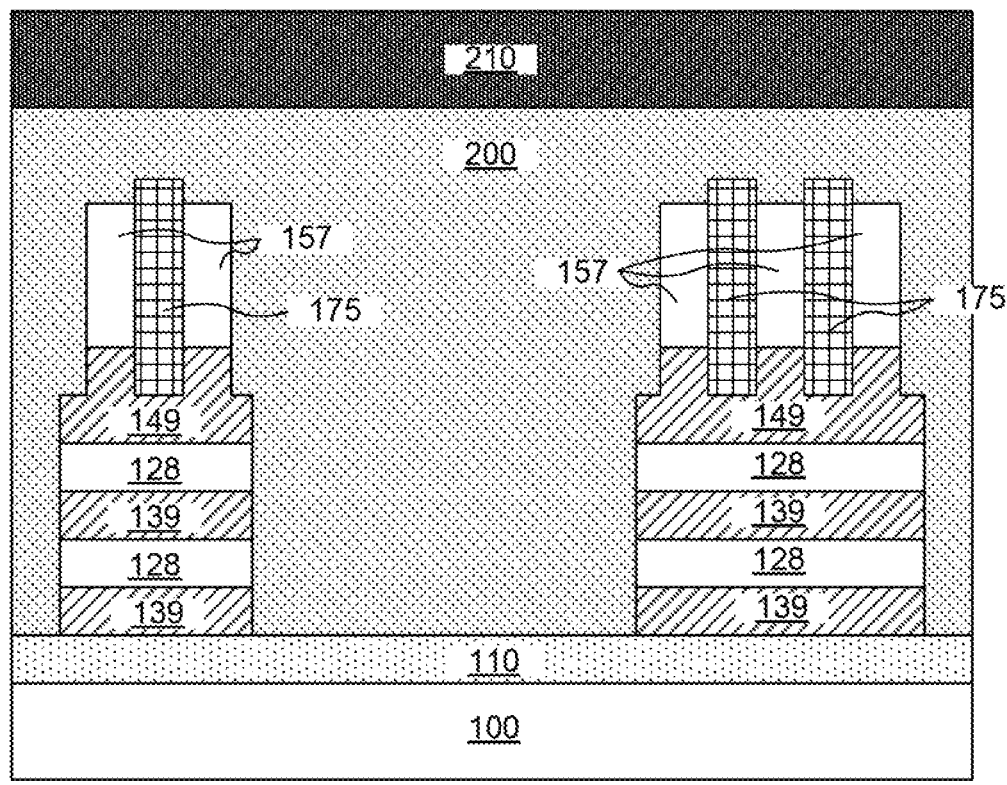
FIG. 13A depicts a cross-sectional view across the x-line in a gate region of the CFET device following formation of an inner spacer for the bottom FET of the CFET, according to a first example embodiment.
Figure 13B:
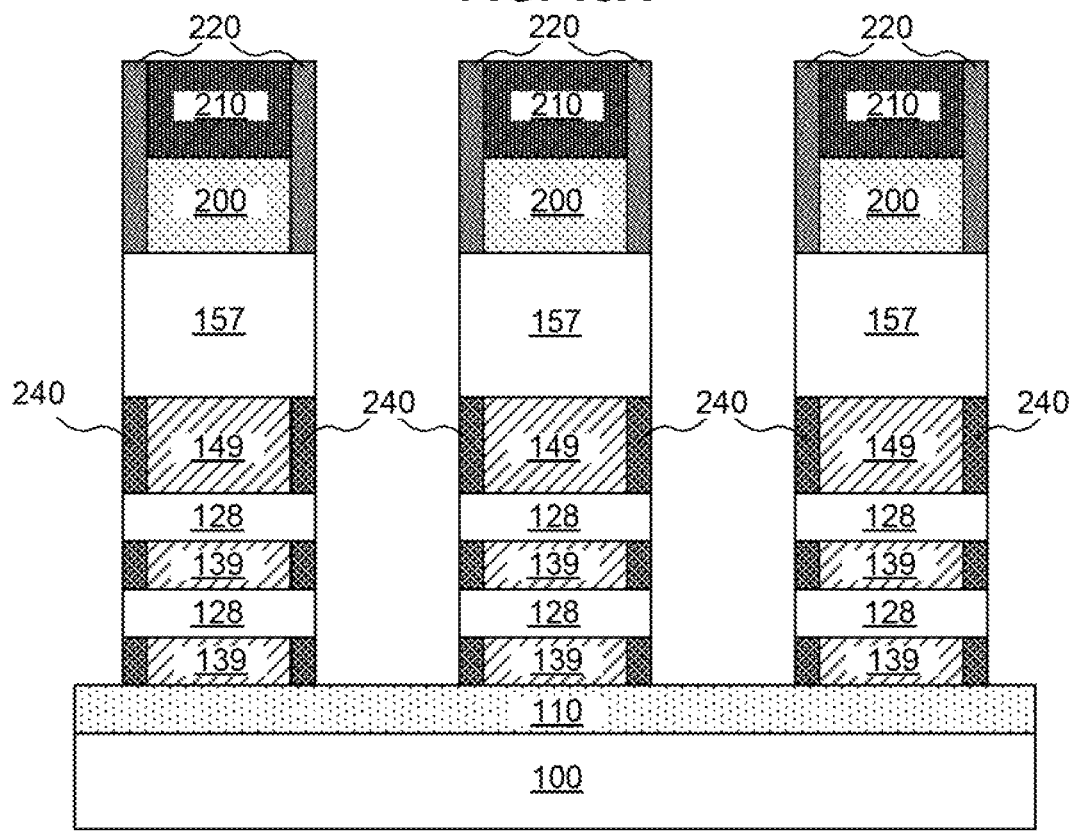
FIG. 13B depicts a cross-sectional view across the y-line in a fin region of the CFET device following formation of an inner spacer for the bottom FET of the CFET, according to a first example embodiment.
Figure 13C:
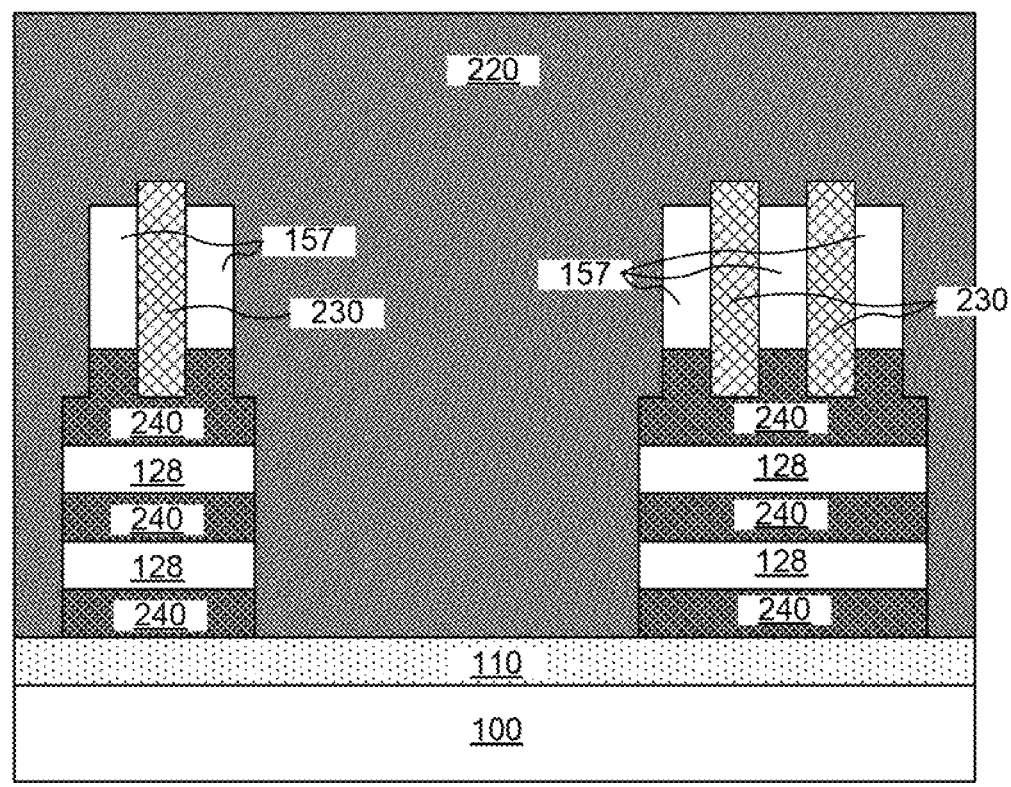
FIG. 13C depicts a cross-sectional view across the z-line in a spacer region of the CFET device following formation of an inner spacer for the bottom FET of the CFET, according to a first example embodiment.
Figure 13D:
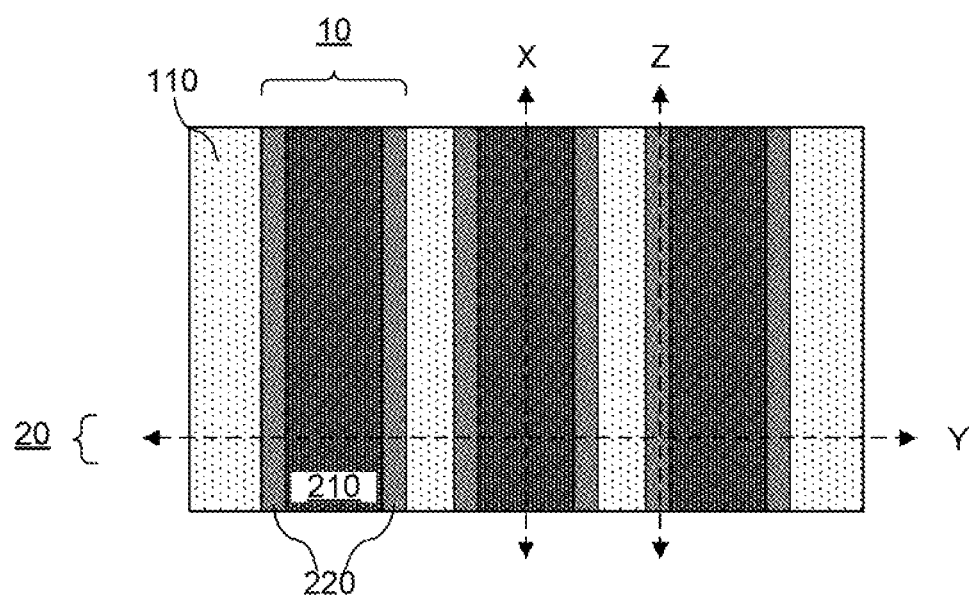
FIG. 13D depicts a top down view depicting the cross-sectional views following formation of an inner spacer for the bottom FET of the CFET, according to a first example embodiment.
Figure 14A:
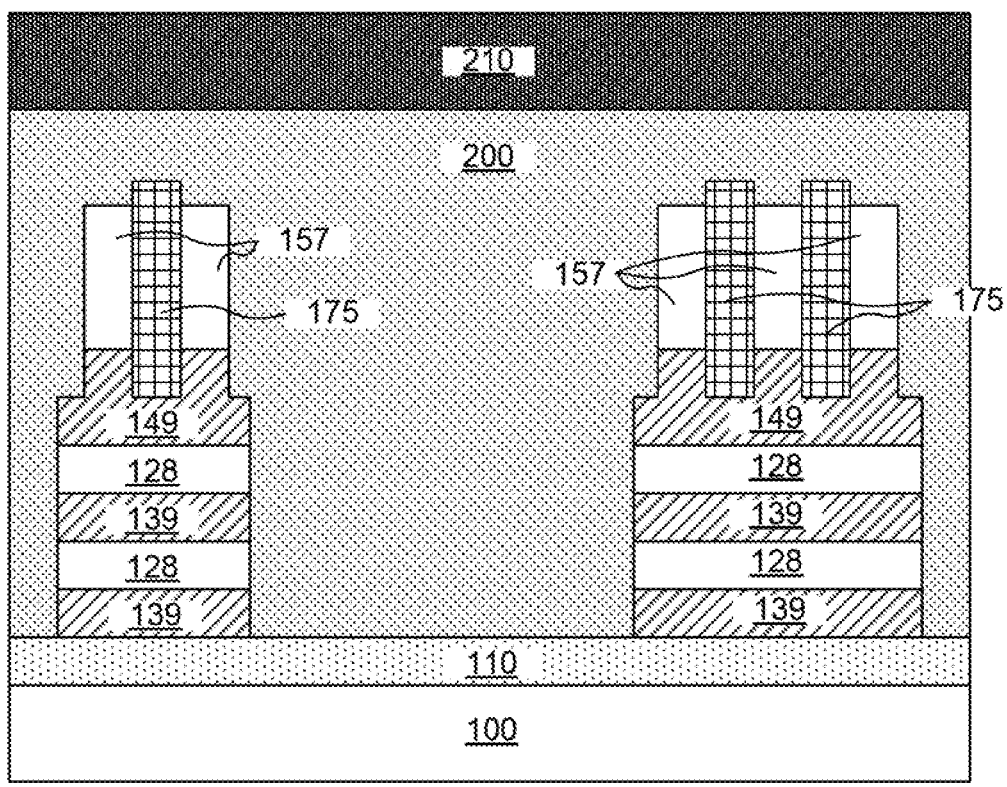
FIG. 14A depicts a cross-sectional view across the x-line in a gate region of the CFET device following formation of a bottom source/drain of the bottom FET, a source/drain isolation layer, and a top source/drain of the top FET, according to a first example embodiment.
Figure 14B:
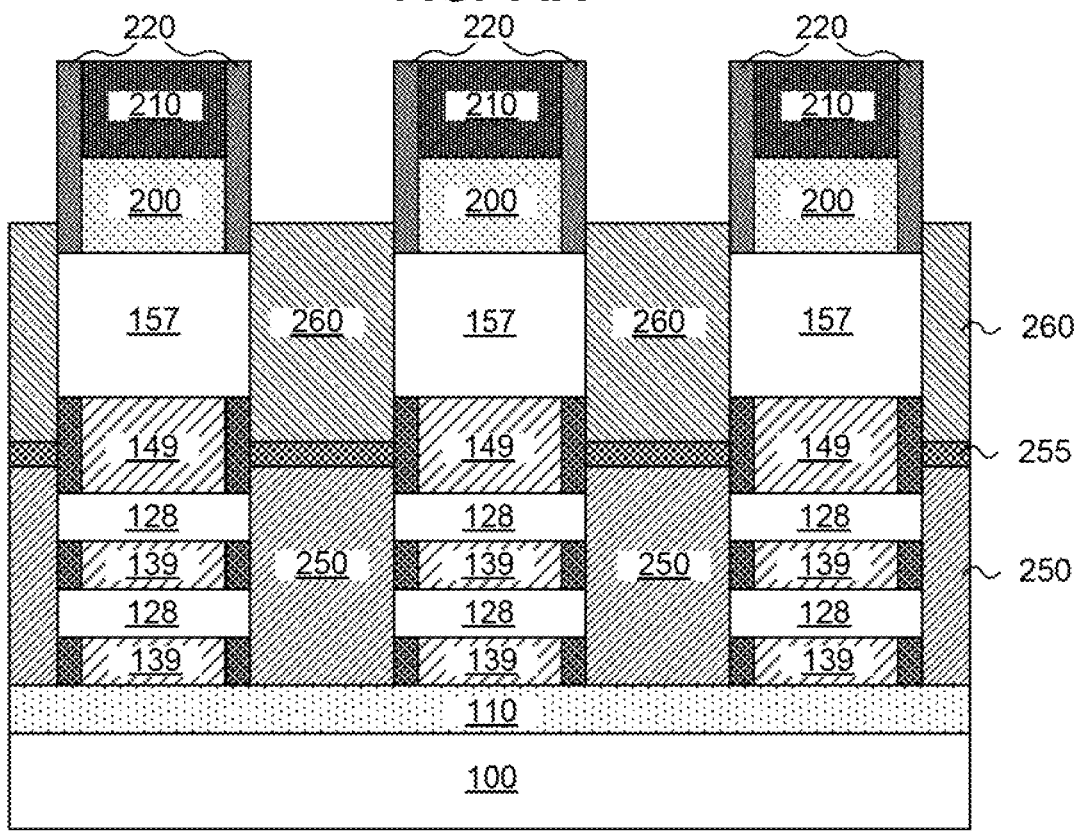
FIG. 14B depicts a cross-sectional view across the y-line in a fin region of the CFET device following formation of a bottom source/drain of the bottom FET, a source/drain isolation layer, and a top source/drain of the top FET, according to a first example embodiment.
Figure 14C:
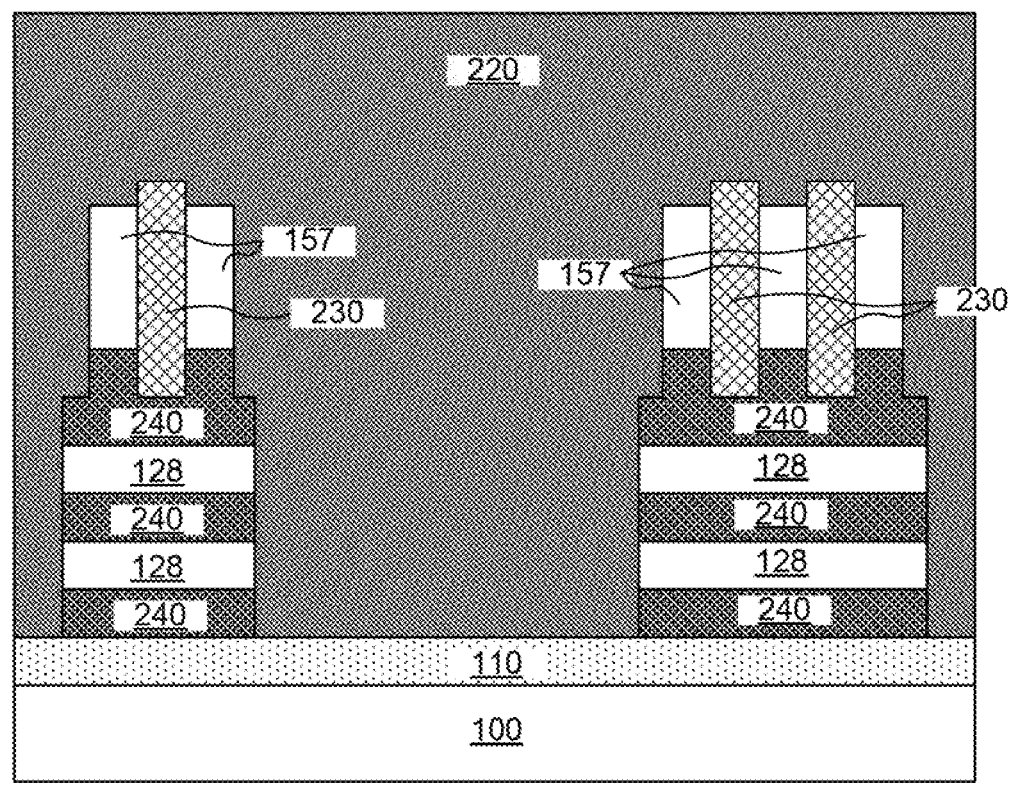
FIG. 14C depicts a cross-sectional view across the z-line in a spacer region of the CFET device following formation of a bottom source/drain of the bottom FET, a source/drain isolation layer, and a top source/drain of the top FET, according to a first example embodiment.
Figure 14D:
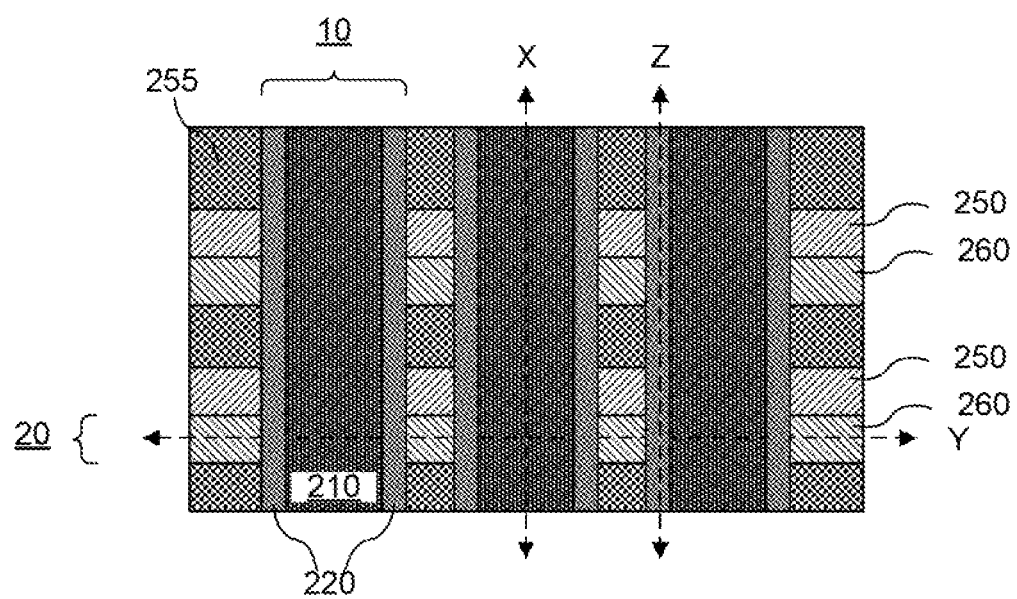
FIG. 14D depicts a top down view depicting the cross-sectional views following formation of a bottom source/drain of the bottom FET, a source/drain isolation layer, and a top source/drain of the top FET, according to a first example embodiment.
Figure 15A:
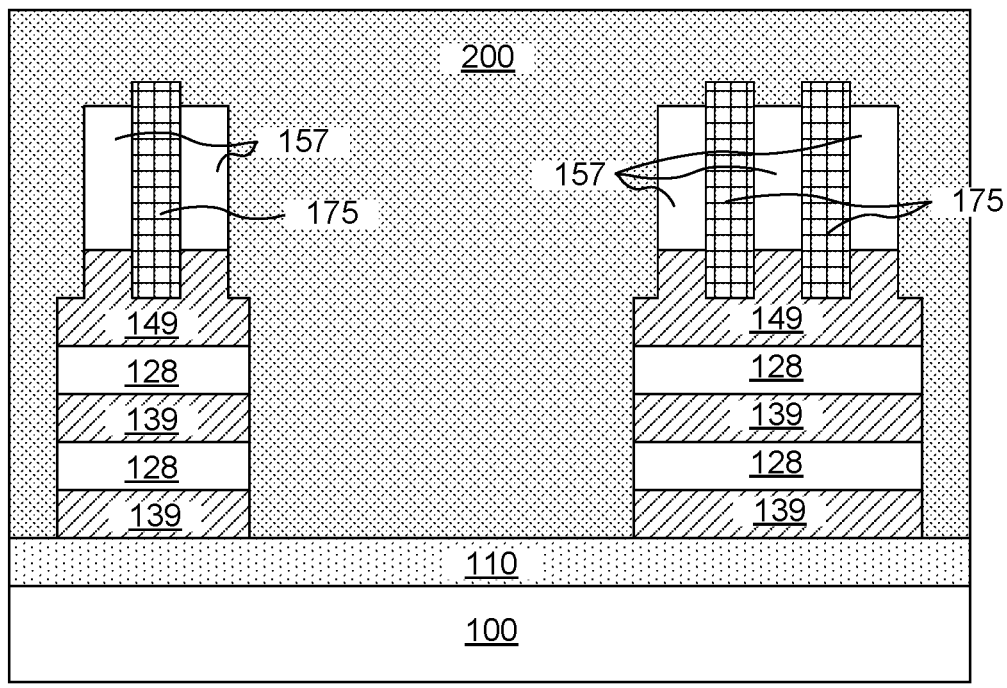
FIG. 15A depicts a cross-sectional view across the x-line in a gate region of the CFET device following an ILD fill in the source/drain region and CMP to remove the dummy gate hardmask, according to a first example embodiment.
Figure 15B:
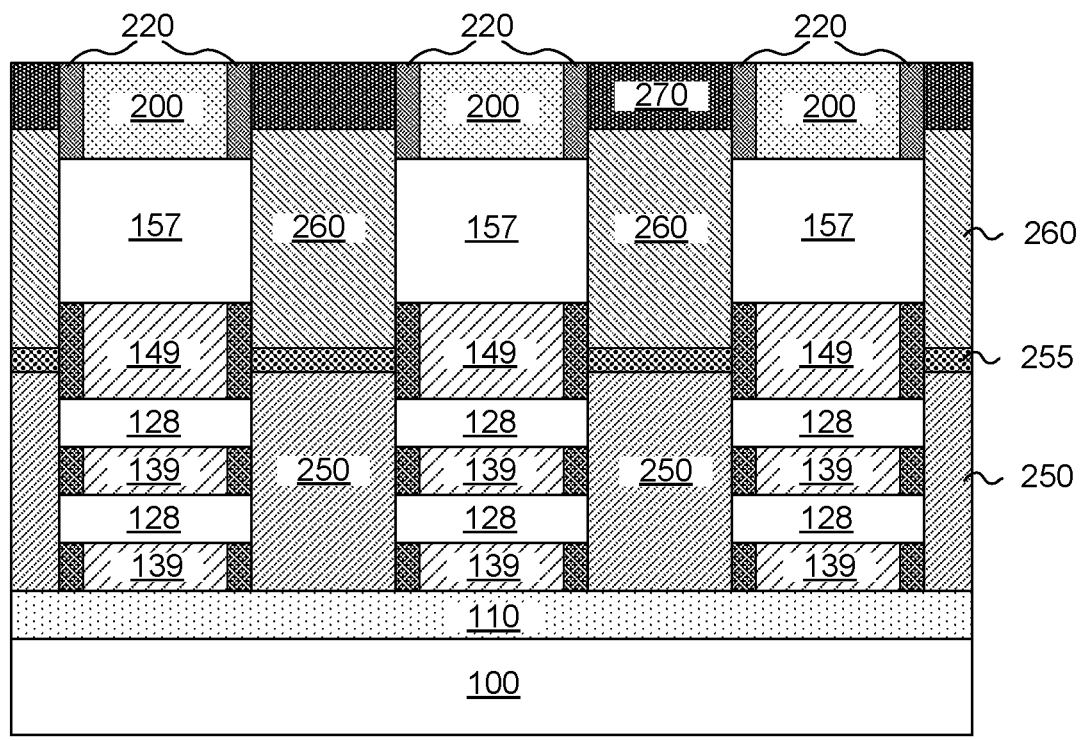
FIG. 15B depicts a cross-sectional view across the y-line in a fin region of the CFET device following an ILD fill in the source/drain region and CMP to remove the dummy gate hardmask, according to a first example embodiment.
Figure 15C:
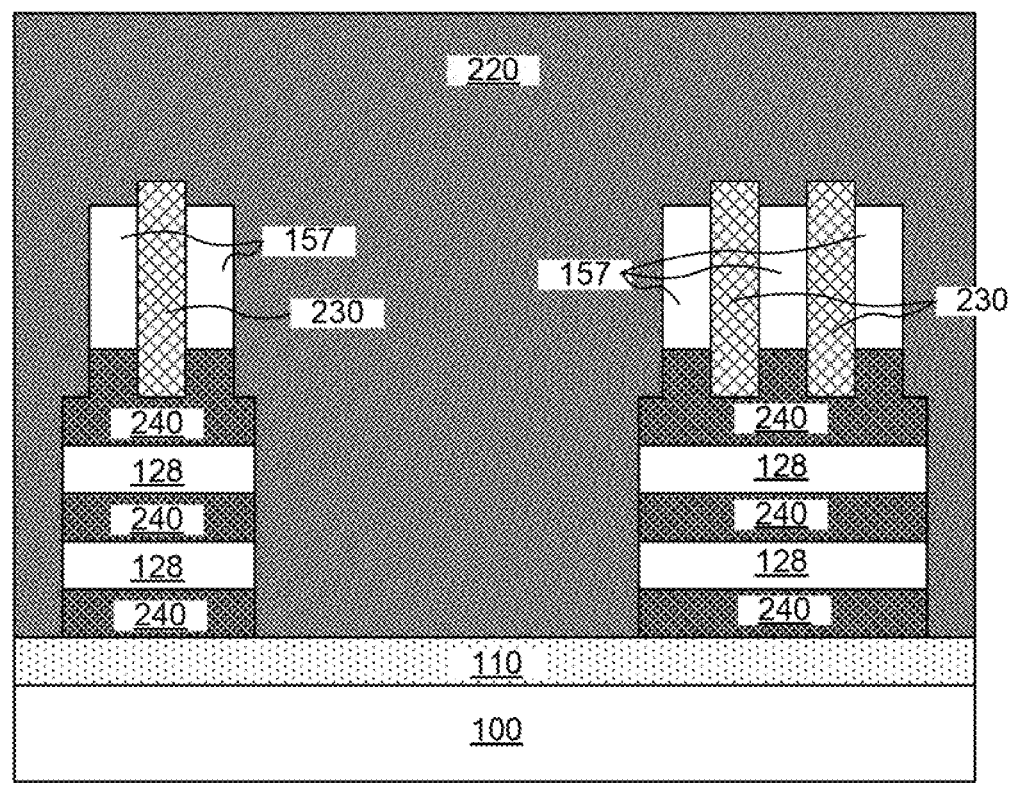
FIG. 15C depicts a cross-sectional view across the z-line in a spacer region of the CFET device following an ILD fill in the source/drain region and CMP to remove the dummy gate hardmask, according to a first example embodiment.
Figure 15D:
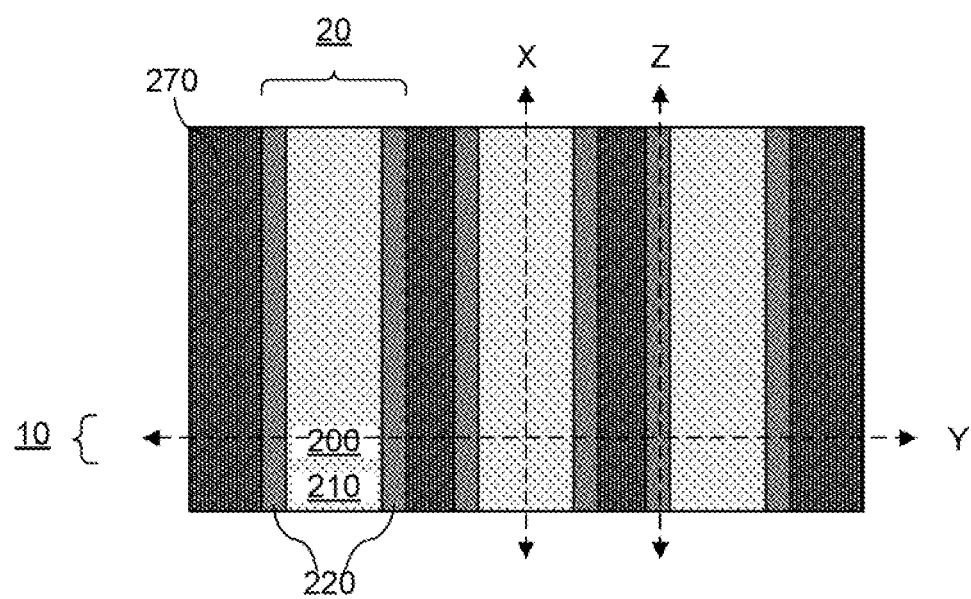
FIG. 15D depicts a top down view depicting the cross-sectional views following an ILD fill in the source/drain region and CMP to remove the dummy gate hardmask, according to a first example embodiment.
Figure 16A:
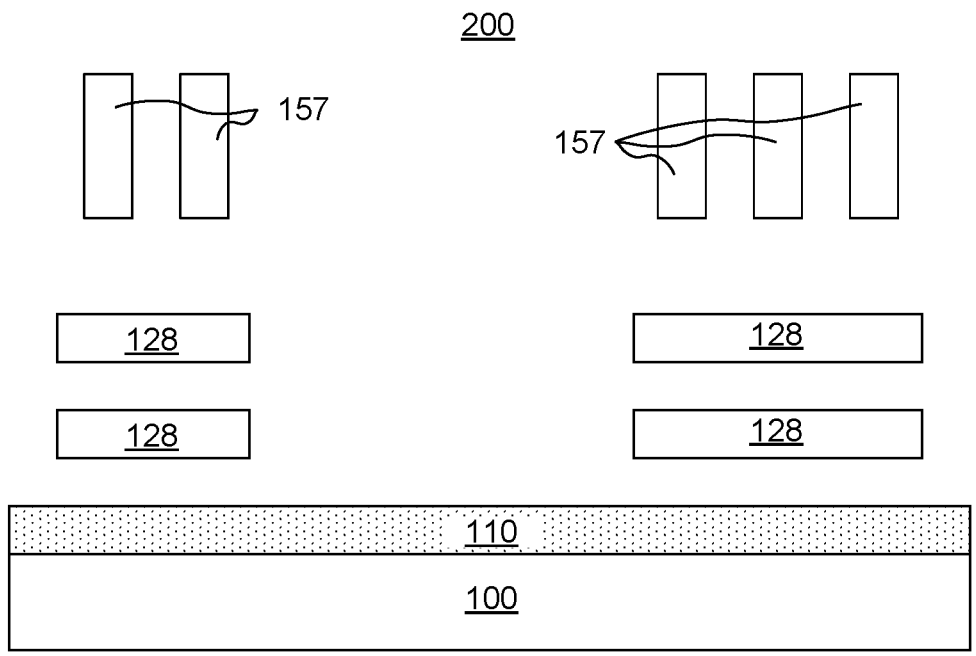
FIG. 16A depicts a cross-sectional view across the x-line in a gate region of the CFET device following dummy gate removal and sacrificial layer release, according to a first example embodiment.
Figure 16B:
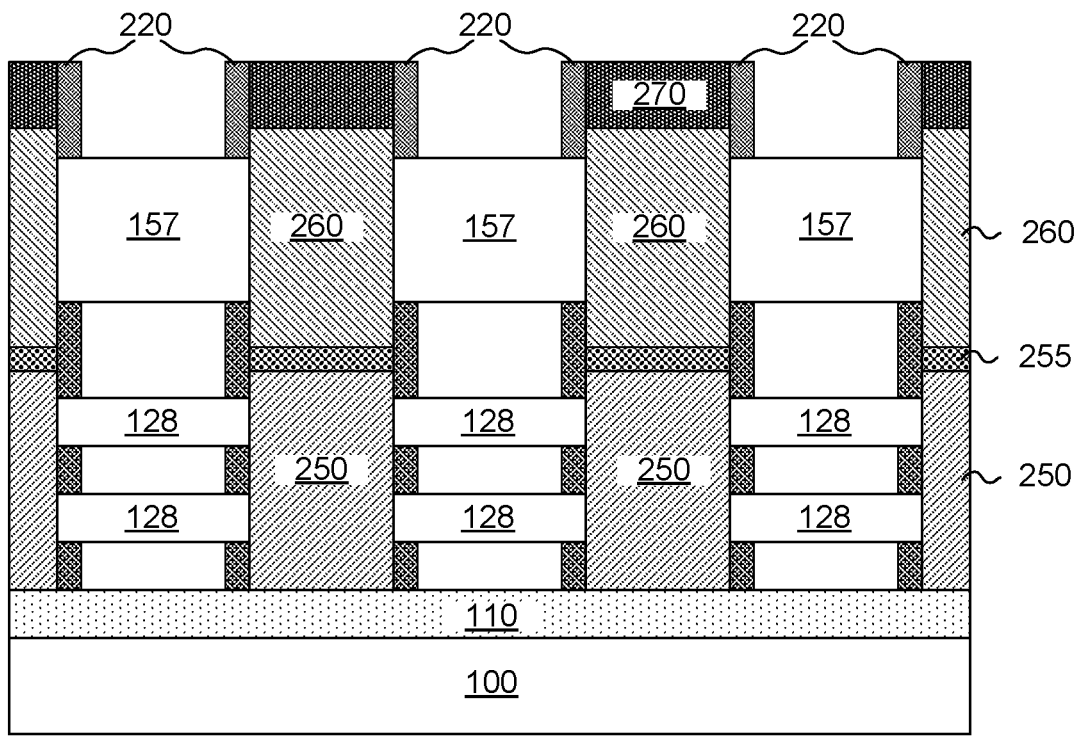
FIG. 16B depicts a cross-sectional view across the y-line in a fin region of the CFET device following dummy gate removal and sacrificial layer release, according to a first example embodiment.
Figure 16C:
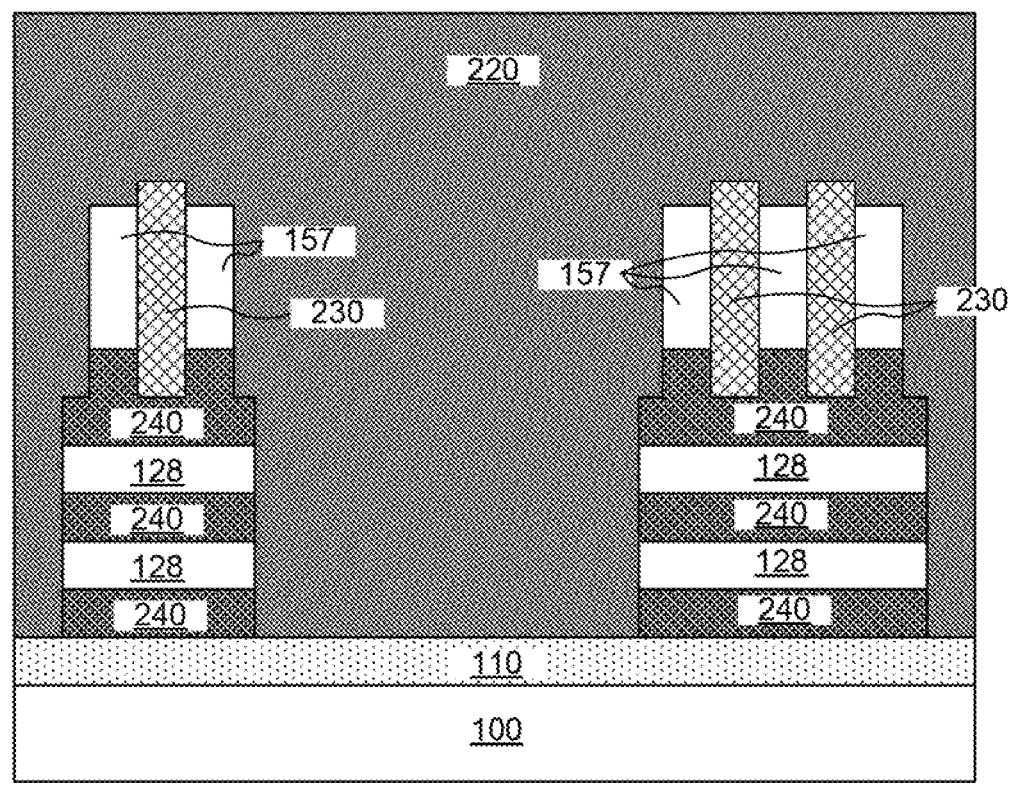
FIG. 16C depicts a cross-sectional view across the z-line in a spacer region of the CFET device following dummy gate removal and sacrificial layer release, according to a first example embodiment.
Figure 16D:
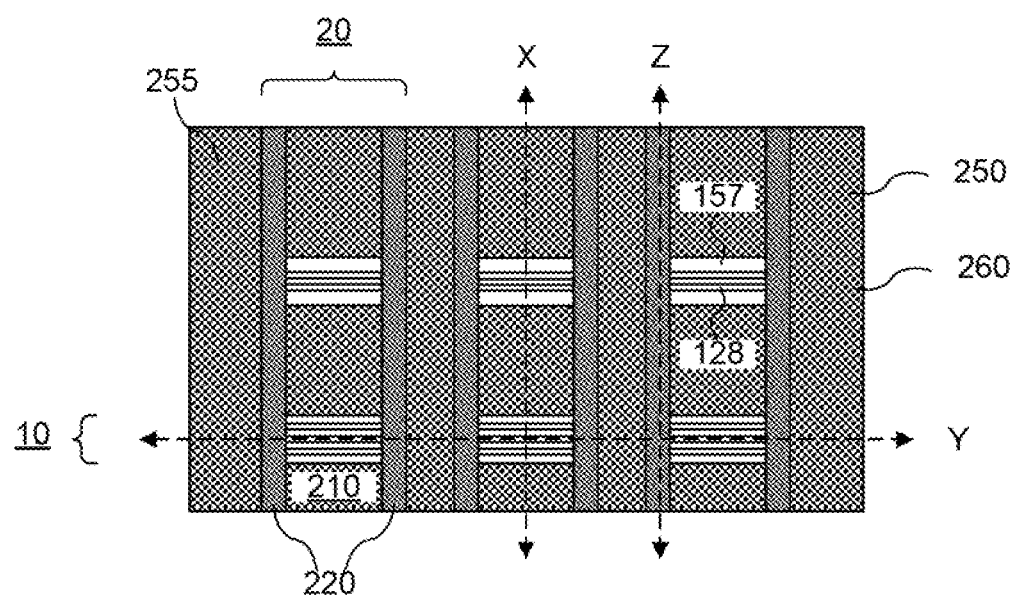
FIG. 16D depicts a top down view depicting the cross-sectional views following dummy gate removal and sacrificial layer release, according to a first example embodiment.
Figure 17A:
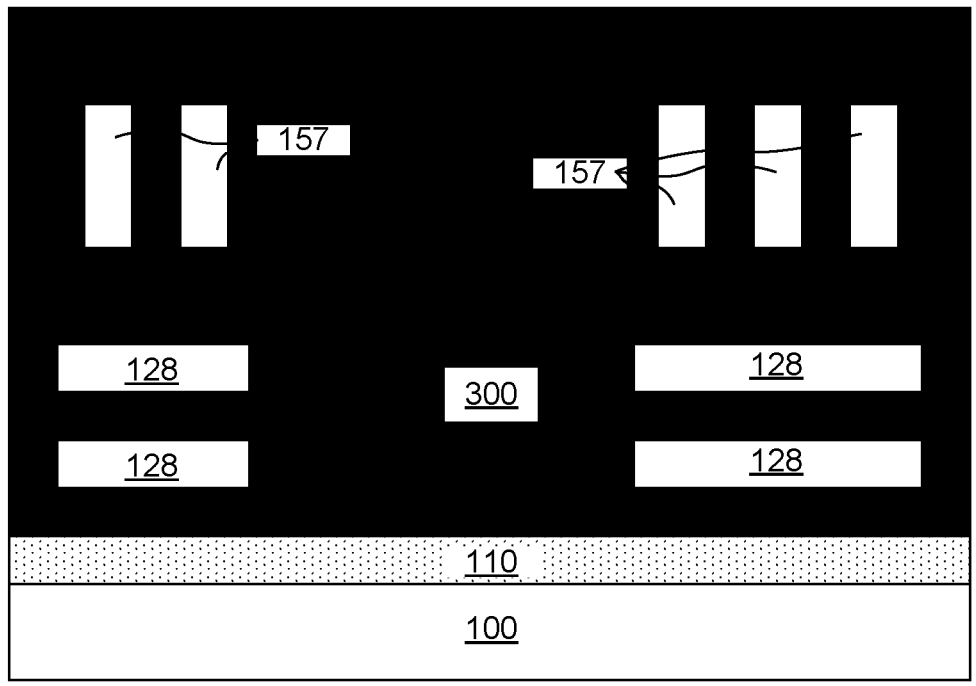
FIG. 17A depicts a cross-sectional view across the x-line in a gate region of the CFET device following RMG (Replacement Metal Gate) and contact formation, according to a first example embodiment.
Figure 17B:
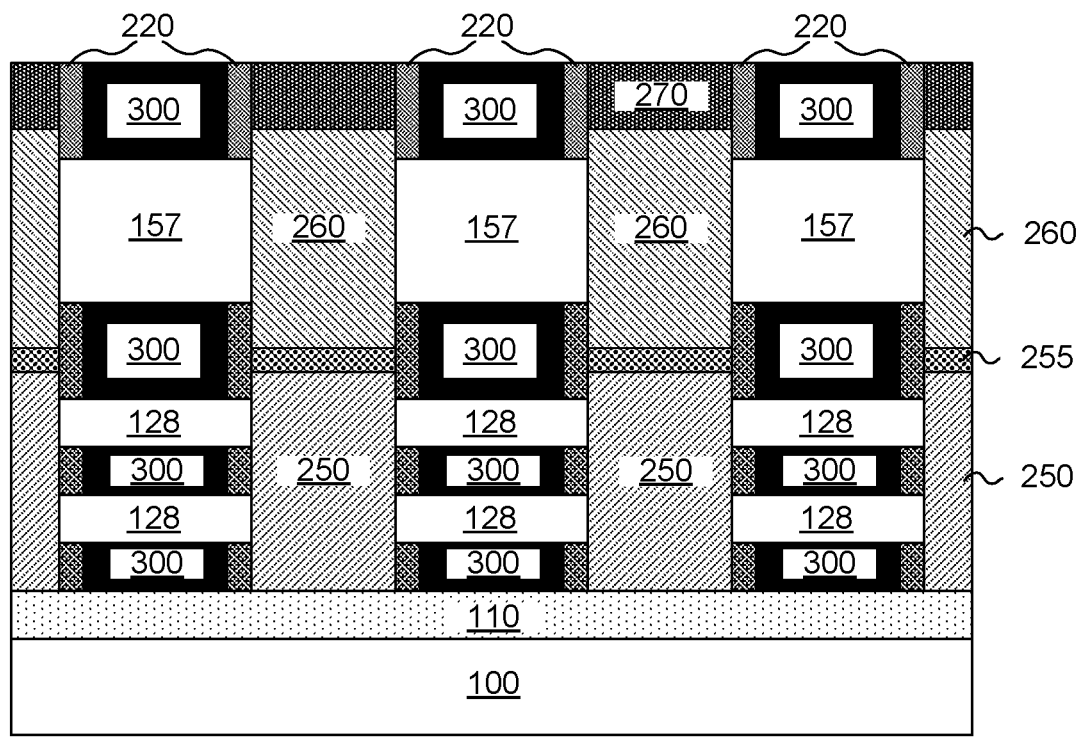
FIG. 17B depicts a cross-sectional view across the y-line in a fin region of the CFET device following RMG and contact formation, according to a first example embodiment.
Figure 17C:
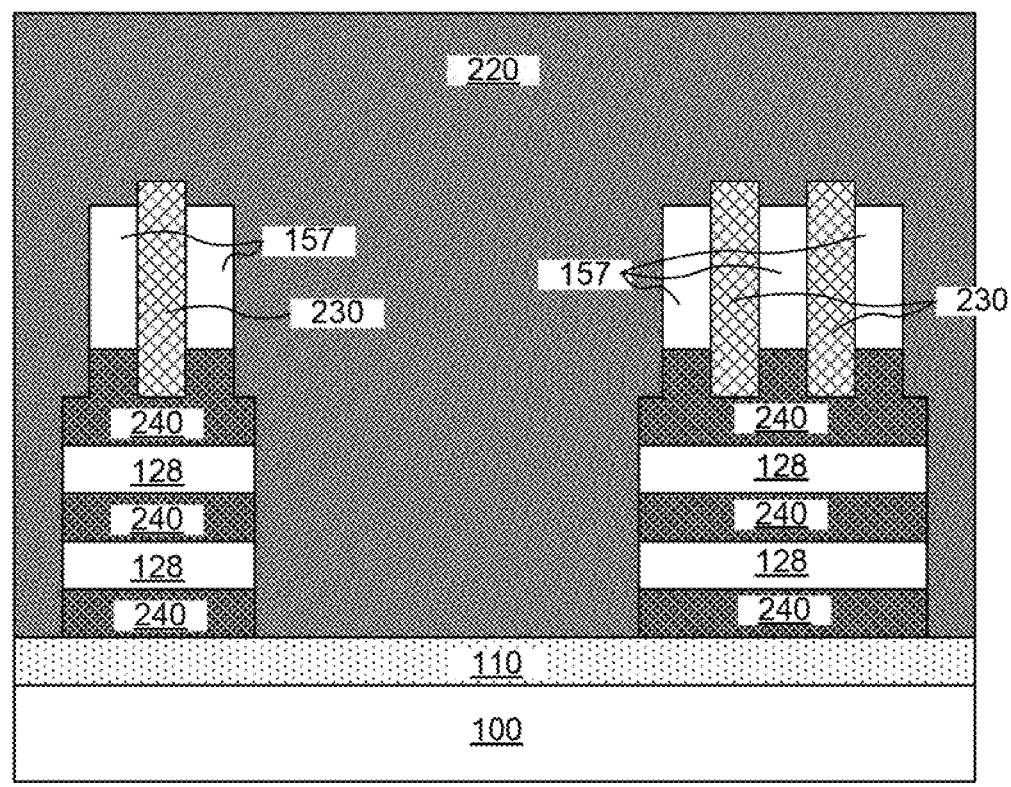
FIG. 17C depicts a cross-sectional view across the z-line in a spacer region of the CFET device following RMG and contact formation, according to a first example embodiment.
Figure 17D:
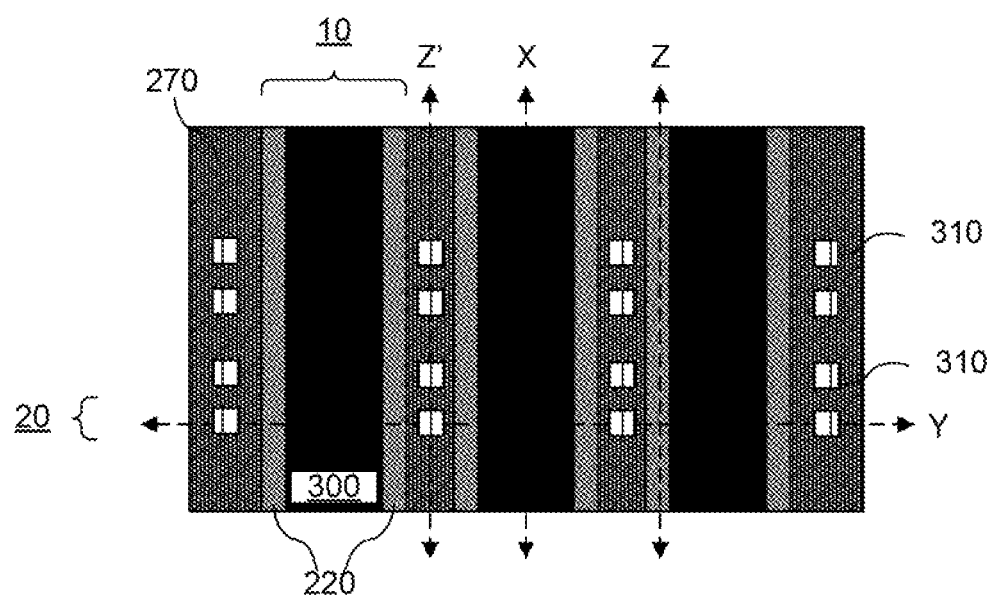
FIG. 17D depicts a top down view depicting the cross-sectional views following RMG and contact formation, according to a first example embodiment.
Figure 17E:
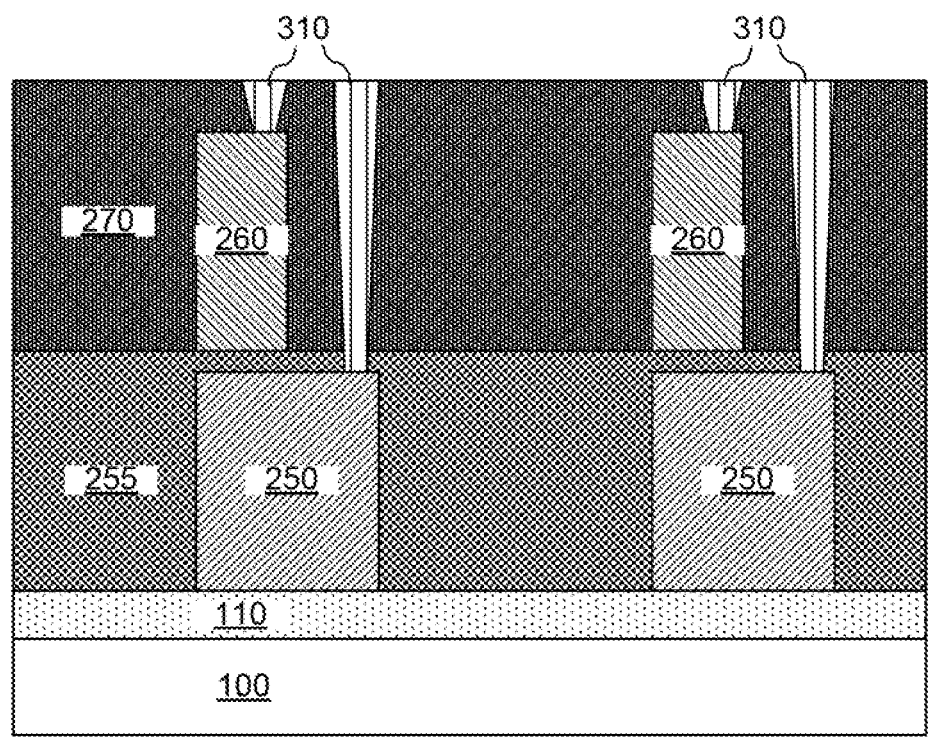
FIG. 17E depicts a cross-sectional view across the z'-line in a source/drain region of the CFET device following RMG and contact formation, according to a first example embodiment.

Referring to FIG. 10A-D depicts removing a portion of the sacrificial liner 170 (e.g. SiGe60) in the gate spacer region forming a void 172 depicted in FIG. 10C, while retaining sacrificial liner 175 in the gate region of the device. The depth of removal of the sacrificial liner 170 should be about 5 to about 10 nm, which will allow for conformal deposition of spacer material to fill the void in subsequent steps.

Referring to FIG. 11A-D depicts depositing a top spacer 230 in between the fins 157. The thickness of the conformal deposition of the material for forming the top spacer 230 should be enough to fill the void 172 created in the previous step. Suitable materials for dielectric spacers 230 include, but are not limited to, SiOx, SiC and/or SiCO. A process such as CVD, ALD or PVD can be employed to deposit the top spacer 230 into void 172 followed by an isotropic etch to remove the conformal deposition layer everywhere except the region pinched-off in previous void 172. The top spacer 230 may have a structural interface that distinguishes it from the previously formed spacer 220. Such an interface may be the result of depositing the spacers in separate steps. Additionally, the top spacer 230 may have a different thickness from the spacer 220, which may be a result of the inexactness of the isotropic etching process to create void 172. Such a process may result in an interface of the spacer with the gate region that is not substantially coplanar to the gate region (as would be the result of the conformal deposition of the previously patterned and anisotropically etched gate region).

Referring to FIG. 12A-D, a pullback of the sacrificial layers 138 (e.g. SiGe30) and the buffer layer 148 (e.g. SiGe30) of the bottom FET of the CFET is performed, creating sacrificial layers 139 and buffer layer 149. A selective etch is performed to recess lower nanosheets 128 exposed along the sidewalls of the nanosheet stack. This recess etch forms pockets along the sidewalls that are then filled with a spacer material. In the embodiment where sacrificial layers 138 and buffer layer 148 are SiGe, a SiGe-selective non-directional (isotropic) etching process can be used for the recess etch.

Referring to FIG. 13A-D, formation of bottom spacers 240 for the bottom FET of the CFET is performed. Suitable materials for bottom spacers 240 include, but are not limited to, SiOx, SiC and/or SiCO. A process such as CVD, ALD or PVD can be employed to deposit the dielectric spacers 230 alongside the sacrificial layers 139 followed by isotropic etch back to remove the spacer liner 240 everywhere except the region where it is pinched-off in region 149 and 139). The bottom spacer 240 may have a structural interface that distinguishes it from the previously formed spacer 220 and top spacer 230. Such an interface may be the result of depositing the spacers in separate steps. Additionally, the bottom spacer 240 may have a different thickness from the spacer 220 and top spacer 230, which may be a result of the inexactness of the selective etching process of the sacrificial layers 138 and buffer layer 148. Such a process may result in an interface of the spacer with the gate region that is not substantially coplanar to the gate region (as would be the result of the conformal deposition of the previously patterned and anisotropically etched gate region).

Referring to FIG. 14A-D, formation and patterning of a bottom source/drain 250, a source/drain isolation layer 255, and a top source/drain 260 is performed. Bottom source/drain 250 are then formed in the trenches on opposite sides of the lower nanosheets 128. See, for example, U.S. Pat. No. 10,418,449 issued to Paul et al., entitled "Circuits Based on Complementary Field-Effect Transistors," the contents of which are incorporated by reference as if fully set forth herein.

According to an example embodiment, lower source/drain are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 240 in place along the sidewall, epitaxial growth of the bottom source/drain 250 and top source/drain 260 is templated from the (exposed) ends of lower nanosheets 128 and fins 155, respectively. As provided above, the lower nanosheets may form a device of a first polarity, i.e., a PFET or an NFET, and the upper nanosheets in the stack may form a device of a second/opposite polarity, i.e., an NFET if the lower device is a PFET, or vice versa. For instance, in one exemplary, non-limiting embodiment the lower nanosheets form a PFET whereby the bottom source/drain 250 contain a p-type dopant, and the upper nanosheets form an NFET whereby the top source/drain 260 contain an n-type dopant.

Namely, according to an example embodiment, a first (n- or p-type) doped epitaxial material is grown in trenches on opposite sides of the channels and then recessed to form the bottom source/drain 250. A directional (anisotropic) etching process such as RIE can be used to recess the bottom source/drain 250.

A spacer material may be deposited into the trenches over the bottom source/drain 250 and then recessed to form the source/drain isolation layer 255. Suitable materials for source/drain isolation layer 255 include, but are not limited to, SiN, SiOx, SiC and/or SiCO. A process such as CVD, ALD or PVD can be employed to deposit the spacer material.

A second (n- or p-type) doped epitaxial material is grown in trenches on opposite sides of the nanosheet stack 30 and on one side of nanosheet stack 31 over source/drain isolation layer 255 and then recessed to form the top source/drain 260. A directional (anisotropic) etching process such as RIE can be used to recess the top source/drain 260.

Referring to FIG. 15A-D, formation of an ILD 270, followed by CMP to remove the dummy gate hardmask 210 and expose the dummy gate 200. Suitable ILD materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide (SiO2) has a dielectric constant κ value of 3.9. Suitable ultralow-κ dielectric materials include, but are not limited to, porous organosilicate glass (pSiCOH). A process such as CVD, ALD or PVD can be employed to deposit ILD 270 around the sacrificial gates 200. Following deposition, ILD 270 can be planarized using a process such as chemical mechanical polishing (CMP) to a height beneath the dummy gate hardmask 210, thereby exposing dummy gate 200.

Referring to FIG. 16A-D, removal of the dummy gate 200, buffer layer 149, and sacrificial layers 139 may occur. Dummy gate 200 may be removed by any suitable etching process known in the art capable of selectively removing the dummy gate 200 without substantially removing material from the surrounding structures. In an example embodiment, the dummy gate 200 may be removed, for example, by a wet etch process capable of selectively removing a-Si. The buffer layer 149 and sacrificial layers 139, now accessible through gate trenches, are then selectively removed. Removal of these nanosheets releases the lower nanosheets 128 and fins 157. Namely, gaps are now present between the lower nanosheets 128 and fins 157 in the channel region of the device. In this example, lower nanosheets 128 and fins 157 will be used to form the channels of the stacked device. The gate trenches and the gaps in the lower nanosheets 128 and fins 157 enable replacement metal gates (RMGs), i.e., including a gate dielectric and at least one workfunction metal, to be formed that fully surround a portion of each of the nanosheet channels in a gate-all-around configuration.

Referring to FIG. 17A-D, formation of the RMG 300 and contacts 310 may occur. The RMG 300 may contain a gate dielectric, a work function metal and a metal contact. A conformal gate dielectric may be deposited into and lining each of the gate trenches and gaps in the channel region of the device. According to an example embodiment, gate dielectric is a high-κ material. The term "high-κ," as used herein, refers to a material having a relative dielectric constant κ which is much higher than that of silicon dioxide (e.g., a dielectric constant κ=25 for hafnium oxide (HfO2) rather than 4 for SiO2). Suitable high-κ gate dielectrics include, but are not limited to, HfO2 and/or lanthanum oxide (La2O3). A process such as CVD, ALD or PVD can be employed to deposit gate dielectric. According to an example embodiment, gate dielectric has a thickness of from about 1 nanometer (nm) to about 5 nm and ranges therebetween. A reliability anneal can be performed following deposition of gate dielectric. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

Still referring to FIG. 17A-D, a first workfunction metal may be deposited into the gate trenches and gaps on the gate dielectric. The first workfunction metal may be conform to the selected polarity of the gate. At this point in the process, the first workfunction metal is disposed on the lower nanosheets 128 as well as the fins 157. However, as will be described in detail below, this first workfunction metal will subsequently be removed from the fins 157 and replaced with a second workfunction metal of the opposite polarity. Namely, if the first workfunction metal is a p-type metal, then the second workfunction metal may be an n-type metal, or vice versa. In yet another embodiment, the first workfunction metal and the second workfunction metal may be the same polarity (both n-type or both p-type).

Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

A process such as CVD, ALD or PVD can be employed to deposit the first workfunction metal. Following deposition, the metal overburden can be removed using a process such as CMP. Further, it is notable that, while the instant example shows first workfunction metal pinching off the gaps between the lower nanosheets 131 and 133 other workfunction metal configurations are also contemplated herein such as the first and/or second workfunction metals being composed of multiple metals and/or multiple layers of metals.

To remove the first workfunction metal from the fins 157, the first workfunction metal and gate dielectric are first recessed in the gate trenches. To do so a planarizing material such as an OPL material is deposited over the device structure and into the gate trenches, and then recessed. A casting process such as spin coating or spray casting can be employed to deposit the planarizing material. A directional (anisotropic) etching process such as RIE can be used to recess the planarizing material. The first workfunction metal and gate dielectric are then recessed (e.g., using an anisotropic etching process such as RIE) down to the (recessed) planarizing material. The planarizing material is removed. By way of example only, an OPL planarizing material can be removed using a process such as ashing.

The first workfunction metal is then removed from the fins 157. A recess etch is used to remove the first workfunction metal from the fins 157. A block mask is used to cover/mask the first workfunction metal disposed on the lower nanosheets 128.

According to an example embodiment, the recess etch of the first workfunction metal is performed using a non-directional (isotropic) metal-selective etching process. For instance, an SC1 wet clean (e.g., hydrofluoric acid (HF) and a hydrogen peroxide (H2O2): ammonium hydroxide (NH4OH) mixture) can be employed to recess the workfunction metal selective to the gate dielectric.

Removal of the first workfunction metal from the fins 157 reopens the gate trenches and gaps in the fins 157. A second workfunction metal may be deposited into the gate trenches and gaps on the gate dielectric. The second workfunction metal may be selected as a suitable n-type or p-type material based on the desired device characteristics. Suitable n-type workfunction metals and p-type workfunction metals were provided above.

A process such as CVD, ALD or PVD can be employed to deposit the second workfunction metal. Following deposition, the metal overburden can be removed using a process such as CMP. Further, it is notable that, while the instant example shows second workfunction metal pinching off the gaps between the fins 157 other workfunction metal configurations are also contemplated herein such as the first and/or second workfunction metals being composed of multiple metals and/or multiple layers of metals. As shown in FIG. 26, following deposition the second workfunction metal is recessed in the gate trenches. The process for recessing the workfunction metal in this manner, i.e., using a planarizing material such as an OPL, was described above.

A low-resistivity gate fill metal may be deposited into the gate trenches over the second workfunction metal and recessed. Suitable low-resistivity gate fill metals include, but are not limited to, TiN and/or W. A process such as CVD, ALD or PVD can be employed to deposit the low-resistivity gate fill metal into the gate trenches.

Contacts 310 may be formed using a damascene process, sidewall image process, or any other process capable of precisely forming a trench above the desired contact. Following trench formation, the trench may be filled with a conductive material, such as copper, as well as any seed materials or liners that may aid in adhesion/conduction, thereby forming contacts 310.

Figure 18:
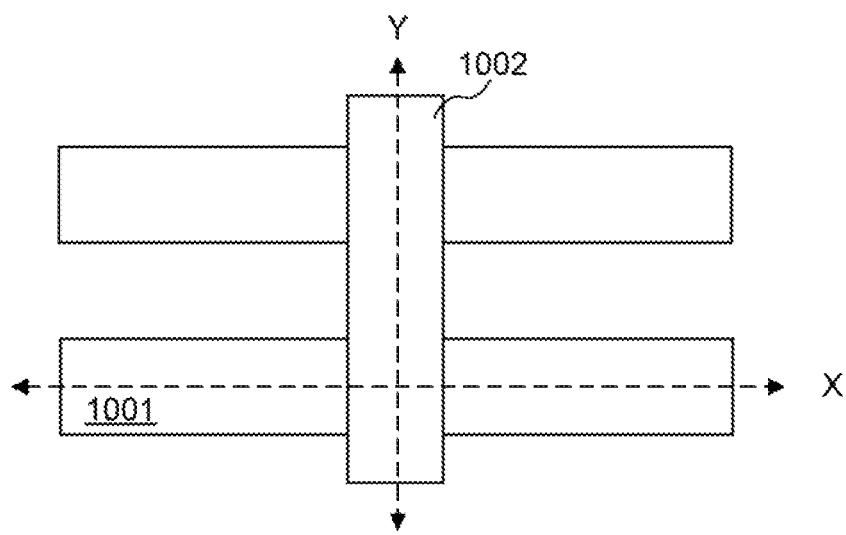
FIG. 18 depicts a top down view of a fin region and gate region showing cross sections across each region, according to a second example embodiment.

Referring to FIG. 18 depicts a top down view of a fin region 1001 and gate region 1002, showing x and y cross sections across each region for FIG. 19-30. A cross-sectional x-line across the gate region 1002 may be used to show the structures located in the gate region 1002 during each step. A cross-sectional y-line across the fin region 1001 may be used to show the structures located along each transistor device during each step.

Figure 19:
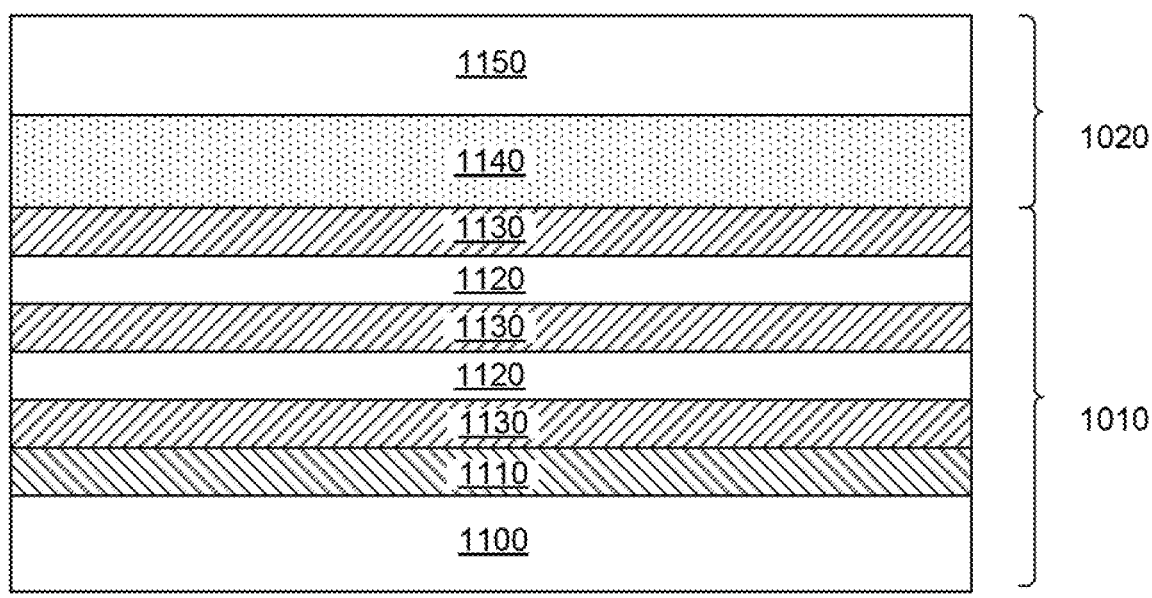
FIG. 19 depicts a layered structure, according to a second example embodiment.

Referring to FIG. 19 depicts a layered structure, according to a second example embodiment. The layered structure includes a substrate 1100, a first sacrificial layer 1110, a bottom semiconductor nanosheet 1120, a sacrificial nanosheet 1130, an oxide layer 1140, and a top semiconductor layer 1150. The layered structure may be formed by bonding a SOI structure having an oxide box layer 1140 and the top semiconductor layer 1150 to the layered structure including the base substrate 1100, the first sacrificial layer 1110, the bottom semiconductor nanosheet 1120, and the sacrificial nanosheets 1130.

According to an example embodiment, base substrate 1100 of a first substrate 1010 can be a bulk semiconductor wafer such as a silicon (Si), germanium (Ge), and/or III-V semiconductor wafer. The first sacrificial layer 1110, the bottom semiconductor nanosheet 1120, and the sacrificial nanosheets 1130 may be epitaxially deposited, forming first substrate 1010, according to the steps outlined below.

According to an example embodiment, substrate 1020 has is a semiconductor, such as a silicon (Si), germanium (Ge), and/or III-V semiconductor wafer having an oxide layer 1140, forming by oxidizing the Si substrate 1150.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

Generally, the material stack located above the base substrate includes bottom semiconductor nanosheets 1120 separated by sacrificial nanosheets 1130, located on first sacrificial nanosheet 1110. By 'sacrificial' it is meant that the layer, or portion thereof, is removed during fabrication of the device. By way of example only, each of the nanosheets 1110, 1120, and 1130 in the material stack are deposited onto the base substrate 1100, one on top of the other, using an epitaxial growth process. According to an example embodiment, each of the nanosheets 1110, 1120, and 1130 in the material stack has a thickness of from about 10 nanometers (nm) to about 25 nm and ranges therebetween. Following the deposition of the material stack to form the first substrate 1010, the first substrate 1010 is bonded to the second substrate 1020, and top portion of the 1150 is split and removed.

The lower nanosheets include alternating layers of a bottom semiconductor nanosheet 1120 and a sacrificial nanosheets 1130. For instance, according to an example embodiment, the bottom semiconductor nanosheet 1120 is Si, and the sacrificial nanosheets 1130 is SiGe. However, this is merely an example and other configurations are contemplated herein. Additionally, while there are two nanosheets for the bottom semiconductor nanosheet 1120, additional nanosheets are contemplated. For instance, in an alternative embodiment, the first nanosheet material is SiGe while the second nanosheet material is Si. As will be described in detail below, these nanosheet materials will be used to form the channels of the present stacked nanosheet devices and a sacrificial material in between the channels. Removal of the sacrificial material releases the channels from the stack and permits gates to be formed that fully surround the channels in a gate-all-around configuration. Thus, it is preferable that the first and second nanosheet materials have etch selectivity with respect to one another. Thus, when one serves as the channels, the other sacrificial material can be selectively removed to release the channels from the stack. By way of example only, Si and SiGe provide such etch selectivity. Additionally, the first sacrificial nanosheet 1110 may be selected for selectivity with respect to the bottom semiconductor nanosheet 1120 and the sacrificial nanosheets 1130.

According to an example embodiment, sacrificial nanosheets 1110 is formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, sacrificial nanosheet 1110 is SiGe60 (which has a Ge content of about 60%). Use of a higher Ge content SiGe will enable the sacrificial nanosheets 1110 to be etched selective to the lnanosheets 1120 and sacrificial layer 1130, as provided above, can be formed from Si and/or SiGe30. Notably, however, the SiGe used as sacrificial material 1130 has a low Ge content. For example, in one exemplary embodiment, a low Ge content is from about 20% Ge to about 50% Ge and ranges therebetween. For instance, in one non-limiting example, bottom semiconductor nanosheet 1120 and upper semiconductor layer 1150 are formed from Si.

Figure 20A:
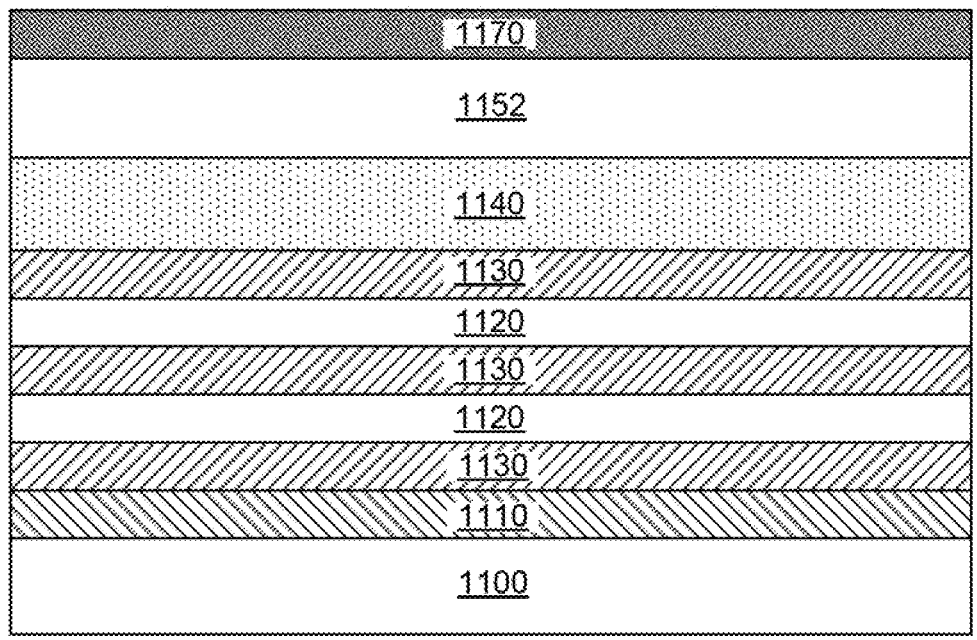
FIG. 20A depicts a cross-sectional view across the x-line in a fin region of the CFET device following patterning of vertical channels in a top FET of a CFET structure, according to a second example embodiment.
Figure 20B:
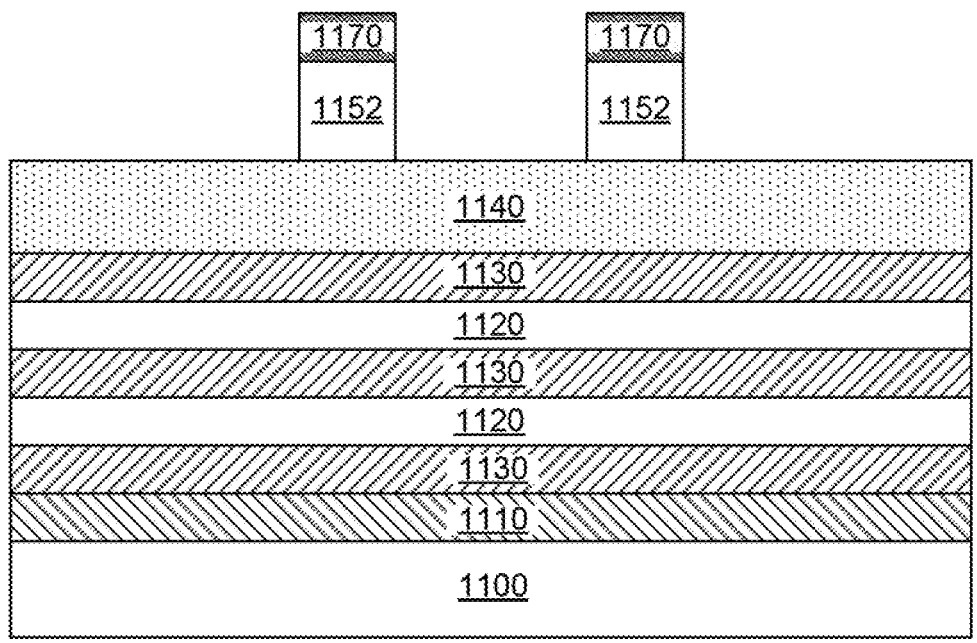
FIG. 20B depicts a cross-sectional view across the y-line in a gate region of the CFET device following patterning of vertical channels in a top FET of a CFET structure, according to a second example embodiment.

Referring to FIGS. 20A (X-cut) & B (Y-cut), formation of a hardmask 1170 on the surface of the top semiconductor layer 1150 and vertical channels 1152 from the top semiconductor layer 1150 may occur. A hardmask 1170 is then formed on the material stack. Suitable materials for the hardmask 1170 include, but are not limited to, nitride materials such as silicon nitride (SixNy), silicon oxynitride (SiON), and/or silicon carbonide nitride (SiCN), and/or oxide materials such as silicon oxide (SiOx). The vertical channels 1152 may be patterned using a sidewall image transfer technique formed on the hardmask 1170 and etched to the oxide layer 1140.

Figure 21A:
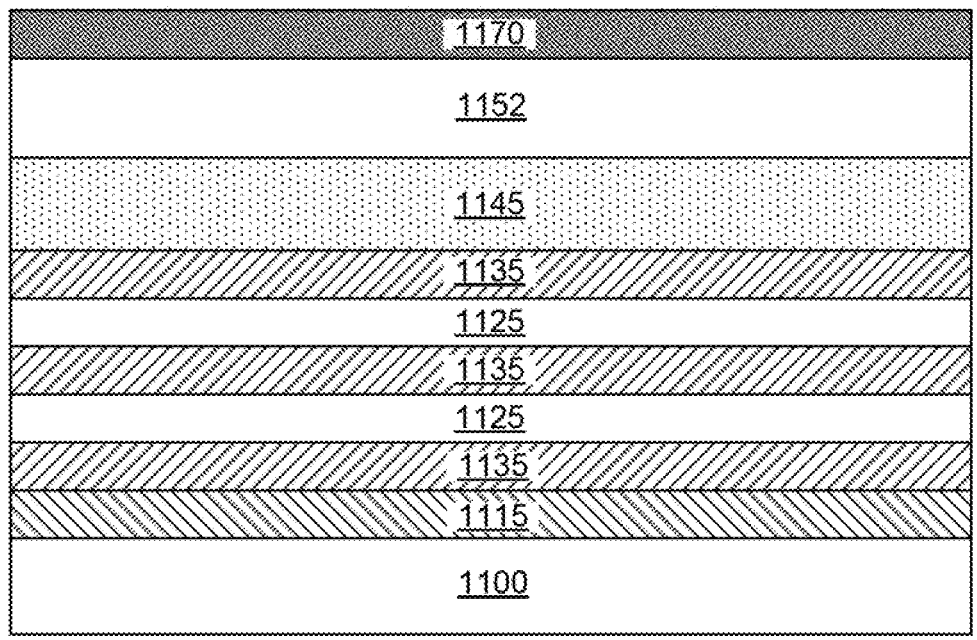
FIG. 21A depicts a cross-sectional view across the x-line in a fin region of the CFET device following patterning a self-aligned spacer and patterning of the bottom FET of the CFET structure using the self-aligned spacer and formation of the STI, according to a second example embodiment.
Figure 21B:
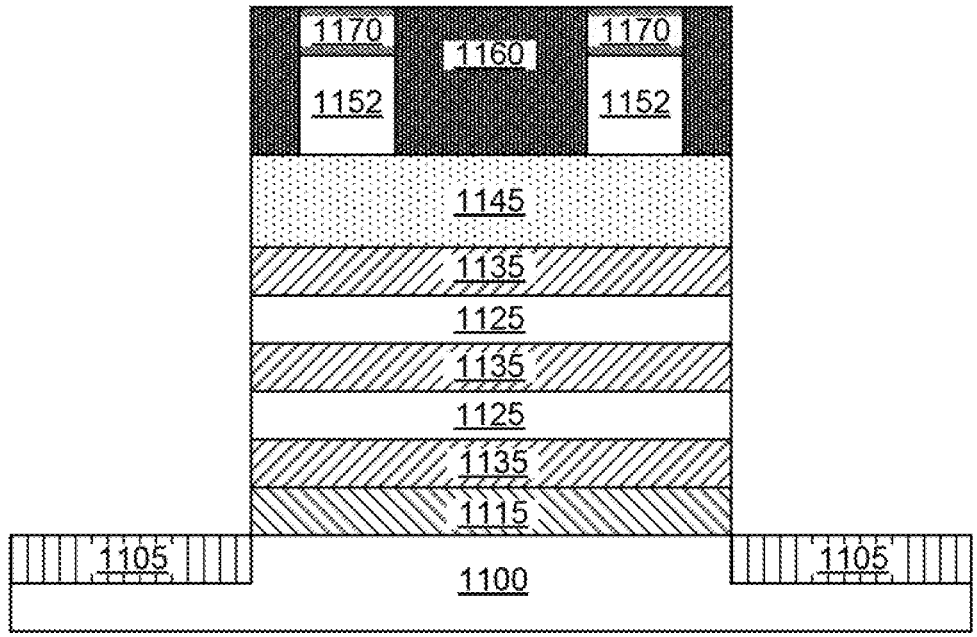
FIG. 21B depicts a cross-sectional view across the y-line in a gate region of the CFET device following patterning a self-aligned spacer and patterning of the bottom FET of the CFET structure using the self-aligned spacer and formation of the STI, according to a second example embodiment.

Referring to FIGS. 21A & B, formation of a hardmask pattern 1160 and removing unpatterned material, to create the footprint of the nanosheet device, and formation of the STI 1105 may occur. Following the removal of unpatterned material, a first sacrificial layer 1115, a bottom semiconductor nanosheet 1125, a second sacrificial layer 1135, and an oxide layer 1145 may remain. A hardmask pattern 1160 is then formed on the material stack. Suitable materials for the hardmask pattern 1160 include, but are not limited to, nitride materials such as silicon nitride (SixNy), silicon oxynitride (SiON), and/or silicon carbonide nitride (SiCN), and/or oxide materials such as silicon oxide (SiOx). The hardmask pattern may define the width of the device, and the pattern may be transferred into base substrate 1100.

Shallow trench isolation (STI) regions 1105 are then formed in the base substrate 1000. According to an example embodiment, STI regions 1105 may be formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

Figure 22A:
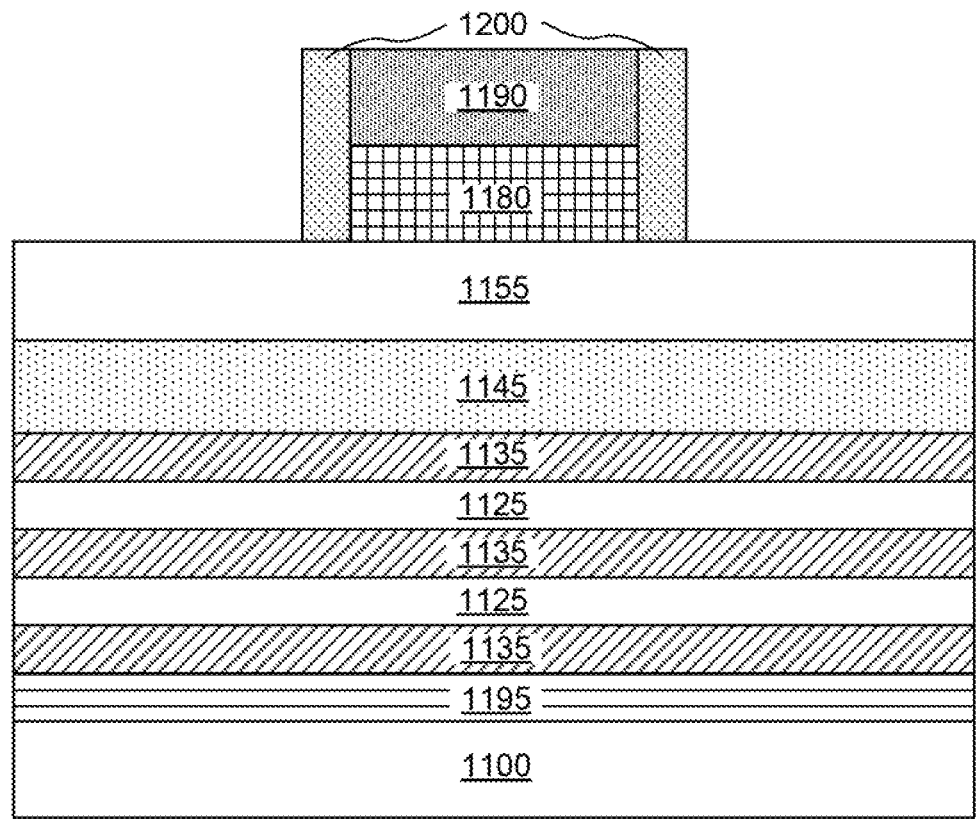
FIG. 22A depicts a cross-sectional view across the x-line in a fin region of the CFET device following removal of the self-aligned spacer, bottom sacrificial layer and deposition of a bottom dielectric layer, according to a second example embodiment.
Figure 22B:
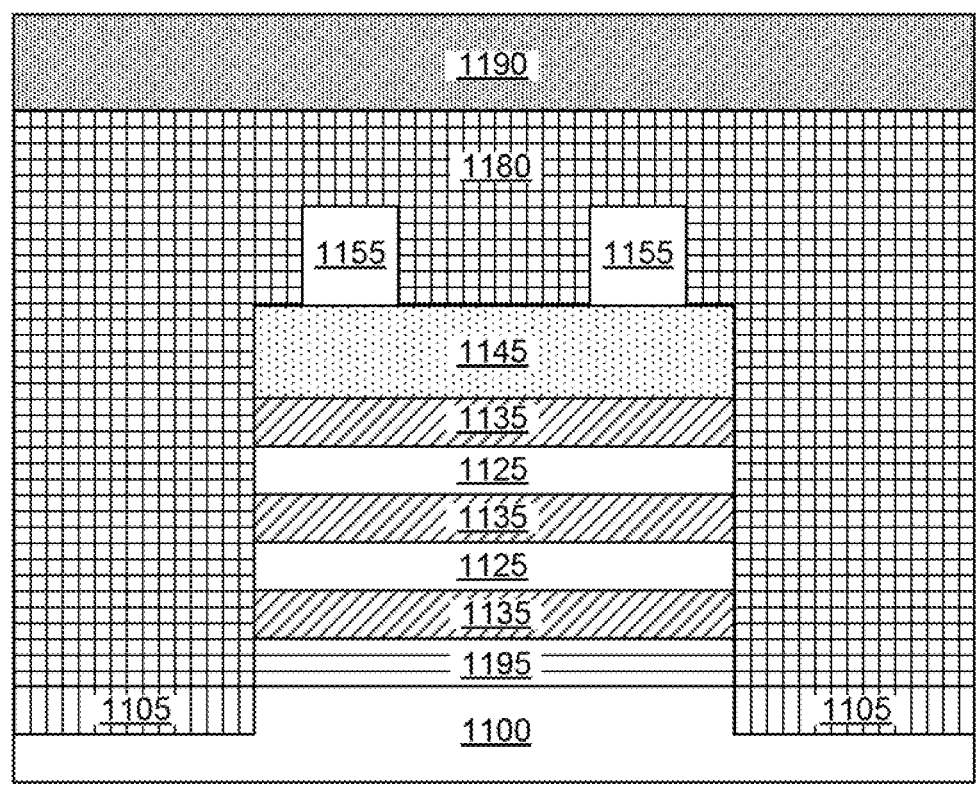
FIG. 22B depicts a cross-sectional view across the y-line in a gate region of the CFET device following removal of the self-aligned spacer, bottom sacrificial layer and deposition of a bottom dielectric layer, according to a second example embodiment.

Referring to FIGS. 22A & B, the hardmask pattern 1160 and 1170 may be removed, and a dummy gate 1180, hardmask 1190, and top spacer 1200 may formed. Additionally, the first sacrificial layer 1115 may be removed and replaced with an isolation layer 1195. To form dummy gate 1180, a sacrificial gate material is first blanket deposited over the structure of FIGS. 21A & B. Suitable sacrificial gate materials include, but are not limited to, a thin layer of SiO2 followed by ploy-silicon (poly-Si) and/or amorphous silicon (a-Si). A process such as CVD, ALD or PVD can be employed to deposit the sacrificial gate material.

Dummy gate 1180 serve as a placeholder for the final gates of the stacked nanosheet device. Namely, dummy gate 1180 will be removed later in the process and replaced with metal gate stacks that will serve as the final gates of the stacked nanosheet device. Thus, these final gates of the stacked nanosheet device are also referred to herein as "replacement metal gates" or simply "RMG." Use of an RMG process is advantageous because it prevents exposure of the metal gate stack materials to potentially damaging conditions during subsequent processing steps. For instance, the high-κ dielectrics used in the RMG gate stacks can be damaged by exposure to high temperatures. Thus, these gate stack materials are only placed near the end of the process.

Hardmask 1190 are then formed on the sacrificial gate material marking the footprint and location of each of the dummy gate 1180. Suitable materials for the hardmask 1190 include, but are not limited to, nitride hardmask materials such as SiN, SiON and/or SiCN, and/or oxide hardmask materials such as SiOx. An etch using the hardmask 1190 is then used to pattern the sacrificial gate material into the individual dummy gate 1180 shown in FIGS. 22A & B. A directional (anisotropic) etching process such as RIE can be employed for the sacrificial gate etch. After gate etch, the first sacrificial layer 1115 is removed, by any suitable isotropic etch which removes the first sacrificial layer 1115 selective to surrounding layers, forming a cavity under the stack 1010.

Top spacer 1200 may be formed by a conformal deposition followed by a reactive ion etch (RIE). Top spacer 1200 may be formed of any suitable dielectric material. The conformal deposition of the top spacer also fills the said cavity created by removing the first sacrificial layer 1115, forming bottom dielectric isolation 1195.

Figure 23A:
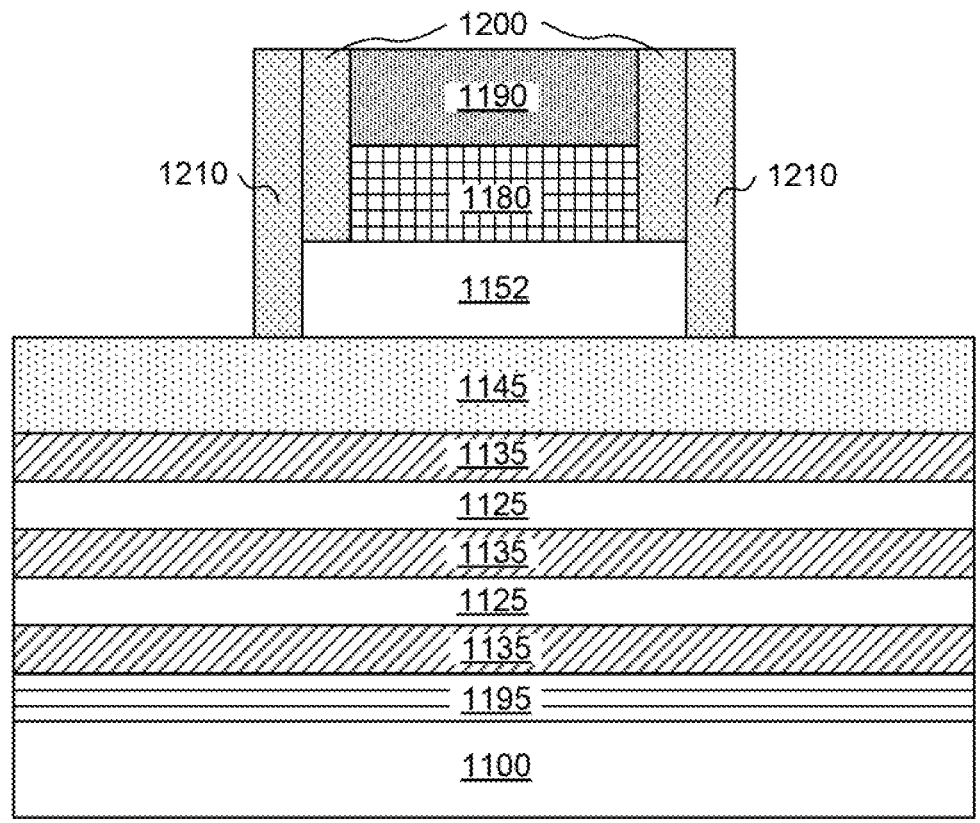
FIG. 23A depicts a cross-sectional view across the x-line in a fin region of the CFET device following dummy gate formation, channel formation of the upper FET of the CFET and a protective spacer, according to a second example embodiment.
Figure 23B:
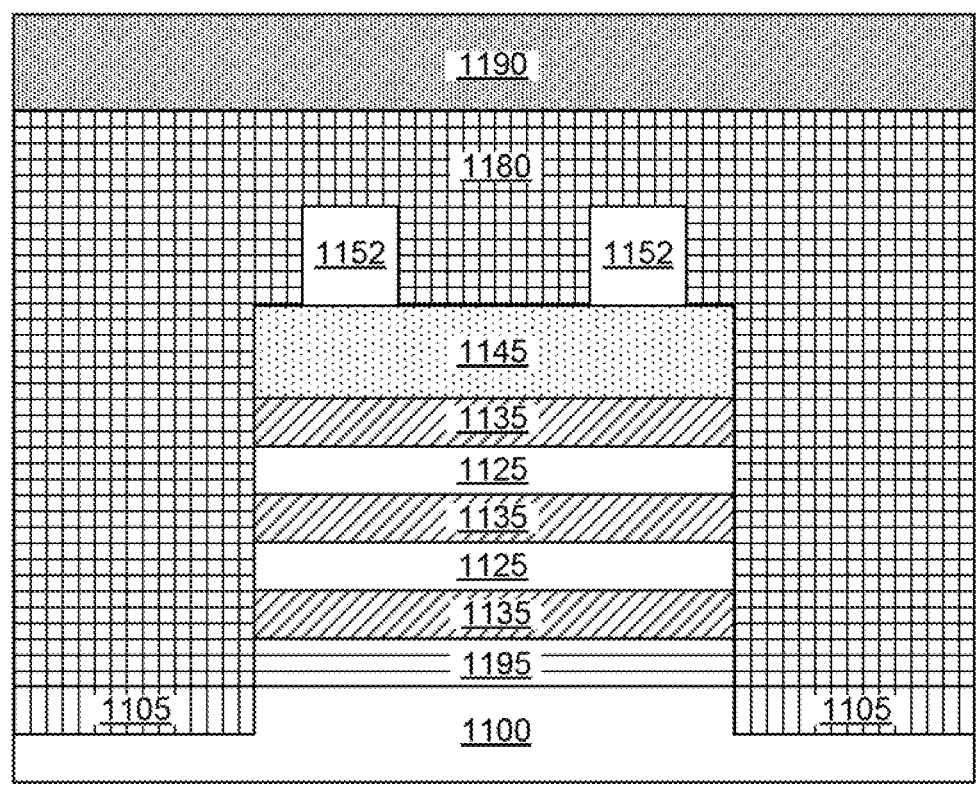
FIG. 23B depicts a cross-sectional view across the y-line in a gate region of the CFET device following dummy gate formation, channel formation of the upper FET of the CFET and a protective spacer, according to a second example embodiment.

Referring to FIGS. 23A & B, the vertical channels 1152 may be formed into top channels 1155 (FIGS. 22A & B), and a sacrificial top spacer 1210 may be formed. The top spacer 1200 may be used to define the footprint of the top device 1152. Formation of the vertical channels 1152 may be performed using an anisotropic etch, such as a RIE, with the top spacer 1200 acting as a mask for the etch. Following formation of the vertical channels 1152 a sacrificial top spacer 1210 may be formed by conformal deposition of the material followed by a RIE etch. Sacrificial top spacer 1210 may be formed of any material capable of being selectively removed from the structure.

Figure 24A:
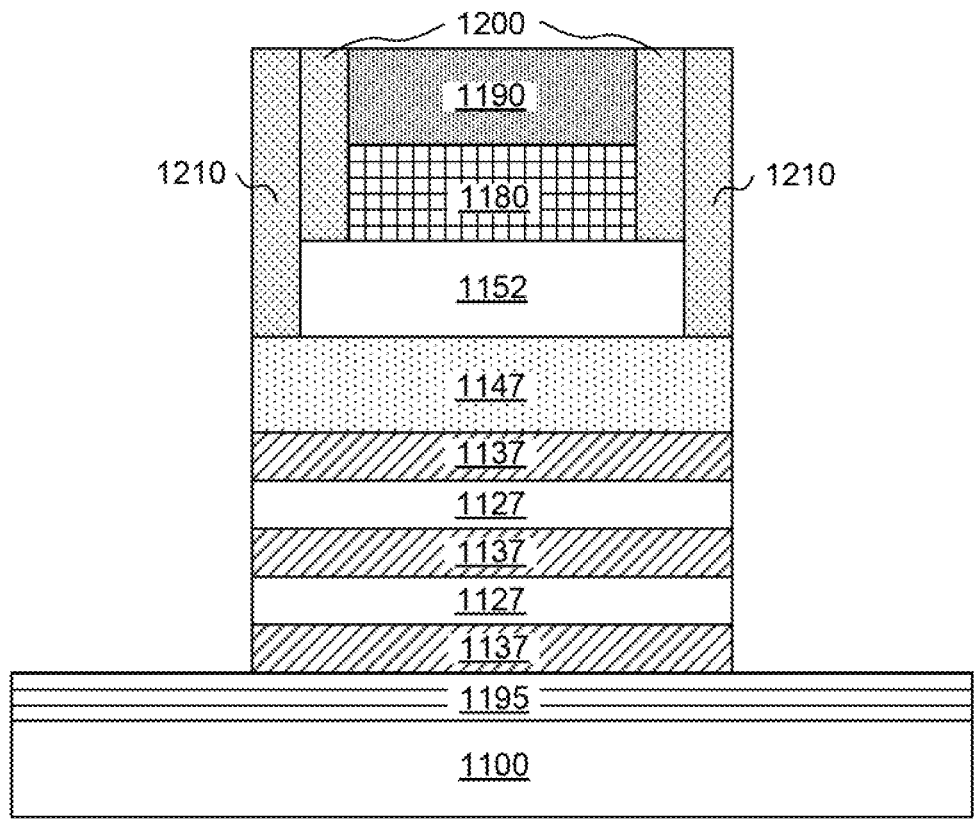
FIG. 24A depicts a cross-sectional view across the x-line in a fin region of the CFET device following channel formation of the bottom FET of the CFET, according to a second example embodiment.
Figure 24B:
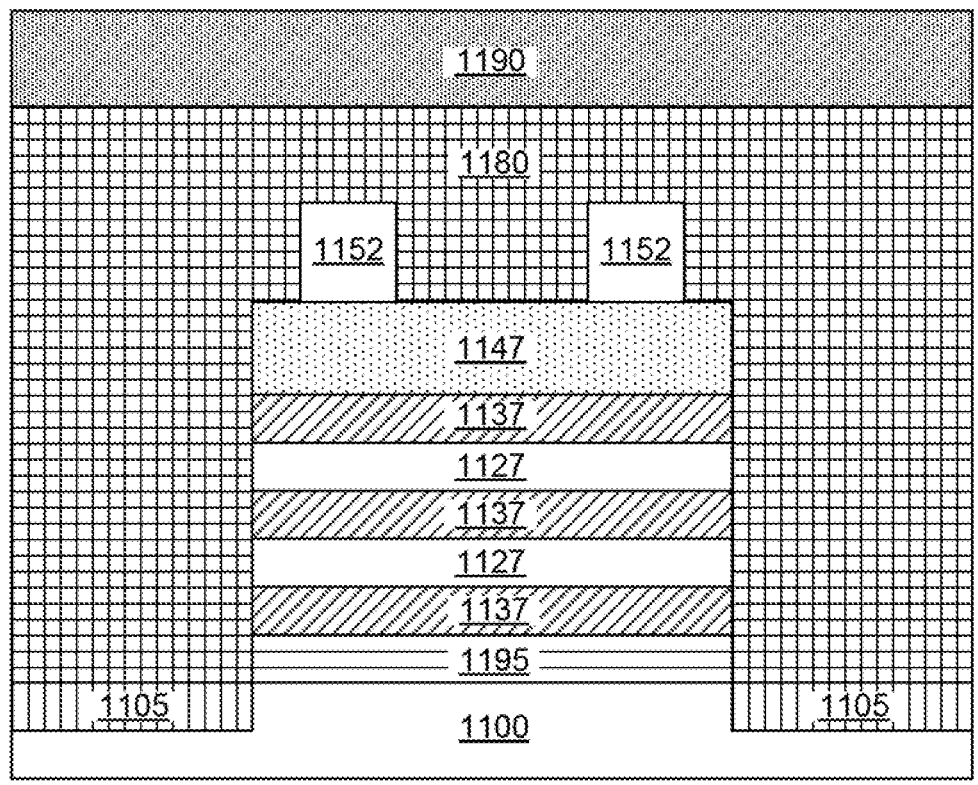
FIG. 24B depicts a cross-sectional view across the y-line in a gate region of the CFET device following channel formation of the bottom FET of the CFET, according to a second example embodiment.

Referring to FIGS. 24A & B, the channel region of the bottom FET may be formed based on the pattern of the sacrificial top spacer 1210. Following the formation of the channel region of the bottom FET, bottom channels 1127, second sacrificial layers 1137, and an oxide layer 1147 may result. The sacrificial top spacer 1210 may be used to define the footprint of the bottom semiconductor nanosheets 1125.

Figure 25A:
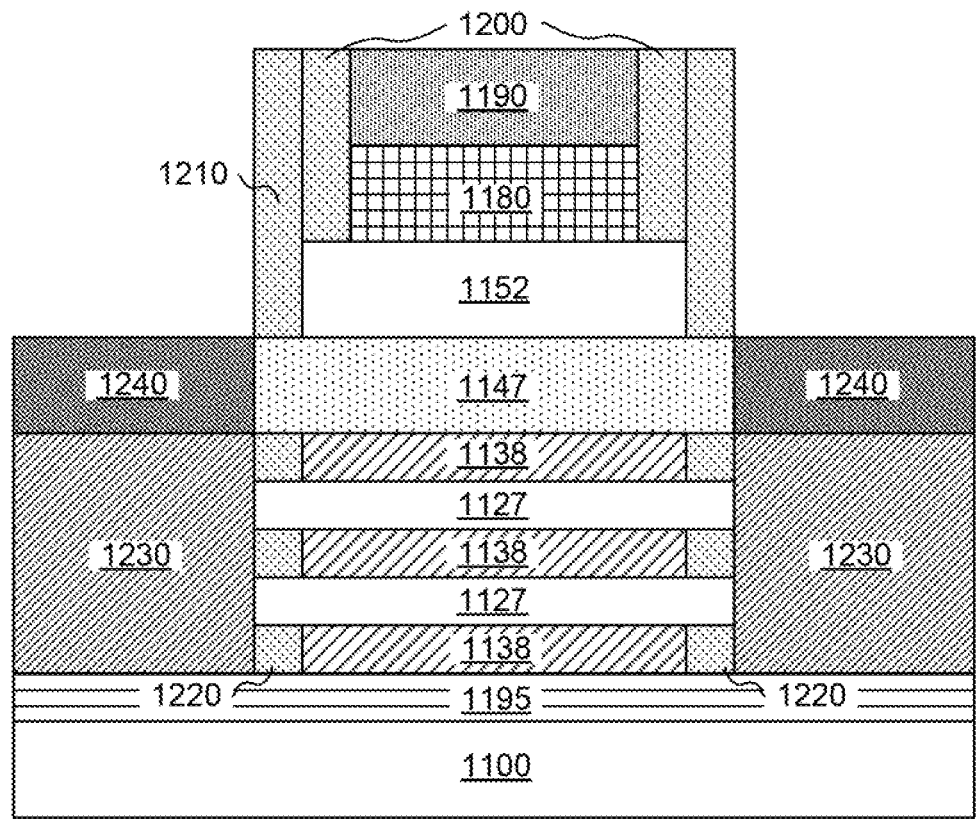
FIG. 25A depicts a cross-sectional view across the x-line in a fin region of the CFET device following source/drain formation on the bottom FET of the CFET and an isolation layer, according to a second example embodiment.
Figure 25B:
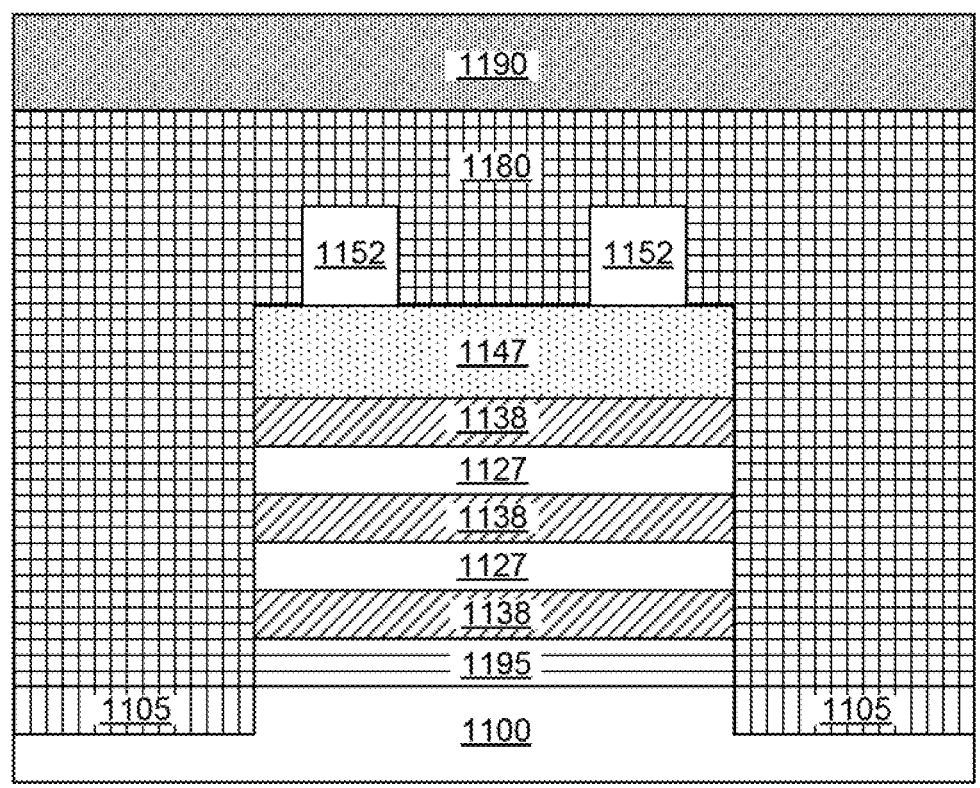
FIG. 25B depicts a cross-sectional view across the y-line in a gate region of the CFET device following source/drain formation on the bottom FET of the CFET and an isolation layer, according to a second example embodiment.

Referring to FIGS. 25A & B, second sacrificial layers 1137 may be pulled back to form second sacrificial layers 1138, and a bottom spacer 1220 may be formed. Additionally, a bottom source/drain 1230 and a source/drain isolation layer 1240 may be formed. A selective etch is performed to recess second sacrificial layers 1137 exposed along the sidewalls of the nanosheet stack. This recess etch forms pockets along the sidewalls that are then filled with a spacer material. In the embodiment where second sacrificial layers 1138 are SiGe30, a SiGe-selective non-directional (isotropic) etching process can be used for the recess etch. Formation of bottom spacers 1220 for the bottom FET of the CFET is performed. Suitable materials for bottom spacers 1220 include, but are not limited to, SiOx, SiC and/or SiCO. A process such as CVD, ALD or PVD can be employed to deposit the bottom spacers 1220 alongside the second sacrificial layers 1138, followed by isotropic etching of the bottom spacers 1220 everywhere except the region pinched-off in the said recess.

According to an example embodiment, lower source/drain are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With sacrificial spacer 1210 in place along the sidewall of vertical channel 1152, epitaxial growth of the bottom source/drain 1230 is templated from the (exposed) ends of bottom channels 1127. As provided above, the lower nanosheets may form a device of a first polarity, i.e., a PFET or an NFET, and the upper nanosheets in the stack may form a device of a second/opposite polarity, i.e., an NFET if the lower device is a PFET, or vice versa. For instance, in one exemplary, non-limiting embodiment the lower nanosheets form a PFET whereby the bottom source/drain 1230 contain a p-type dopant, and the upper nanosheets form an NFET whereby the top source/drain 1250 contain an n-type dopant.

Namely, according to an example embodiment, a first (n- or p-type) doped epitaxial material is grown in trenches on opposite sides of the channels and then recessed to form the bottom source/drain 1230. A directional (anisotropic) etching process such as RIE can be used to recess the bottom source/drain 1230.

A spacer material may be deposited into the trenches over the bottom source/drain 1230 and then recessed to form the bottom spacer 1220. Suitable materials for bottom spacer 1220 include, but are not limited to, SiN, SiOx, SiC and/or SiCO. A process such as CVD, ALD or PVD can be employed to deposit the spacer material.

Figure 26A:
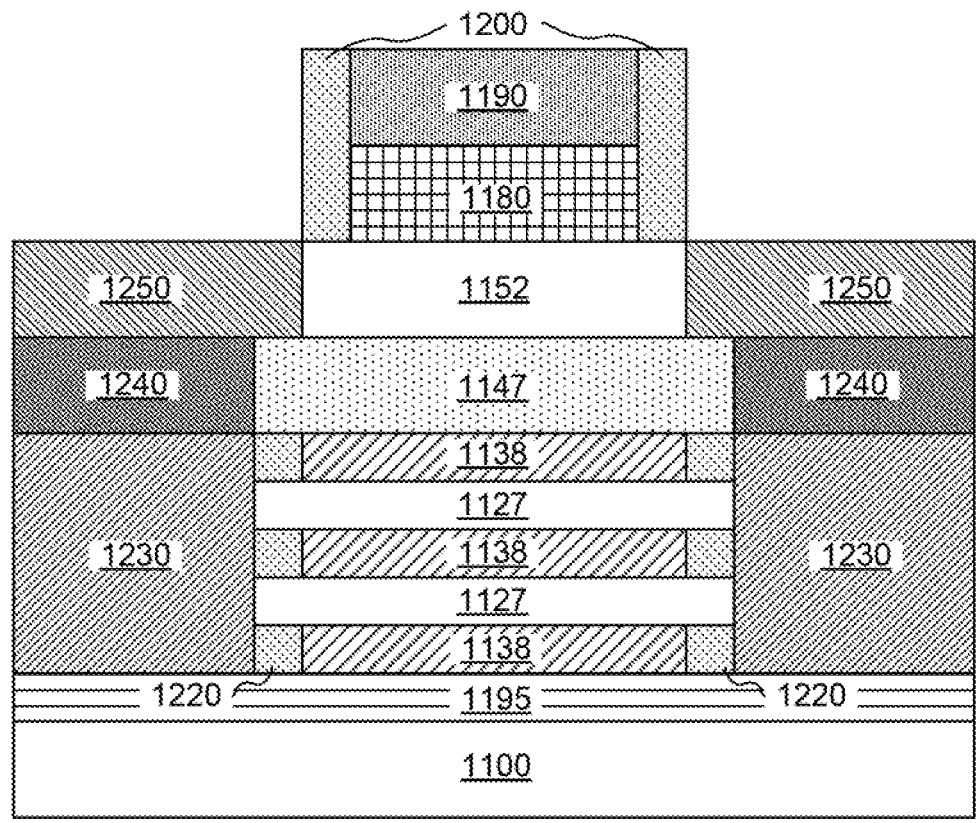
FIG. 26A depicts a cross-sectional view across the x-line in a fin region of the CFET device following formation source/drain formation on the top FET of the CFET, according to a second example embodiment.
Figure 26B:
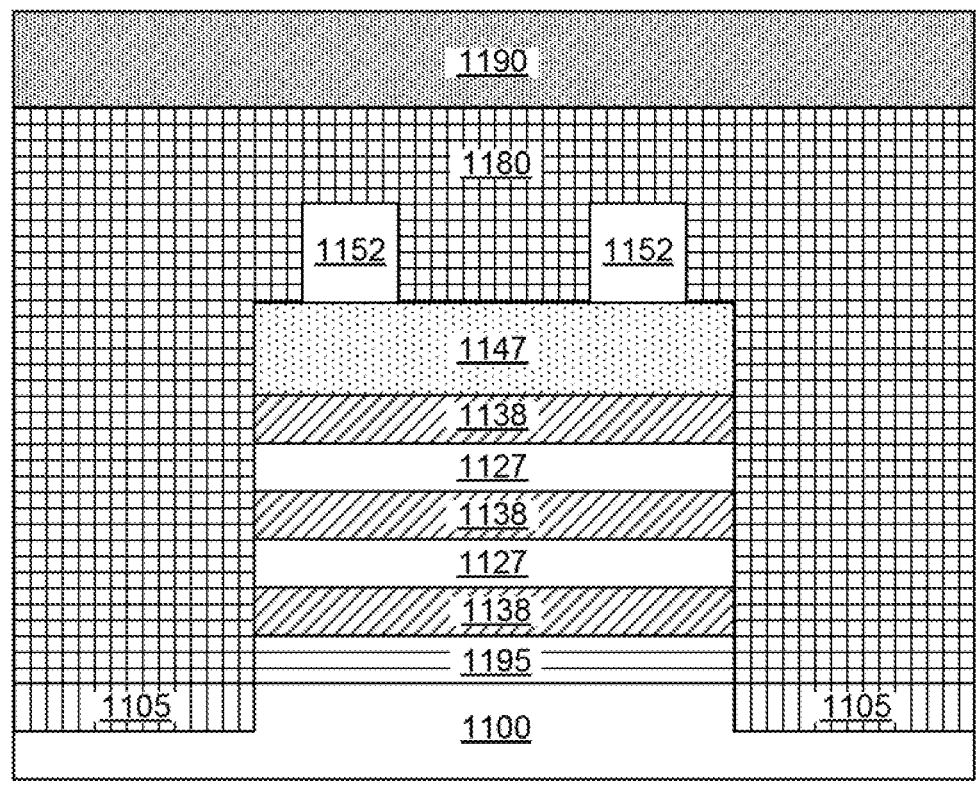
FIG. 26B depicts a cross-sectional view across the y-line in a gate region of the CFET device following source/drain formation on the top FET of the CFET, according to a second example embodiment.

Referring to FIGS. 26A & B, the sacrificial spacer 1210 may be removed, and a top source/drain 1250 may be formed. The sacrificial spacer 1210 may be removed using any process capable of selectively removing the material with respect to the other materials of the structure, thereby exposing vertical channel 1152. A second (n- or p-type) doped epitaxial material is grown in trenches on opposite sides of the vertical channel over source/drain isolation layer 255 and then recessed to form the top source/drain 260. A directional (anisotropic) etching process such as RIE can be used to recess the top source/drain 260.

Figure 27A:
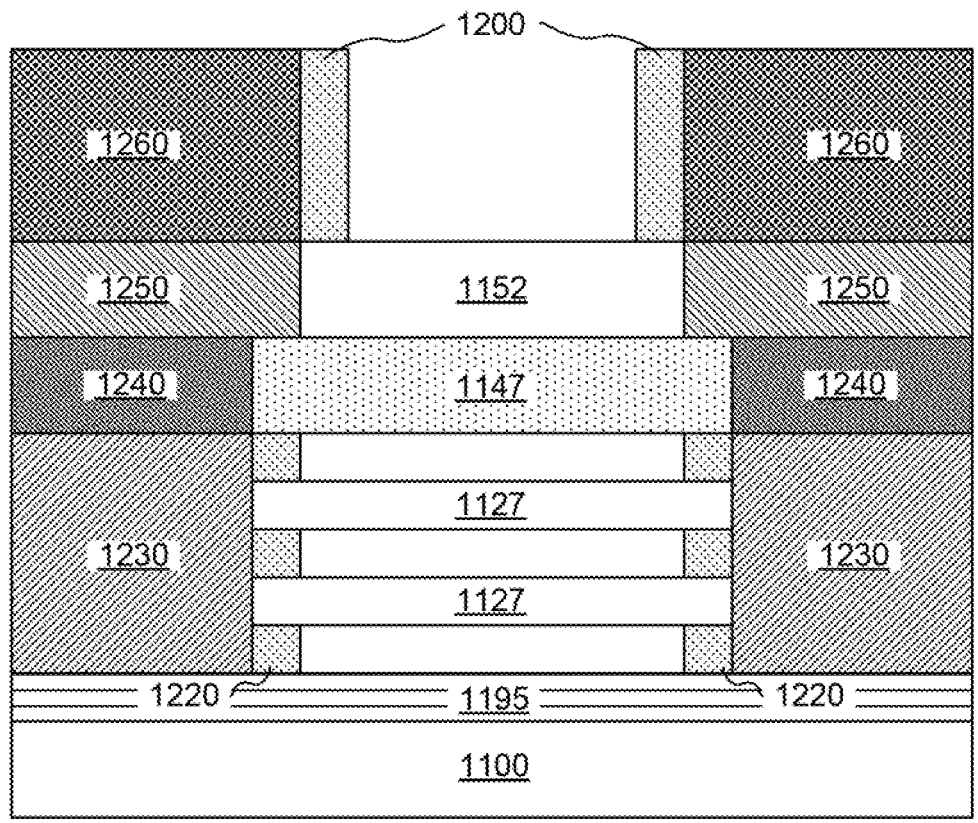
FIG. 27A depicts a cross-sectional view across the x-line in a fin region of the CFET device following ILD formation, dummy gate removal and sacrificial layer release, according to a second example embodiment.
Figure 27B:
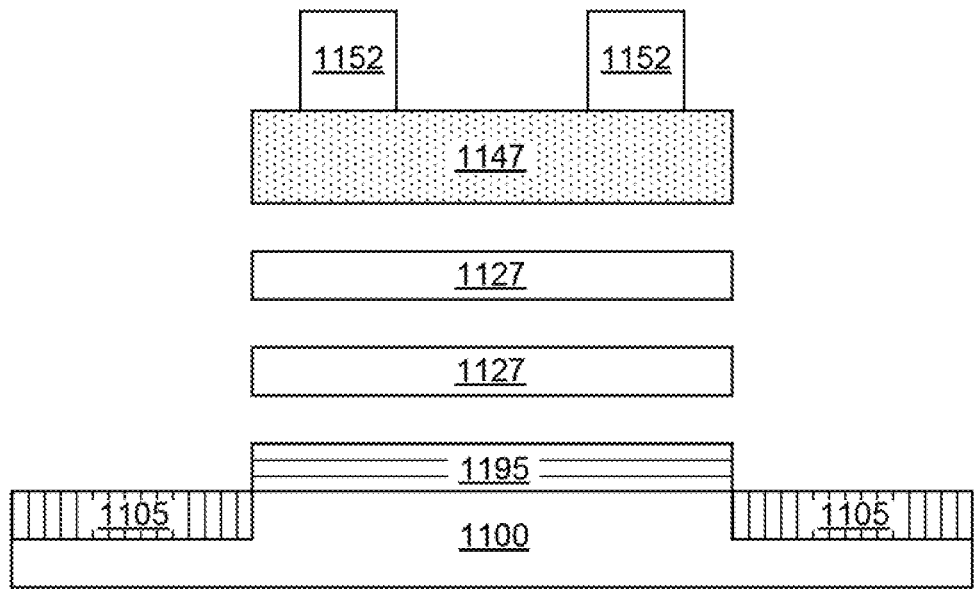
FIG. 27B depicts a cross-sectional view across the y-line in a gate region of the CFET device following ILD formation, dummy gate removal and sacrificial layer release, according to a second example embodiment.

Referring to FIGS. 27A & B, formation of ILD 1260, removal of the hardmask 1190, dummy gate 1180, and the second sacrificial layers 1138 may occur. Suitable ILD materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide (SiO2) has a dielectric constant κ value of 3.9. Suitable ultralow-κ dielectric materials include, but are not limited to, porous organosilicate glass (pSiCOH). A process such as CVD, ALD or PVD can be employed to deposit ILD 1260 around the sacrificial gates 200. Following deposition, ILD 1260 can be planarized using a process such as chemical mechanical polishing (CMP) to a height beneath the hardmask 1190, thereby exposing dummy gate 1180.

Removal of the dummy gate 1180 and sacrificial layers 1138 may occur. Dummy gate 1180 may be removed by any suitable etching process known in the art capable of selectively removing the dummy gate 1180 without substantially removing material from the surrounding structures. In an example embodiment, the dummy gate 1180 may be removed, for example, by an isotropic wet etch process capable of selectively removing silicon. The sacrificial layers 1138, now accessible through gate trenches, are then selectively removed. Removal of these nanosheets releases the bottom channels 1127. Namely, gaps are now present between the bottom channels 1127 in the channel region of the device. In this example, bottom channels 1127 will be used to form the channels of the stacked device. The gate trenches and the gaps in the bottom channels 1127 enable replacement metal gates (RMGs), i.e., including a gate dielectric and at least one workfunction metal, to be formed that fully surround a portion of each of the nanosheet channels in a gate-all-around configuration.

Figure 28A:
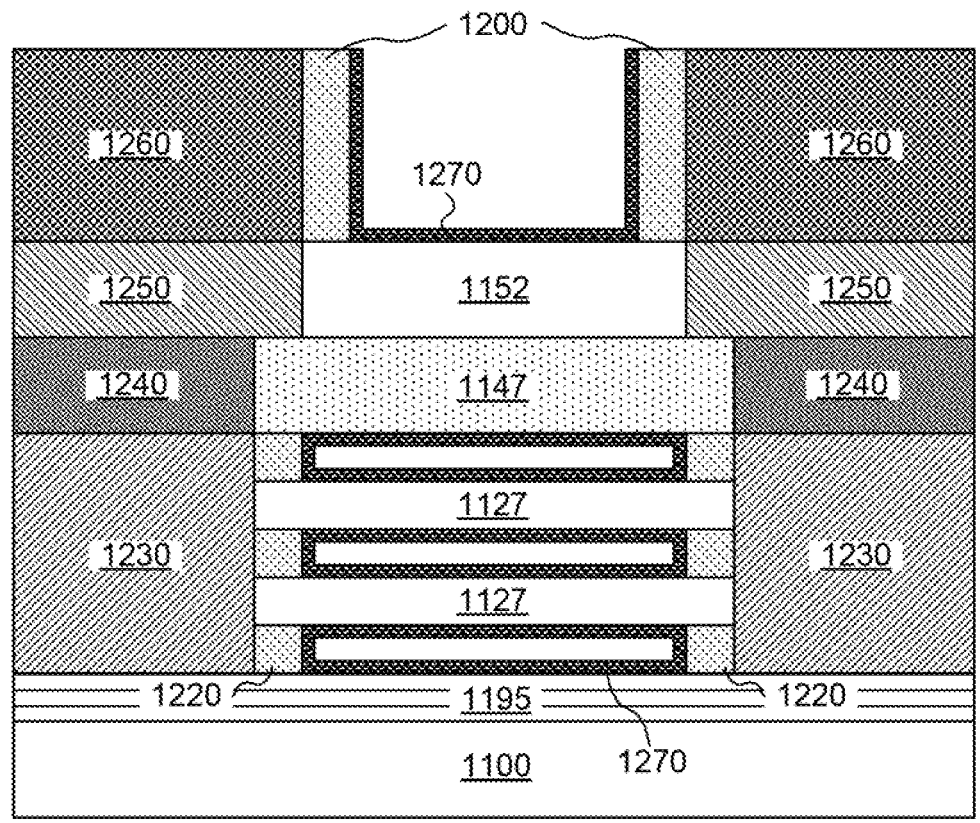
FIG. 28A depicts a cross-sectional view across the x-line in a fin region of the CFET device following gate dielectric deposition, according to a second example embodiment.
Figure 28B:
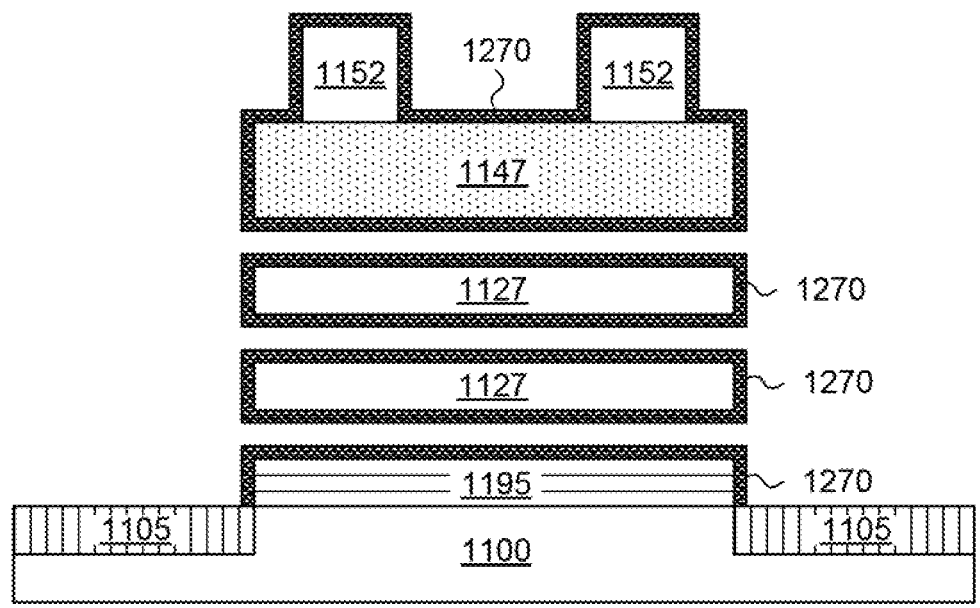
FIG. 28B depicts a cross-sectional view across the y-line in a gate region of the CFET device following gate dielectric deposition, according to a second example embodiment.

Referring to FIGS. 28A & B, deposition of a gate dielectric 1270 may occur. A conformal gate dielectric 1270 may be deposited into and lining each of the gate trenches and gaps in the channel region of the device. According to an example embodiment, gate dielectric 1270 is a high-κ material. The term "high-κ," as used herein, refers to a material having a relative dielectric constant κ which is much higher than that of silicon dioxide (e.g., a dielectric constant κ=25 for hafnium oxide (HfO2) rather than 4 for SiO2). Suitable high-κ gate dielectrics include, but are not limited to, HfO2 and/or lanthanum oxide (La2O3). A process such as CVD, ALD or PVD can be employed to deposit gate dielectric. According to an example embodiment, gate dielectric 1270 has a thickness of from about 1 nanometer (nm) to about 5 nm and ranges therebetween. A reliability anneal can be performed following deposition of gate dielectric 1270. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

Figure 29A:
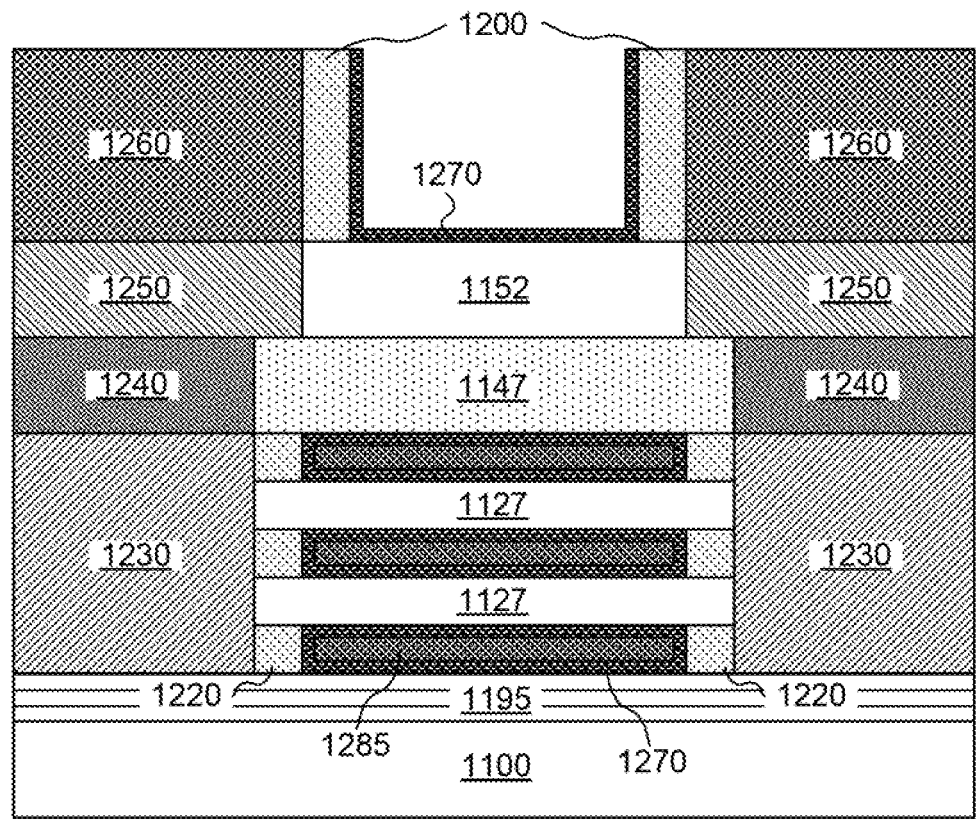
FIG. 29A depicts a cross-sectional view across the x-line in a fin region of the CFET device following work-function metal deposition, according to a second example embodiment.
Figure 29B:
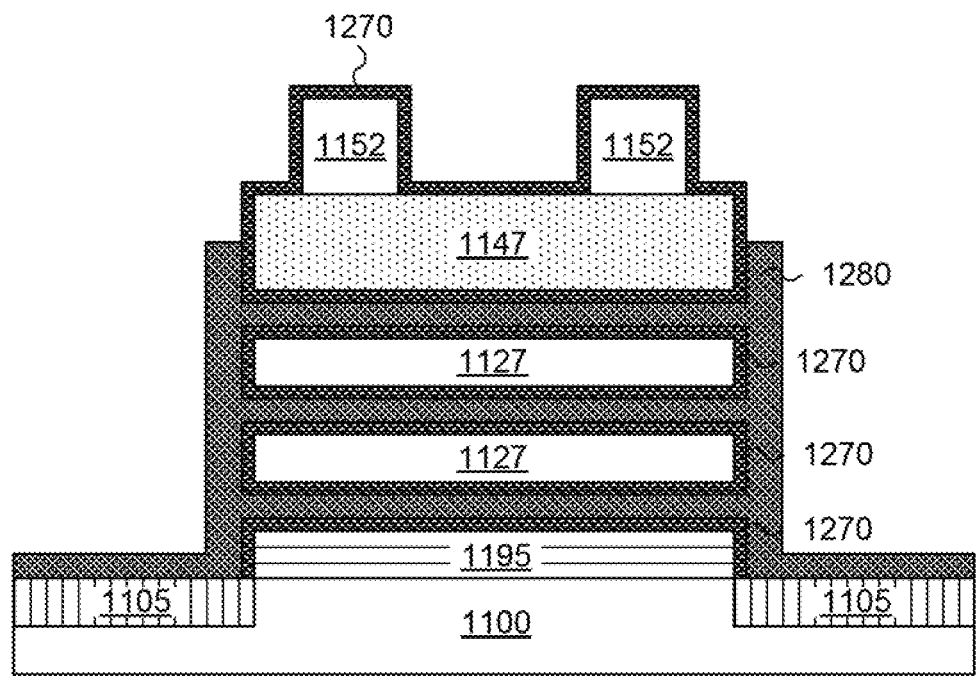
FIG. 29B depicts a cross-sectional view across the y-line in a gate region of the CFET device following work-function metal deposition, according to a second example embodiment.

Referring to FIGS. 29A & B, deposition and reduction of a work-function metal 1280, may occur. Reduction of the work function metal 1280 may result in the work-function metal only surrounding the bottom channels 1127. A work function metal 1280 may be deposited into the gate trenches and gaps on the gate dielectric. The work function metal 1280 may be conform to the selected polarity of the gate. At this point in the process, the work function metal 1280 is disposed on the bottom channels 1127 as well as the vertical channels 1152. However, as will be described in detail below, this work function metal 1280 will subsequently be removed from the vertical channels 1152.

Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

A process such as CVD, ALD or PVD can be employed to deposit the work function metal 1280. Following deposition, the metal overburden can be removed using a process such as CMP. Further, it is notable that, while the instant example shows work function metal 1280 pinching off the gaps between the lower nanosheets 131 and 133 other workfunction metal configurations are also contemplated herein such as the first and/or second workfunction metals being composed of multiple metals and/or multiple layers of metals.

To remove the work function metal 1280 from the vertical channels 1152, the work function metal 1280 and gate dielectric are first recessed in the gate trenches. To do so a planarizing material such as an OPL material is deposited over the device structure and into the gate trenches, and then recessed. A casting process such as spin coating or spray casting can be employed to deposit the planarizing material. A directional (anisotropic) etching process such as RIE can be used to recess the planarizing material. The work function metal 1280 and gate dielectric are then recessed (e.g., using an anisotropic etching process such as RIE) down to the (recessed) planarizing material. The planarizing material is removed. By way of example only, an OPL planarizing material can be removed using a process such as ashing.

The work function metal 1280 is then removed from the vertical channels 1152. A recess etch is used to remove the work function metal 1280 from the vertical channels 1152. A block mask is used to cover/mask the work function metal 1280 disposed on the lower nanosheets 128.

According to an example embodiment, the recess etch of the work function metal 1280 is performed using a non-directional (isotropic) metal-selective etching process. For instance, an SC1 wet clean (e.g., hydrofluoric acid (HF) and a hydrogen peroxide ($H_2O_2$): ammonium hydroxide ($NH_4OH$) mixture) can be employed to recess the workfunction metal selective to the gate dielectric.

Figure 30A:
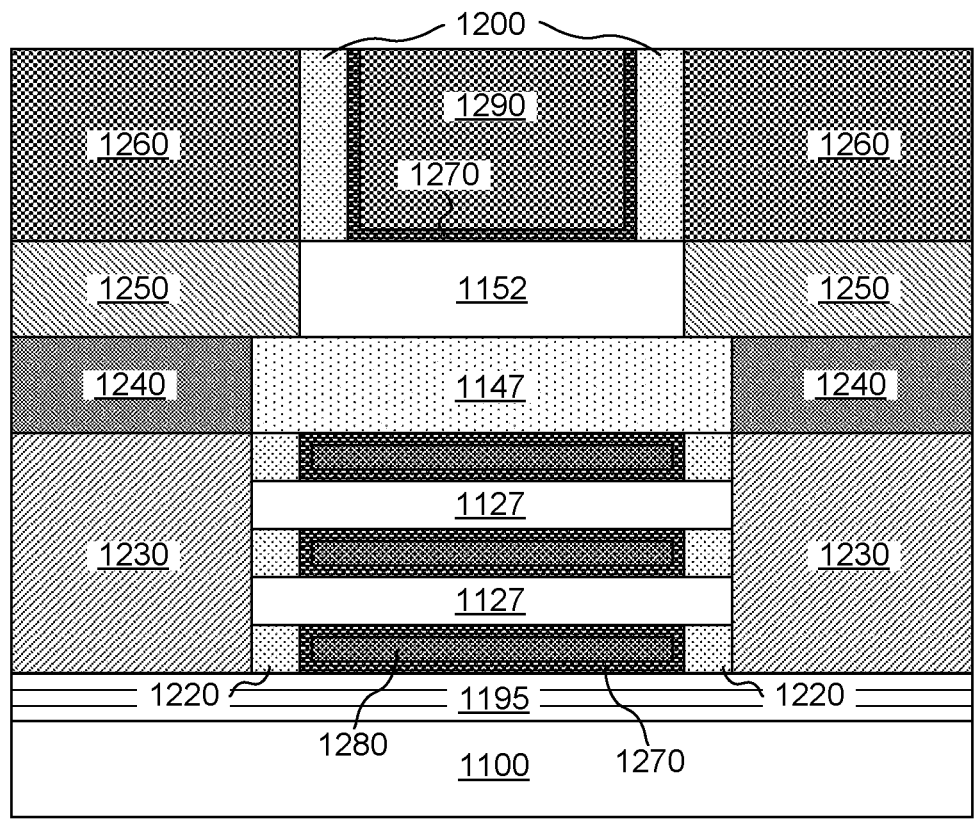
FIG. 30A depicts a cross-sectional view across the x-line in a fin region of the CFET device following gate contact formation, according to a second example embodiment.
Figure 30B:
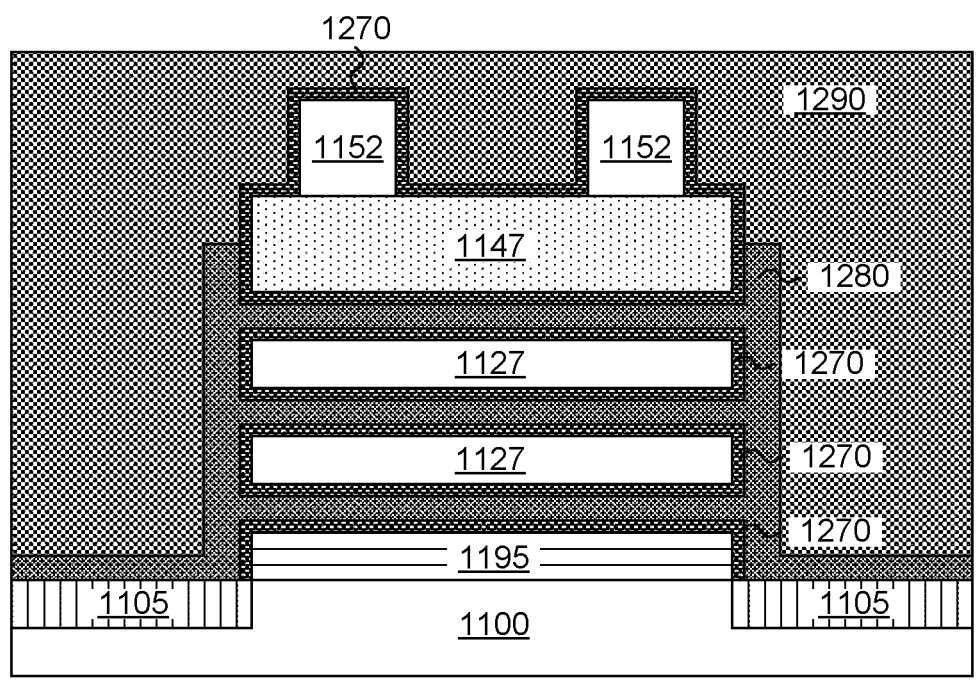
FIG. 30B depicts a cross-sectional view across the y-line in a gate region of the CFET device following gate contact formation, according to a second example embodiment.

Referring to FIGS. 30A & B, a $2^{nd}$ WFM metal followed by low-resistance gate fillmetal (1290 is a combination of $2^{nd}$ WFM and gate fill metal) may be deposited in the gate. A low-resistivity gate fill metal may be deposited into the gate trenches. Suitable low-resistivity gate fill metals include, but are not limited to, W, Co, Al. A process such as CVD, ALD or PVD can be employed to deposit the low-resistivity gate fill metal into the gate trenches. $2^{nd}$ WFM can be TiN, TiC, TiAl, TiAlC, TaN, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a gate structure;
   a top channel, wherein the top channel comprises at least one vertically oriented channel, wherein an entire bottom surface of the at least one vertically oriented channel is in contact with an insulator layer, and wherein a top surface and vertical surfaces of the at least one vertically oriented channel is in contact with the gate structure; and
   a bottom channel, wherein the bottom channel comprises a plurality of horizontally oriented channels, and wherein the gate structure surrounds the bottom channel.

2. The semiconductor structure of claim 1, further comprising:
   a gate dielectric located on each surface of the bottom channel and on the top surface and the vertical surfaces of the at least one vertically oriented channel in contact with the gate structure, wherein the gate dielectric is further located on surfaces of the insulator layer that are not in contact with the at least one vertically oriented channel.

3. The semiconductor structure of claim 2, wherein the gate dielectric directly contacts a bottom surface and opposite sidewalls of the insulator layer.

4. The semiconductor structure of claim 1, wherein the top channel is part of a first transistor, and wherein the bottom channel is part of a second transistor.

5. The semiconductor structure of claim 4, wherein the first transistor and the second transistor form a complimentary field effect transistor.

6. The semiconductor structure of claim 1, further comprising:
top source drain regions contacting opposite surfaces of the top channel; and
bottom source drain regions contacting opposite surfaces of the bottom channel.

7. The semiconductor structure of claim 1, wherein a top surface of the insulator layer contacts a bottom surface of top source drain regions.

8. The semiconductor structure of claim 1, wherein a width of the insulator layer measured parallel to the gate structure is substantially equal to a width of the bottom channel measured parallel to the gate structure.

9. The semiconductor structure of claim 1, wherein a width of the top channel measured perpendicular to the gate structure is less than a width of the insulator layer measured perpendicular to the gate structure.

10. A method of forming a semiconductor structure comprising:
forming a top channel in a semiconductor layer located above a layered nanosheet stack, wherein the top channel comprises a plurality of vertically oriented channels;
depositing a sacrificial liner between the plurality of vertically oriented channels;
forming a dummy gate over the top channel;
forming gate spacers on opposite sides of the dummy gate;
removing a portion of the sacrificial liner located beneath the gate spacers to create a spacer void; and
depositing a top spacer in the spacer void.

11. The method of claim 10, wherein a thickness of the top spacer is different from a thickness of the gate spacers.

12. The method of claim 10, further comprising:
forming a bottom spacer, wherein the bottom spacer comprises a dielectric material located between a plurality of horizontally oriented channels of the layered nanosheet stack and a top element comprising a dielectric material in contact with a bottom surface of the top channel and a top surface of a bottom channel.

13. The method of claim 12, wherein a structural interface exists between the top spacer and the gate spacers.

14. The method of claim 12, wherein the top element has a top portion and a bottom portion, wherein the top portion comprises a plurality of fin protrusions, wherein each fin protrusion is located beneath each of the plurality of vertically oriented channels, and wherein the bottom portion comprises a horizontal layer connecting each of the plurality of fin protrusions of the top portion.

15. The method of claim 10, wherein the top channel is part of a first transistor, and wherein a bottom channel is part of a second transistor.

16. The method of claim 15, wherein the first transistor and the second transistor form a complimentary field effect transistor.

* * * * *